(12) United States Patent
Nagasaka

(10) Patent No.: US 8,390,779 B2
(45) Date of Patent: Mar. 5, 2013

(54) EXPOSURE APPARATUS, EXPOSURE METHOD, AND METHOD FOR PRODUCING DEVICE

(75) Inventor: Hiroyuki Nagasaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1354 days.

(21) Appl. No.: 11/707,079

(22) Filed: Feb. 16, 2007

(65) Prior Publication Data

US 2007/0279606 A1 Dec. 6, 2007

Related U.S. Application Data

(60) Provisional application No. 60/779,432, filed on Mar. 7, 2006.

(30) Foreign Application Priority Data

Feb. 16, 2006 (JP) .................... 2006-039832

(51) Int. Cl.
*G03B 27/42* (2006.01)

(52) U.S. Cl. ............... 355/53; 355/30; 355/67; 355/72; 355/77

(58) Field of Classification Search .......... 355/30, 355/53, 67, 72, 77
See application file for complete search history.

(56) References Cited

U.S. PATENT DOCUMENTS

| | | | |
|---|---|---|---|
| 4,465,368 A | 8/1984 | Matsuura et al. | |
| 4,629,313 A | 12/1986 | Tanimoto | |
| 4,666,273 A | 5/1987 | Shimizu et al. | |
| 4,780,617 A | 10/1988 | Umatate et al. | |
| 5,473,410 A | 12/1995 | Nishi | |
| 5,493,403 A | 2/1996 | Nishi | |
| 5,646,413 A | 7/1997 | Nishi | |
| 5,825,043 A | 10/1998 | Suwa | |
| 5,969,441 A | 10/1999 | Loopstra et al. | |
| 6,018,384 A | 1/2000 | Ota | |
| 6,169,602 B1 | 1/2001 | Taniguchi et al. | |
| 6,235,438 B1 | 5/2001 | Suzuki et al. | |
| 6,327,022 B1 | 12/2001 | Nishi | |
| 6,341,007 B1 | 1/2002 | Nishi et al. | |

(Continued)

FOREIGN PATENT DOCUMENTS

| | | |
|---|---|---|
| EP | 1079223 A1 | 2/2001 |
| EP | 1344140 A1 | 10/2003 |

(Continued)

OTHER PUBLICATIONS

Supplementary Extended European Search Report issued in European Application No. 07714271.9 issued Jul. 26, 2010.

(Continued)

*Primary Examiner* — Hung Henry Nguyen
*Assistant Examiner* — Mesfin T Asfaw
(74) *Attorney, Agent, or Firm* — Oliff & Berridge, PLC

(57) ABSTRACT

An exposure apparatus includes a projection optical system which is capable of forming an image of a first pattern in a first exposure area and which is capable of forming an image of a second pattern in a second exposure area, the second pattern being different from the first pattern, and a first detecting system which obtains at least one of position information about the image of the first pattern and position information about the image of the second pattern. A positional relationship between the images of the first and second patterns and a predetermined area on a substrate is adjusted based on a detection result to perform multiple exposure for the predetermined area on the substrate with the images of the first and second patterns. The substrate can be subjected to the multiple exposure efficiently.

47 Claims, 26 Drawing Sheets

U.S. PATENT DOCUMENTS

| | | |
|---|---|---|
| 6,383,940 B1 | 5/2002 | Yoshimura |
| 6,400,441 B1 | 6/2002 | Nishi et al. |
| 6,498,352 B1 | 12/2002 | Nishi |
| 6,549,269 B1 | 4/2003 | Nishi et al. |
| 6,590,634 B1 | 7/2003 | Nishi et al. |
| 6,611,316 B2 * | 8/2003 | Sewell ............................ 355/46 |
| 6,778,257 B2 | 8/2004 | Bleeker et al. |
| 6,819,405 B2 | 11/2004 | Mulkens et al. |
| 6,897,963 B1 | 5/2005 | Taniguchi et al. |
| 6,952,253 B2 | 10/2005 | Lof et al. |
| 7,023,610 B2 | 4/2006 | Ohtsuki et al. |
| 7,088,425 B2 | 8/2006 | Tanaka et al. |
| 2002/0041377 A1 | 4/2002 | Hagiwara et al. |
| 2002/0061469 A1 | 5/2002 | Tanaka |
| 2002/0123012 A1 | 9/2002 | Sewell |
| 2002/0180943 A1 | 12/2002 | Mulkens et al. |
| 2004/0165159 A1 | 8/2004 | Lof et al. |
| 2005/0206850 A1 | 9/2005 | Shimizu et al. |
| 2005/0248856 A1 | 11/2005 | Omura et al. |
| 2005/0280791 A1 | 12/2005 | Nagasaka et al. |
| 2006/0121364 A1 | 6/2006 | Omura |
| 2006/0139603 A1 * | 6/2006 | Lin .................................. 355/67 |
| 2006/0170901 A1 | 8/2006 | Tanitsu et al. |
| 2006/0231206 A1 | 10/2006 | Nagasaka et al. |
| 2007/0013890 A1 | 1/2007 | Loopstra et al. |

FOREIGN PATENT DOCUMENTS

| | | |
|---|---|---|
| EP | 1 420 298 A2 | 5/2004 |
| JP | A-57-117238 | 7/1982 |
| JP | A-60-078454 | 5/1985 |
| JP | A-61-044429 | 3/1986 |
| JP | A-01-228130 | 9/1989 |
| JP | A-04-065603 | 3/1992 |
| JP | A-06-124873 | 5/1994 |
| JP | A-07-176468 | 7/1995 |
| JP | A-08-078313 | 3/1996 |
| JP | A-08-078314 | 3/1996 |
| JP | A-08-227847 | 9/1996 |
| JP | A-08-313842 | 11/1996 |
| JP | A-10-163099 | 11/1996 |
| JP | A-10-214783 | 8/1998 |
| JP | A-10-232497 | 9/1998 |
| JP | A-10-303114 | 11/1998 |
| JP | A-11-016816 | 1/1999 |
| JP | A-11-135400 | 5/1999 |
| JP | A-11-195584 | 7/1999 |
| JP | A-11-195602 | 7/1999 |
| JP | A-2000-021742 | 1/2000 |
| JP | A-2000-505958 | 5/2000 |
| JP | A-2000-164504 | 6/2000 |
| JP | A-2001-267239 | 9/2001 |
| JP | A-2001-297976 | 10/2001 |
| JP | A-2002-014005 | 1/2002 |
| JP | A-2003-045797 | 2/2003 |
| JP | A-2004-519850 | 7/2004 |
| JP | A-2004-289126 | 10/2004 |
| JP | A-2004-304135 | 10/2004 |
| WO | WO 99/23692 A1 | 5/1999 |
| WO | WO 99/46835 | 9/1999 |
| WO | WO 99/49504 A1 | 9/1999 |
| WO | WO 99/60361 A1 | 11/1999 |
| WO | WO 02/069049 A2 | 9/2002 |
| WO | WO 03/065428 A1 | 8/2003 |
| WO | WO 2004/019128 A2 | 3/2004 |
| WO | WO 2004/055803 A1 | 7/2004 |
| WO | WO 2004/057590 A1 | 7/2004 |
| WO | WO 2004/086468 A1 | 10/2004 |
| WO | WO 2004/090634 | 10/2004 |
| WO | WO 2004/107011 A1 | 12/2004 |
| WO | WO 2005/029559 A1 | 3/2005 |
| WO | WO 2005/059617 A2 | 3/2005 |
| WO | WO 2005/059618 A2 | 6/2005 |
| WO | WO 2005/076045 A1 | 8/2005 |

OTHER PUBLICATIONS

May 15, 2007 International Search Report issued in International Application No. PCT/JP2007/052741 (with English Translation).

May 15, 2007 Written Opinion issued in International Application No. PCT/JP2007/052741 (with English Translation).

* cited by examiner

Fig. 13A
Fig. 13B
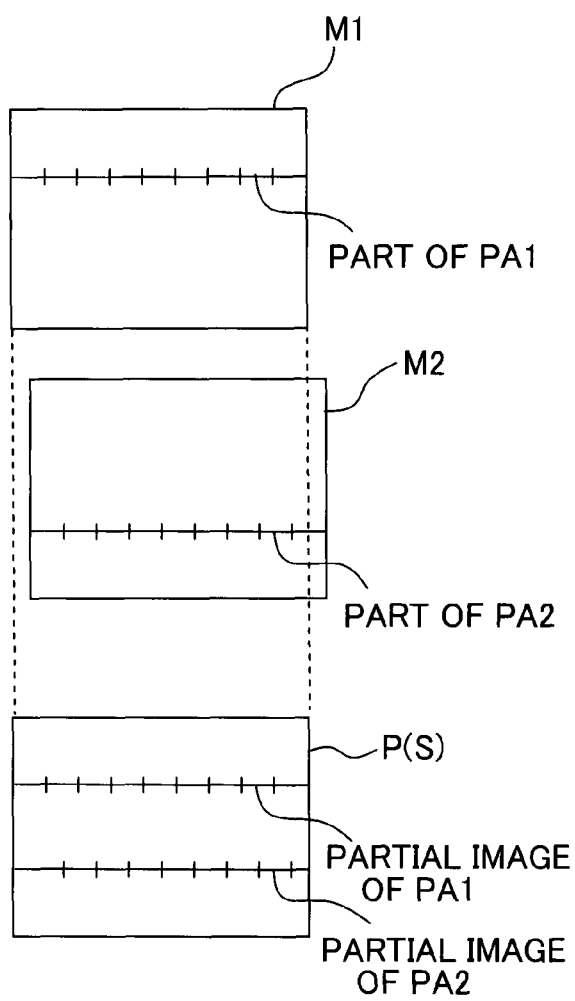
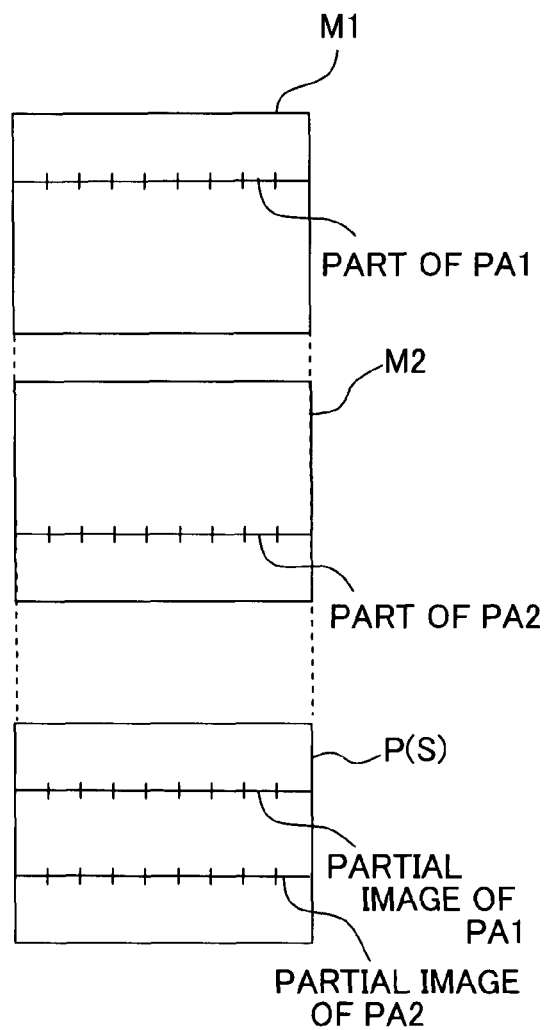
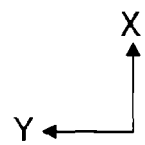

EXPOSURE APPARATUS, EXPOSURE METHOD, AND METHOD FOR PRODUCING DEVICE

CROSS-REFERENCES TO RELATED APPLICATIONS

This application claims the benefit of priority of Japanese Patent Application No. 2006-039832 filed on Feb. 16, 2006 and U.S. Provisional Application No. 60/779,432 filed on Mar. 7, 2006, the entire disclosures of which are incorporated herein by reference.

BACKGROUND OF THE INVENTION

1. Field of the Invention

The present invention relates to an exposure apparatus for exposing a substrate, an exposure method, and a method for producing a device.

2. Description of the Related Art

An exposure apparatus, which performs the multiple exposure for the substrate, is known as disclosed, for example, in Japanese Patent Application Laid-open No. 10-214783 in relation to the exposure apparatus to be used in the photolithography steps.

In the multiple exposure, a plurality of masks are prepared to execute the exposure for each of the masks in some cases, and a plurality of illumination conditions are prepared to execute the exposure under the different illumination conditions for the respective masks in other cases. In such situations, it is necessary to take a period of time in which the mask is exchanged and/or a period of time in which the illumination condition or the like is changed. Therefore, there is such a possibility that the rate of operation of the exposure apparatus may be lowered, and the throughput may be lowered.

The microdevice (electronic device) such as the semiconductor device is formed by overlaying a plurality of patterns on a substrate. It is important to satisfactorily perform the positional adjustment for the respective patterns in the multiple exposure as well in order to produce a desired device.

SUMMARY OF THE INVENTION

The present invention has been made taking the foregoing situations into consideration, an object of which is to provide an exposure apparatus, an exposure method, and a method for producing a device, in which the patterns can be satisfactorily subjected to the positional adjustment with each other and the substrate can be subjected to the multiple exposure efficiently.

In order to achieve the object as described above, the present invention adopts the following constructions corresponding to respective drawings as illustrated in embodiments.

According to a first aspect of the present invention, there is provided an exposure apparatus for exposing a substrate, including an optical system which is capable of forming an image of a first pattern in a first exposure area and which is capable of forming an image of a second pattern in a second exposure area, the second pattern being different from the first pattern; and a first detecting system which obtains at least one of position information about the pattern image formed in the first exposure area and position information about the pattern image formed in the second exposure area; wherein a predetermined area on the substrate is subjected to multiple exposure with the image of the first pattern formed in the first exposure area and the image of the second pattern formed in the second exposure area.

According to the first aspect of the present invention, the patterns can be mutually subjected to the positional adjustment satisfactorily based on the position information about the pattern image obtained by the first detecting system. The substrate can be subjected to the multiple exposure efficiently.

According to a second aspect of the present invention, there is provided an exposure apparatus for exposing a substrate while moving the substrate in a scanning direction; the exposure apparatus including an optical system which has an optical element arranged opposite to a surface of the substrate, which irradiates a first exposure light beam from a first pattern onto a first exposure area via the optical element, and which irradiates a second exposure light beam from a second pattern onto a second exposure area via the optical element, the second exposure area being defined at a position different from that of the first exposure area in the scanning direction; and a detecting system which detects an alignment mark on the substrate; wherein the optical system includes a first reflecting surface which is arranged in the vicinity of positions optically conjugate with the first exposure area and the second exposure area and which guides the first exposure light beam to the optical element; a second reflecting surface which is arranged in the vicinity of positions optically conjugate with the first exposure area and the second exposure area and which guides the second exposure light beam to the optical element; and the detecting system detects the alignment mark on the substrate by irradiating a detection light beam onto the substrate via the optical element from a position disposed between the first reflecting surface and the second reflecting surface.

According to the second aspect of the present invention, the patterns can be mutually subjected to the positional adjustment satisfactorily, and the substrate can be subjected to the multiple exposure efficiently.

According to a third aspect of the present invention, there is provided a method for producing a device, including performing multiple exposure for a substrate by using the exposure apparatus as defined in the foregoing aspect; developing the substrate having been subjected to the multiple exposure; and processing the developed substrate.

According to the third aspect of the present invention, the device can be produced by using the exposure apparatus with which the patterns can be mutually subjected to the positional adjustment satisfactorily, and the substrate can be subjected to the multiple exposure efficiently.

According to a fourth aspect of the present invention, there is provided an exposure method for performing multiple exposure for a substrate with an image of a first pattern and an image of a second pattern different from the first pattern; the exposure method including forming the image of the first pattern in a first exposure area; forming the image of the second pattern in a second exposure area; determining at least one of position information about the pattern image formed in the first exposure area and position information about the pattern image formed in the second exposure area; and performing the multiple exposure for a predetermined area on the substrate with the image of the first pattern and the image of the second pattern based on at least one of the determined position information.

According to the exposure method concerning the fourth aspect of the present invention, the multiple exposure can be performed efficiently while correctly performing the positional adjustment between the image of the first pattern and the predetermined area on the substrate and between the image of the second pattern and the predetermined area on the substrate based on the position information about the pattern image formed in the first exposure area and/or the pattern image formed in the second exposure area.

According to a fifth aspect of the present invention, there is provided an exposure method for exposing a substrate while moving the substrate in a scanning direction; the exposure method including irradiating a first exposure light beam from a first pattern onto a first exposure area via an optical element by reflecting the first exposure light beam by a first reflecting surface; irradiating a second exposure light beam from a second pattern onto a second exposure area via the optical element by reflecting the second exposure light beam by a second reflecting surface, the second exposure area being defined at a different position in the scanning direction with respect to the first exposure area; detecting an alignment mark on the substrate by irradiating a detection light beam via the optical element from a position disposed between the first reflecting surface and the second reflecting surface; and performing positional adjustment for the substrate and the first and second patterns based on the detected alignment mark; wherein the first reflecting surface and the second reflecting surface are arranged in the vicinity of positions optically conjugate with the first exposure area and the second exposure area.

According to the exposure method concerning the fifth aspect of the present invention, the multiple exposure can be performed efficiently while satisfactorily performing the positional adjustment between the patterns, because the alignment mark on the substrate is detected by irradiating the detection light beam via the optical element onto the substrate from the position disposed between the first reflecting surface and the second reflecting surface.

According to a sixth aspect of the present invention, there is provided a method for producing a device, including performing multiple exposure for a substrate by using the exposure method as defined in the fourth or fifth aspect described above; developing the substrate having been subjected to the multiple exposure; and processing the developed substrate. According to the sixth aspect of the present invention, the highly accurate device can be produced highly efficiently.

According to the present invention, the patterns can be mutually subjected to the positional adjustment satisfactorily. Therefore, the substrate can be subjected to the multiple exposure accurately. Further, the substrate can be subjected to the multiple exposure efficiently. Therefore, the device having the desired performance can be produced at the satisfactory productivity.

BRIEF DESCRIPTION OF THE DRAWINGS

FIGS. 13A and 13B schematically illustrate the positional relationship among the first and second patterns and the shot area.

DESCRIPTION OF THE PREFERRED EMBODIMENTS

Embodiments of the present invention will be explained below with reference to the drawings. However, the present invention is not limited thereto. In the following description, the XYZ rectangular coordinate system is assumed. The positional relationship concerning respective members will be explained with reference to the XYZ rectangular coordinate system. The X axis direction resides in the predetermined direction in the horizontal plane. The Y axis direction resides in the direction which is perpendicular to the X axis direction in the horizontal plane. The Z axis direction resides in the direction which is perpendicular to the X axis direction and the Y axis direction respectively (i.e., the vertical direction). The directions of rotation (inclination) about the X axis, the Y axis, and the Z axis are designated as the θX, θY, and θZ directions respectively.

First Embodiment

Figure 1:
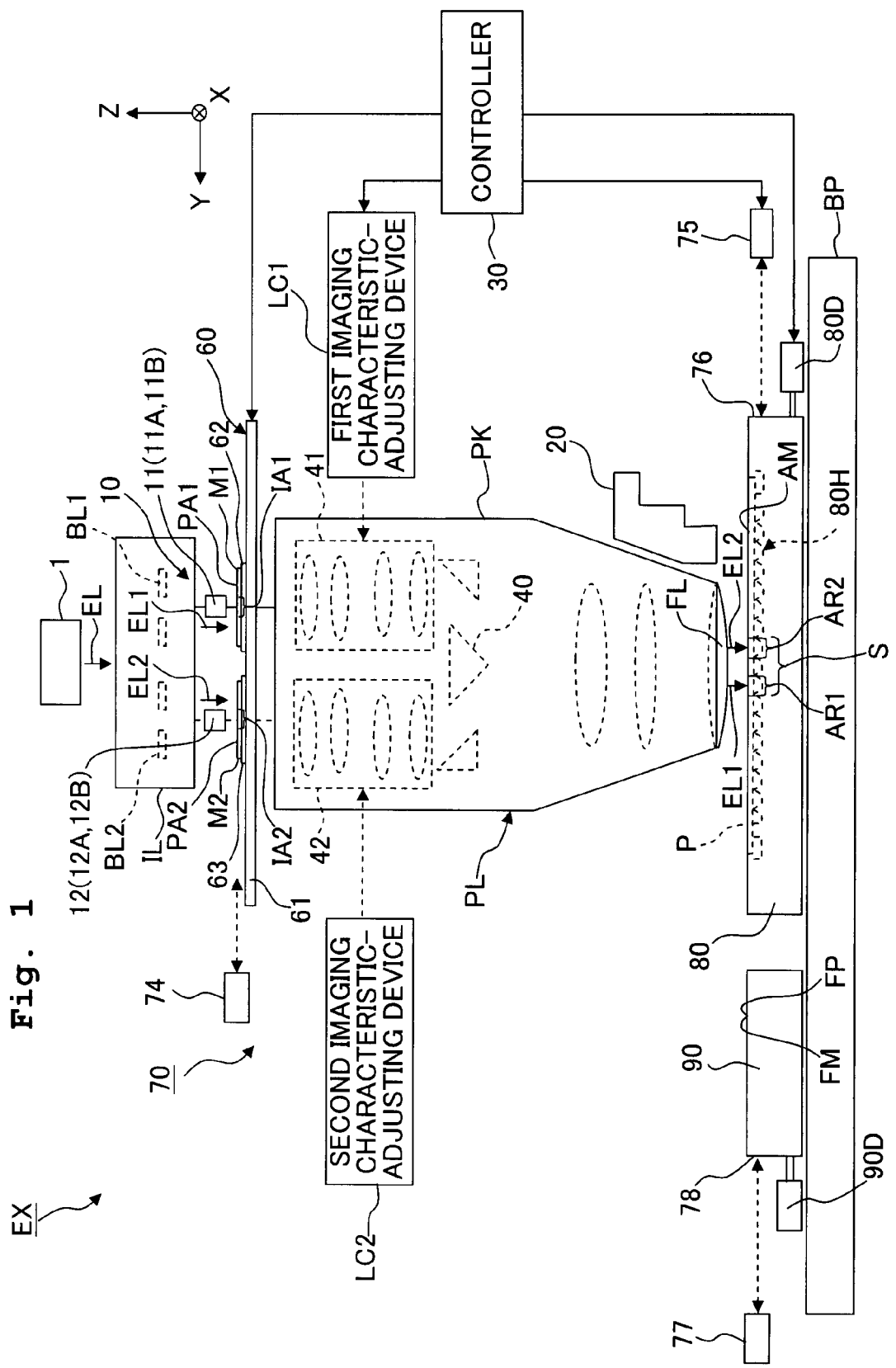
FIG. 1 shows a schematic arrangement illustrating an exposure apparatus according to a first embodiment.

A first embodiment will be explained. FIG. 1 shows a schematic arrangement illustrating an exposure apparatus EX according to the first embodiment. With reference to FIG. 1, the exposure apparatus EX includes a mask stage 60 which is movable while holding a first mask M1 having a first pattern PA1 and a second mask M2 having a second pattern PA2, a substrate stage 80 which is movable while holding a substrate P, a measuring stage 90 which is movable while carrying a measuring instrument or a measuring device capable of executing the measurement in relation to the exposure, a measuring system 70 which is capable of measuring the position information about the respective stages, a light source device 1 which emits an exposure light beam EL, an illumination system IL which splits the exposure light beam EL emitted from the light source device 1 into a first exposure light beam EL1 and a second exposure light beam EL2, which illuminates the first pattern PA1 of the first mask M1 with the first exposure light beam EL1, and which illuminates the second pattern PA2 of the second mask M2 with the second exposure light beam EL2, a projection optical system PL which projects, onto the substrate P, an image of the first pattern PA1 illuminated with the first exposure light beam EL1 and an image of the second pattern PA2 illuminated with the second exposure light beam EL2, and a controller 30 which controls the operation of the entire exposure apparatus EX. The substrate stage 80 and the measuring stage 90 are movable independently from each other respectively on a base member BP on the light-exit side of the projection optical system PL, i.e., on the image plane side of the projection optical system PL.

The substrate referred to herein includes those in which a base material, including, for example, a semiconductor wafer such as a silicon wafer is coated with a photosensitive material (photoresist), and includes those obtained by applying various films such as protective films (top coat films) distinctly from photosensitive films. The mask includes a reticle on which a device pattern to be subjected to the reduction projection onto the substrate is formed. The mask has a transparent plate member such as a glass plate and a light-shielding film such as chromium formed thereon, and a predetermined pattern is formed by the light-shielding film. Such a transmission type mask is not limited to the binary mask on which the pattern is formed by the light-shielding film. The mask also includes, for example, the phase shift mask of, for example, the spatial frequency modulation type or the half tone type. In this embodiment, the transmission type mask is used as the mask. However, it is also allowable to use a reflection type mask. In this embodiment, the first pattern PA1 formed on the first mask and the second pattern PA2 formed on the second mask are different patterns. Further, the first and second masks M1, M2 are of the same type, but they may differ in the type. For example, one of the first and second masks M1, M2 may be a binary mask, and the other may be a phase shift reticle.

The projection optical system PL is capable of defining a first exposure area AR1 and a second exposure area AR2 in a predetermined positional relationship on the image plane side of the projection optical system PL. The exposure apparatus EX of this embodiment is capable of forming the image of the first pattern PA1 in the first exposure area AR1, and the exposure apparatus EX is capable of forming the image of the second pattern PA2 in the second exposure area AR2 by means of the projection optical system PL. The shot area S on the substrate P is subjected to the multiple exposure (double exposure) with the image of the first pattern PA1 and the image of the second pattern PA2. Specifically, the exposure apparatus EX forms the image of the first pattern PA1 in the first exposure area AR1 with the first exposure light beam EL1 which is emitted from the illumination system IL and which is irradiated onto the first exposure area AR1 via the first pattern PA1 and the projection optical system PL. Further, the exposure apparatus EX forms the image of the second pattern PA2 in the second exposure area AR2 with the second exposure light beam EL2 which is emitted from the illumination system IL and which is irradiated onto the second exposure area AR2 via the second pattern PA2 and the projection optical system PL. The exposure apparatus EX performs the multiple exposure for the shot area S on the substrate P with the image of the first pattern PA1 and the image of the second pattern PA2 formed as described above. The shot area S on the substrate P is subjected to the multiple exposure (double exposure) by being irradiated with the first exposure light beam EL1 from the first pattern PA1 and the second exposure light beam EL2 from the second pattern PA2.

The exposure apparatus EX of this embodiment is the scanning type exposure apparatus (so-called scanning stepper) in which the image of the first pattern PA1 of the first mask M1 and the image of the second pattern PA2 of the second mask M2 are projected onto the substrate P while synchronously moving each of the first mask M1, the second mask M1, and the substrate P in the scanning direction. In this embodiment, the scanning direction (synchronous movement direction), in which each of the first mask M1, the second mask M2, and the substrate P moves, is designated as the Y axis direction. The controller 30 controls the mask stage 60 and the substrate stage 80 so that the movement of the first mask M1 and the second mask M2 in the Y axis direction and the movement of the substrate P in the Y axis direction are performed synchronously.

In the exposure apparatus EX of this embodiment, the shot area S on the substrate P is subjected to the multiple exposure by irradiating the first exposure light beam EL1 and the second exposure light beam EL2 onto the first exposure area AR1 and the second exposure area AR2 respectively by means of the projection optical system PL while relatively moving the first exposure area AR1, the second exposure area AR2, and the shot area S on the substrate P in the Y axis direction. The substrate stage 80 is capable of moving, in the Y axis direction, the shot area S on the substrate P with respect to the first exposure area AR1 and the second exposure area AR2. The mask stage 60 is capable of moving, in the Y axis direction, the first mask M1 having the first pattern PA1 with respect to the first illumination area IA1 onto which the first exposure light beam EL1 is irradiated. The mask stage 60 is capable of moving, in the Y axis direction, the second mask M2 having the second pattern PA2 with respect to the second illumination area IA2 onto which the second exposure light beam EL2 is irradiated. The controller 30 performs the multiple exposure (double exposure) for the shot area S on the substrate P with the image of the first pattern PA1 and the image of the second pattern PA2 while moving the shot area S on the substrate P in the Y axis direction by using the substrate stage 80 with respect to the first exposure area AR1 and the second exposure area AR2 in synchronization with the movement of the first mask M1 and the second mask M2 in the Y axis direction performed by the mask stage 60.

The exposure apparatus EX of this embodiment is provided with a first detecting system 10 which obtains at least one of the position information about the image of the first pattern PA1 formed in the first exposure area AR1 and the position information about the second pattern PA2 formed in the second exposure area AR2. At least a part (for example, the optical system) of the first detecting system 10 is provided in the vicinity of the mask stage 60. As described later on, the reference mark FM is provided on a measuring stage 90. The first detecting system 10 is capable of detecting the reference mark FM via the projection optical system PL. The controller 30 obtains at least one of the position information about the first pattern PA1 and the position information about the image of the second pattern PA2 based on the detection result of the first detecting system 10.

The exposure apparatus EX of this embodiment is provided with a second detecting system 20 which detects the reference mark FP provided on the measuring stage 90 and the alignment mark AM provided on the substrate P. The second detecting system 20 is an alignment system based on the off-axis manner provided in the vicinity of the projection optical system PL. As described later on, the controller 30 adjusts the positional relationship among the image of the first pattern PA1, the image of the second pattern PA2, and the shot area S on the substrate P based on the detection results of the first detecting system 10 and the second detecting system 20. Arrangements, which are disclosed, for example, in Japanese Patent Application Laid-open No. 4-65603 (corresponding to U.S. Pat. No. 5,493,403) and Japanese Patent Application Laid-open No. 7-176468 (corresponding to U.S. Pat. No. 5,646,413), are adoptable for the first detecting system 10 and the second detecting system 20. The disclosures of United States patents described above are incorporated herein by reference within a range of permission of the domestic laws and ordinances of the designated or selected state.

At first, the light source device 1 will be explained. The light source device 1 emits the exposure light beam EL for exposing the substrate P. Those usable as the exposure light beam EL emitted from the light source device 1 include, for example, emission lines (g-ray, h-ray, i-ray) radiated, for example, from a mercury lamp, deep ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser device is used for the light source device 1. The ArF excimer laser light beam is used for the exposure light beam EL. In this embodiment, the exposure apparatus EX is provided with one light source device 1.

Next, the illumination system IL will be explained. The illumination system IL of this embodiment splits the exposure light beam (laser beam) EL emitted from the light source device 1 into the first exposure light beam EL1 and the second exposure light beam EL2 by using a splitting optical system. The illumination system IL illuminates the first pattern PA1 of the first mask M1 with the first exposure light beam EL EL1. Further, the illumination system IL illuminates the second pattern PA2 of the second mask M2 with the second exposure light beam EL2. The illumination system IL of this embodiment includes, for example, a beam expander, a polarization state-switching optical system, a diffraction optical element, an afocal optical system (non-focus optical system), a zoom optical system, a polarization conversion element, an optical integrator, and a condenser optical system as disclosed, for example, in International Publication No. 2005/076045 (corresponding to United States Patent Publication No. 2006/0170901), and the splitting optical system which splits the exposure light beam EL into the first exposure light beam EL1 and the second exposure light beam EL2, the exposure light beam EL being emitted from the light source device 1 and allowed to pass through the predetermined optical system described above. The splitting optical system of this embodiment includes a polarization splitting optical system (for example, a polarization beam splitter) which splits the exposure light beam EL into the first exposure light beam EL1 in the first polarization state and the second exposure light beam EL2 in the second polarization state. The illumination system IL is provided with a blind device (masking system) which is arranged, for example, between the splitting optical system and the projection optical system PL, i.e., a first optical mechanism BL1 which defines the first illumination area IA1 brought about by the first exposure light beam EL1 and a second optical mechanism BL2 which defines the second illumination area IA2 brought about by the second exposure light beam EL2. Each of the first and second optical mechanisms BL1, BL2 is capable of adjusting at least one of the size, the shape, and the position (including the rotational position) of each of the first illumination area IA1 (and the first exposure area AR1) and the second illumination area IA2 (and the second exposure area AR2). The exposure light beam EL, which is emitted from the light source device 1, which is allowed to pass through, for example, the predetermined optical system of the illumination system IL, and which principally contains the first polarization component and the second polarization component, is split by the splitting optical system into the first exposure light beam EL1 in the first polarization state and the second exposure light beam EL2 in the second polarization state. The illumination system IL illuminates the first pattern PA1 of the first mask M1 with the first exposure light beam EL1 in the first polarization state (for example, in the S-polarization state) split by the splitting optical system via the first optical mechanism BL1. Further, the illumination system IL illuminates the second pattern PA2 of the second mask M2 with the second exposure light beam EL2 in the second polarization state (for example, in the P-polarization state) via the second optical mechanism BL2.

In this embodiment, the illumination system IL illuminates the first and second patterns PA1, PA2 with the first and second exposure light beams EL1, EL2 in the mutually different polarization states. However, the first and second patterns PA1, PA2 may be illuminated with the first and second exposure light beams EL1, EL2 in the identical polarization state. At least one of the first and second exposure light beams EL1, EL2 may be in the random polarization state (no polarization state). In this embodiment, the exposure light beam EL, which is emitted from the single light source device 1, is split by the illumination system IL into the first and second exposure light beams EL1, EL2. However, for example, it is also allowable to provide first and second light source devices, a first illumination system which is optically connected to the first light source device and which emits the first exposure light beam EL1 for illuminating the first pattern PA1 of the first mask M1 therewith, and a second illumination system which is optically connected to the second light source device and which emits the second exposure light beam EL2 for illuminating the second pattern PA2 of the second mask M2 therewith. In this case, a part or parts of the first illumination system and the second illumination system may be commonly used.

Next, the mask stage 60 will be explained. The mask stage 60 is capable of moving the first mask M1 having the first pattern PA1 in the Y axis direction with respect to the first exposure light beam EL1. The mask stage 60 is capable of moving the second mask M2 having the second pattern PA2 in the Y axis direction with respect to the second exposure light beam EL2. The position information about the mask stage 60 (i.e., the first and second masks M1, M2) is measured by the measuring system 70.

Figure 2:
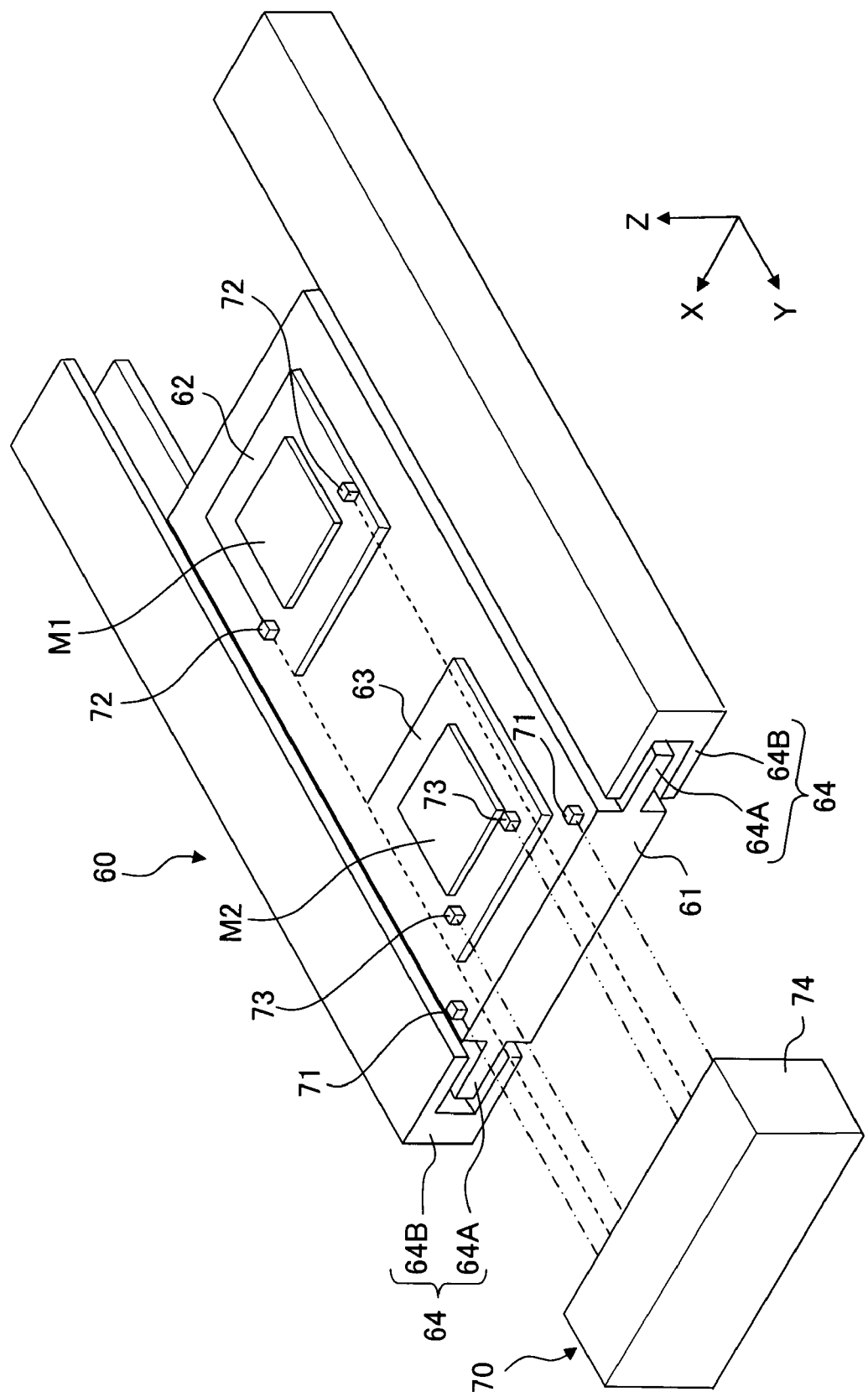
FIG. 2 shows a perspective view illustrating an exemplary mask stage.

FIG. 2 shows a perspective view illustrating the mask stage 60 and the measuring system 70 according to this embodiment. The mask stage 60 includes a main stage 61, a first substage 62 which is movable on the main stage 61 while holding the first mask M1, and a second substage 63 which is movable on the main stage 61 while holding the second mask M2.

The main stage 61 moves the first mask M1 and the second mask M2 in the Y axis direction. The main stage 61 holds the first mask M1 by the aid of the first substage 62, and the main stage 61 holds the second mask M2 by the aid of the second substage 63. The main stage 61 is capable of moving the first and second masks M1, M2 in the identical scanning direction (Y axis direction) while holding the first mask M1 and the second mask M2 by the aid of the first substage 62 and the second substage 63.

The main stage 61 has a relatively large stroke in the Y axis direction so that the entire first pattern PA1 of the first mask M1 is allowed to pass across the first illumination area IA1 and the entire second pattern PA2 of the second mask M2 is allowed to pass across the second illumination area IA2 during the scanning exposure for one shot area S on the substrate P. The mask stage 60 is provided with a main stage-driving device 64 for moving the main stage 61 in the Y axis direction. The main stage-driving device 64 includes, for example, an actuator such as a linear motor. In this embodiment, the main stage-driving device 64 is provided with movers 64A which are provided on the both sides of the main stage 61 in the X axis direction, and stators 64B which are provided corresponding to the movers 64A. The controller 30 is capable of moving the main stage 61 in the Y axis direction by driving the main stage-driving device 64. When the main stage 61 is moved in the Y axis direction, the first and second substages 62, 63 disposed on the main stage 61 are also moved in the Y axis direction together with the main stage 61. Therefore, when the main stage 61 is moved in the Y axis direction, the first and second masks M1, M2, which are held on the first and second substages 62, 63, are also moved in the Y axis direction together with the main stage 61.

The first substage 62 is provided movably in the X axis, Y axis, and θZ directions with respect to the main stage 61. The first mask M1 is finely movable with respect to the main stage 61, for example, by means of an unillustrated first substage-driving device having a voice coil motor. Similarly, the second substage 63 is provided movably in the X axis, Y axis, and θZ directions with respect to the main stage 61. The second mask M2 is finely movable with respect to the main stage 61, for example, by means of an unillustrated second substage-driving device having a voice coil motor.

The measuring system 70 is capable of measuring the position information about the main stage 61, the first substage 62, and the second substage 63 respectively. The measuring system 70 includes reflecting members 71 which are provided on the main stage 61, reflecting members 72 which are provided on the first substage 62, reflecting members 73 which are provided on the second substage 63, and a laser interferometer 74 which radiates measuring beams onto reflecting surfaces of the reflecting members 71, 72, 73 and which receives the reflected light beams to obtain the position information about the main stage 61, the first substage 62, and the second substage 63 respectively. In this embodiment, a part (for example, an optical system) of the laser interferometer 74 is arranged on the +Y side of the mask stage 60. The reflecting member 71 includes, for example, a corner cube mirror (retroreflector). The two reflecting members 71 are provided at predetermined positions on the main stage 61 at which the measuring beams from the laser interferometer 74 can be radiated. The reflecting member 72 also includes, for example, a corner cube mirror. The two reflecting members 72 are provided at predetermined positions on the first substage 62 at which the measuring beams from the laser interferometer 74 can be radiated. The reflecting member 73 also includes, for example, a corner cube mirror. The two reflecting members 73 are provided at predetermined positions on the second substage 63 at which the measuring beams from the laser interferometer 74 can be radiated. The measuring system 70 is capable of measuring the position information in the Y axis direction and the θZ direction about the main stage 61, the first substage 62, and the second substage 63 by using the laser interferometer 74 and the reflecting members 71, 72, 73. Although not shown, the measuring system 70 is also provided with a laser interferometer and reflecting members (reflecting surfaces) in order to measure the position information in the X axis direction about the main stage 61, the first substage 62, and the second substage 63. The first and second substages 62, 63 may be also finely movable in the Z axis, θX, and θY directions respectively. In this case, the measuring systems 70 preferably includes a measuring device (for example, a laser interferometer) for measuring the position information in the Z axis, θX, and θY directions about the first and second substages 62, 63 (first and second masks M1, M2).

The measuring system 70 measures the position information of the main stage 61 in relation to the X axis direction, the Y axis direction, and the θZ direction by using the laser interferometer 74 and the reflecting members 71 provided on the main stage 61. The measuring system 70 measures the position information of the first and second substages 62, 63 in relation to the X axis direction, the Y axis direction, and the θZ direction by using the laser interferometer 74 and the reflecting members 72, 73 provided on the first and second substages 62, 63. The controller 30 appropriately drives the main stage 61, the first substage 62, and the second substage 63 based on the measurement result of the measuring system 70 to control the positions of the first and second masks M1, M2 held on the first and second substages 62, 63. The controller 30 moves at least one of the first substage 62 and the second substage 63 with respect to the main stage 61 while detecting the positions of the first and second substages 62, 63 by using the measuring system 70. Accordingly, it is possible to adjust the relative positional relationship between the first mask M1 and the second mask M2.

Figure 3:
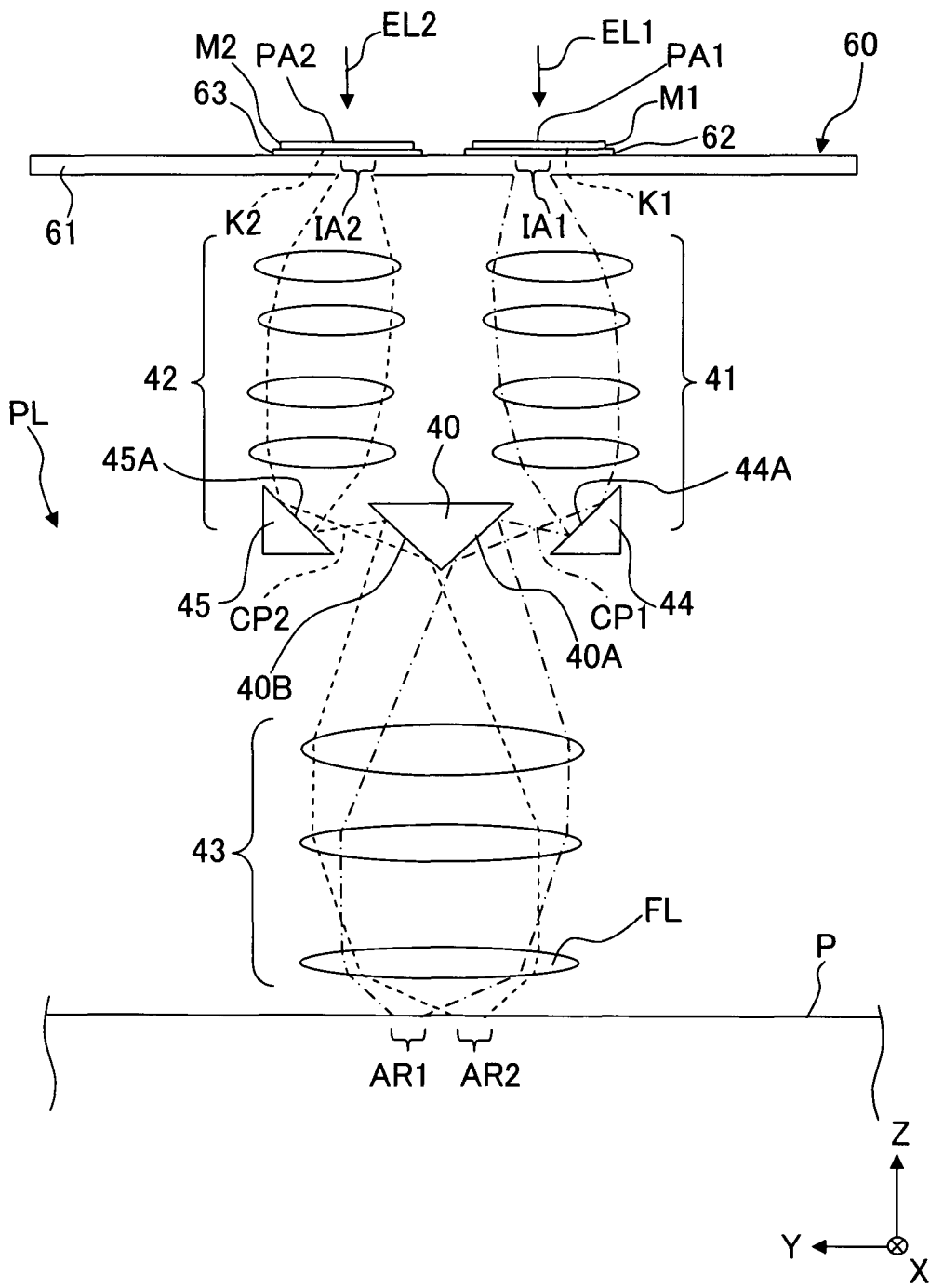
FIG. 3 shows a view illustrating an exemplary projection optical system.

Next, the projection optical system PL will be explained with reference to FIG. 3. The projection optical system PL projects, at a predetermined projection magnification onto the substrate P, the image of the first pattern PA1 of the first mask M1 illuminated with the first exposure light beam EL1 and the image of the second pattern PA2 of the second mask M2 illuminated with the second exposure light beam EL2. The projection optical system PL of this embodiment is based on the reduction system having its projection magnification which is, for example, ¼, ⅕, or ⅛. The projection optical system PL of this embodiment forms the inverted image.

The projection optical system PL of this embodiment has a plurality of optical elements including a terminal end optical element FL which is arranged opposite to the surface of the substrate P and which is closest to the image plane of the projection optical system PL. The projection optical system PL irradiates the first exposure light beam EL1 and the second exposure light beam EL2 onto the first exposure area AR1 and the second exposure area AR2 respectively via the terminal end optical element FL.

The projection optical system PL includes a first reflecting surface 40A which is arranged in the vicinity of the position optically conjugate with the first exposure area AR1 and the second exposure area AR2 and which guides the first exposure light beam EL1 from the first pattern PA1 of the first mask M1 to the terminal end optical element FL, a second reflecting surface 40B which is arranged in the vicinity of the position optically conjugate with the first exposure area AR1 and the second exposure area AR2 and which guides the second exposure light beam EL2 from the second pattern PA2 of the second mask M2 to the terminal end optical element FL, a first optical system 41 which guides the first exposure light beam EL1 from the first pattern PA1 to the first reflecting surface 40A, a second optical system 42 which guides the second exposure light beam EL2 from the second pattern PA2 to the second reflecting surface 40B, and a third optical system 43 which includes the terminal end optical element FL and which guides the first exposure light beam EL1 from the first reflecting surface 40A and the second exposure light beam EL2 from the second reflecting surface 40B to the first exposure area AR1 and the second exposure area AR2 respectively.

The first optical system 41 includes a plurality of lenses, and a reflecting member 44 which has a reflecting surface 44A for reflecting, toward the first reflecting surface 40A, the first exposure light beam EL1 allowed to pass through the plurality of lenses. The second optical system 42 includes a plurality of lenses, and a reflecting member 45 which has a reflecting surface 45A for reflecting, toward the second reflecting surface 40B, the second exposure light beam EL2 allowed to pass through the plurality of lenses.

In this embodiment, the first reflecting surface 40A and the second reflecting surface 40B are provided on an intermediate optical member 40 arranged at a predetermined position. In this embodiment, the intermediate optical member 40 includes a prism.

The first exposure light beam EL1 from the first pattern PA1 of the first mask M1 and the second exposure light beam EL2 from the second pattern PA2 of the second mask M2 are guided by the first optical system 41 and the second optical system 42 to the first reflecting surface 40A and the second reflecting surface 40B of the intermediate optical member 40 respectively. In this arrangement, the first and second exposure light beams EL1, EL2, which are patterned by the first and second masks M1, M2, are intermediately imaged respectively at the first conjugate position CP1 and the second conjugate position CP2 as the positions optically conjugate with the first and second masks M1, M2, and then the first and second exposure light beams EL1, EL2 are guided to the intermediate optical member 40. The first exposure light beam EL1 from the first pattern PA1 of the first mask M1 and the second exposure light beam EL2 from the second pattern PA2 of the second mask M2 are reflected by the intermediate optical member 40, and then they are irradiated onto the first exposure area AR1 and the second exposure area AR2 respectively via the third optical system 43 which includes the terminal end optical element FL. As described above, the projection optical system PL of this embodiment is capable of irradiating the first exposure light beam EL1 from the first pattern PA1 onto the first exposure area AR1, and the projection optical system PL is capable of irradiating the second exposure light beam EL2 from the second pattern PA2 onto the second exposure area AR2.

As shown in FIG. 1, the first, second, and third optical systems 41, 42, 43 of the projection optical system PL are held by a barrel PK. The projection optical system PL of this embodiment is provided with a first imaging characteristic-adjusting device LC1 and a second imaging characteristic-adjusting device LC2 which are capable of adjusting the imaging characteristics (imaging states) of the image of the first pattern PA1 and the image of the second pattern PA2 brought about by the projection optical system PL independently respectively. Each of the first and second imaging characteristic-adjusting devices LC1, LC2 includes an optical element-driving mechanism which is capable of moving at least one of the plurality of optical elements of the projection optical system PL.

The first imaging characteristic-adjusting device LC1 is capable of moving at least one specified optical element of the first optical system 41 in the Z axis direction parallel to the optical axis of the first optical system 41 and the directions (X axis and Y axis directions) perpendicular to the optical axis. Further, the first imaging characteristic-adjusting device LC1 is capable of inclining at least one specified optical element of the first optical system 41 with respect to the XY plane perpendicular to the optical axis (i.e., capable of making rotation in the θX and θY directions). The first exposure light beam EL1 from the first pattern PA1 is irradiated onto the first exposure area AR1 via the first optical system 41, the intermediate optical member 40, and the third optical system 43. The first imaging characteristic-adjusting device LC1 is capable of adjusting the imaging characteristic of the image of the first pattern PA1 formed with the first exposure light beam EL1 irradiated onto the first exposure area AR1 by driving the specified optical element of the first optical system 41.

The second imaging characteristic-adjusting device LC2 is capable of moving at least one specified optical element of the second optical system 42 in the Z axis direction parallel to the optical axis of the second optical system 42 and the directions (X axis and Y axis directions) perpendicular to the optical axis. Further, the second imaging characteristic-adjusting device LC2 is capable of inclining at least one specified optical element of the second optical system 42 with respect to the XY plane perpendicular to the optical axis (i.e., capable of making rotation in the θX and θY directions). The second exposure light beam EL2 from the second pattern PA2 is irradiated onto the second exposure area AR2 via the second optical system 42, the intermediate optical member 40, and the third optical system 43. The second imaging characteristic-adjusting device LC2 is capable of adjusting the imaging characteristic of the image of the second pattern PA2 formed with the second exposure light beam EL2 irradiated onto the second exposure area AR2 by driving the specified optical element of the second optical system 42.

The first and second imaging characteristic-adjusting devices LC1, LC2 are controlled by the controller 30. The controller 30 drives the specified optical element of the projection optical system PL (first and second optical systems 41, 42) by using the first and second imaging characteristic-adjusting devices LC1, LC2. Accordingly, it is possible to adjust the imaging characteristic of the projection optical system PL including, for example, various aberrations (for example, the distortion, the astigmatism, the spherical aberration, and the wave front aberration), the projection magnification, and the image plane position (focus position).

The controller 30 is also capable of performing the positional adjustment (i.e., the shift adjustment and/or the rotation adjustment) in the XY directions and/or the θZ direction of the images of the first and second patterns PA1, PA2 by using the first and second imaging characteristic-adjusting devices LC1, LC2.

That is, the controller 30 is capable of performing the adjustment of the state of each of the images of the first and second patterns PA1, PA2 (for example, the size and the distortion or strain), the positional adjustment in the Z axis direction and the inclination adjustment in the θX and θY directions of the image plane of the projection optical system PL on which each of the images of the first and second patterns PA1, PA2 is formed, and the positional adjustment in the X axis direction, the Y axis direction, and the θZ direction of each of the images of the first and second patterns PA1, PA2 by using the first and second imaging characteristic-adjusting devices LC1, LC2.

In this embodiment, at least one of the optical element of each of the first and second optical systems 41, 42, which is moved by each of the first and second imaging characteristic-adjusting devices LC1, LC2, is the lens. However, it is also allowable to select any other optical element, for example, a parallel flat plate or a reflecting element. In this embodiment, the two imaging characteristic-adjusting devices (LC1, LC2) are provided. However, it is also allowable that only one imaging characteristic-adjusting device is provided. Alternatively, it is also allowable that three or more imaging characteristic-adjusting devices are provided. For example, it is also allowable to provide an imaging characteristic-adjusting device which is capable of moving at least one of the optical elements of the third optical system 43 in the Y axis direction, the X axis direction, and the Z axis direction parallel to the optical axis of the third optical system 43 and which is capable of rotating at least one of the optical elements of the third optical system 43 in the θX and θY directions. In this embodiment, the imaging characteristic-adjusting device moves the optical element in the directions of five degrees of freedom (in the X axis, Y axis, Z axis, θX, and θY directions). However, the direction of movement of the optical element is not limited to the directions of five degrees of freedom. This embodiment adopts the system in which the imaging characteristic-adjusting device moves the optical element. However, it is also allowable to use any other system in place thereof or in combination therewith. For example, a pressure-adjusting mechanism, which adjusts the pressure of the gas contained in the space disposed between some of the optical elements held in the barrel PK, may be used as the first and second imaging characteristic-adjusting devices LC1, LC2.

The exposure apparatus, which is provided with the imaging characteristic-adjusting device capable of adjusting the imaging characteristic of the image of the pattern brought about by the projection optical system, is disclosed, for example, in Japanese Patent Application Laid-open No. 60-78454 (corresponding to U.S. Pat. No. 4,666,273), Japanese Patent Application Laid-open No. 11-195602 (corresponding to U.S. Pat. No. 6,235,438), and International Publication No. 03/65428 (corresponding to United States Patent Publication No. 2005/0206850). The disclosures of, for example, United States patents described above are incorporated herein by reference within a range of permission of the domestic laws and ordinances of the designated or selected state.

Next, the substrate stage 80 will be explained. The substrate stage 80 is movable while holding the substrate P in a predetermined area including the first exposure area AR1 and the second exposure area AR2 onto which the first exposure light beam EL1 and the second exposure light beam EL2 are irradiated. As shown in FIG. 1, the substrate stage 80 includes a substrate holder 80H which holds the substrate P, while being supported in a non-contact manner on the base member BP, for example, by means of air bearings. The substrate P can be moved in the directions of six degrees of freedom of the X axis, Y axis, Z axis, θX, θY, and θZ directions in accordance with the driving operation of the substrate stage-driving device 80D which includes, for example, an actuator such as a linear motor or the like.

The position information about the substrate stage 80 (as well as the substrate P) is measured by a laser interferometer 75 of the measuring system 70. The laser interferometer 75 measures the position information about the substrate stage 80 in relation to the X axis, Y axis, and θZ directions by using a reflecting surface 76 provided on the substrate stage 80. The measuring system 70 may also measure, for example, the position information about the substrate stage 80 in relation to the Z axis, θX, and θY directions by using the laser interferometer 75. The surface position information about the surface of the substrate P held on the substrate stage 80 (position information in relation to the Z axis, θX, and θY directions) is detected by an unillustrated focus/leveling-detecting system. In this embodiment, a multi-point position-detecting system, which detects the height information about the substrate P (position information in relation to the Z axis direction) at a plurality of detecting points respectively, may be used as the focus/leveling-detecting system as disclosed, for example, in U.S. Pat. No. 6,608,681. The controller 30 drives the substrate stage-driving device 80D to control the position of the substrate P held on the substrate stage 80 based on the measurement result of the laser interferometer 75 and the detection result of the focus/leveling-detecting system. It is not necessarily indispensable that the focus/leveling-detecting system is provided so that the plurality of detecting points are arranged inside and/or outside the first and second exposure areas AR1, AR2. For example, the focus/leveling-detecting system may be provided separately from the projection optical system PL.

Next, the measuring stage 90 will be explained. The measuring stage 90 is movable while carrying the measuring instrument or the measuring device (including the measuring member such as the reference plate) for performing the measurement in relation to the exposure in a predetermined area including the first exposure area AR1 and the second exposure area AR2 onto which the first exposure light beam EL1 and the second exposure light beam EL2 are irradiated. The measuring instrument includes the measuring instrument for measuring the state of the exposure light beam EL and the imaging characteristic (including, for example, the imaging state of the pattern image brought about by the projection optical system PL) of the projection optical system PL. The measurement result with the measuring instrument is outputted to the controller 30.

As shown in FIG. 1, the measuring stage 90 is supported in a non-contact manner on the base member BP, for example, by means of air bearings. The measuring instrument can be moved in the directions of six degrees of freedom of the X axis, Y axis, Z axis, θX, θY, and θZ directions in accordance with the driving operation of the measuring stage-driving device 90D including an actuator such as a linear motor or the like.

The position information about the measuring stage 90 is measured by a laser interferometer 77 of the measuring system 70. The laser interferometer 77 measures the position information about the measuring stage 90 in relation to the X axis, Y axis, and θZ directions by using a reflecting surface 78 provided on the measuring stage 90. The controller 30 controls the position of the measuring stage 90 by driving the measuring stage-driving device 90D based on the measurement result of the laser interferometer 77. The measuring system 70 may measure, for example, the position information about the measuring stage 90 in relation to the Z axis, θX, and θY directions by using the laser interferometer 77.

The exposure apparatus, which is provided with the substrate stage for holding the substrate P and the measuring stage carried with the measuring instrument, is disclosed, for example, in Japanese Patent Application Laid-open No. 11-135400 (corresponding to International Publication No. 1999/23692) and Japanese Patent Application Laid-open No. 2000-164504 (corresponding to U.S. Pat. No. 6,897,963). The disclosure of United States patent is incorporated herein by reference within a range of permission of the domestic laws and ordinances of the designated or selected state.

Figure 4:
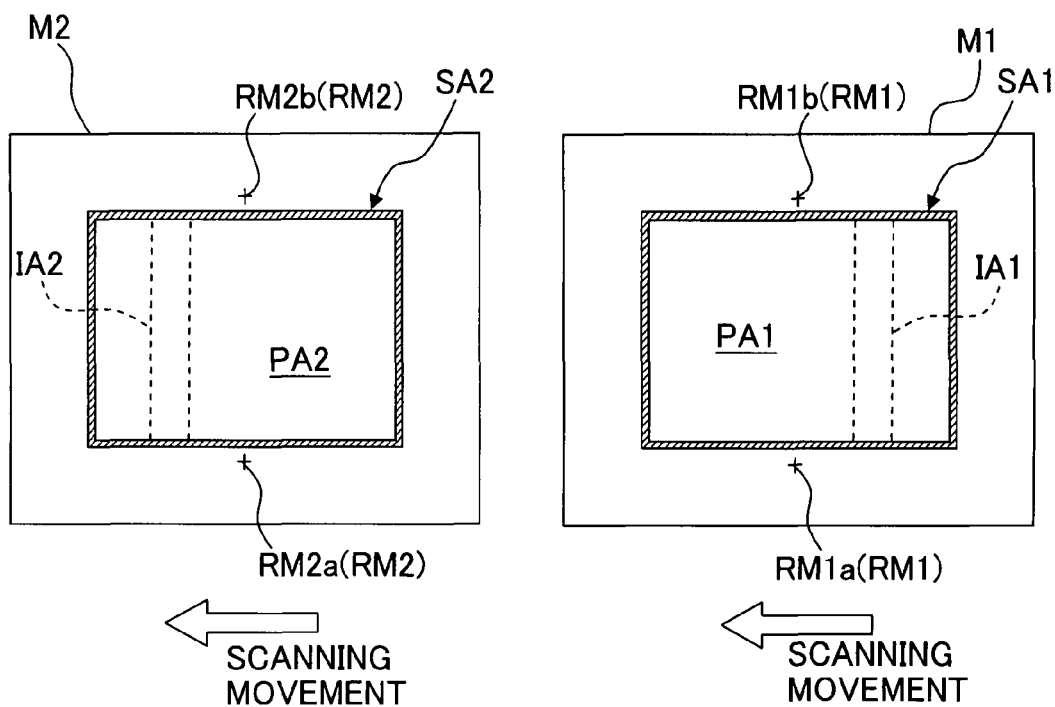
FIG. 4 schematically shows a relationship between first and second masks and first and second illumination areas.
Figure 5:
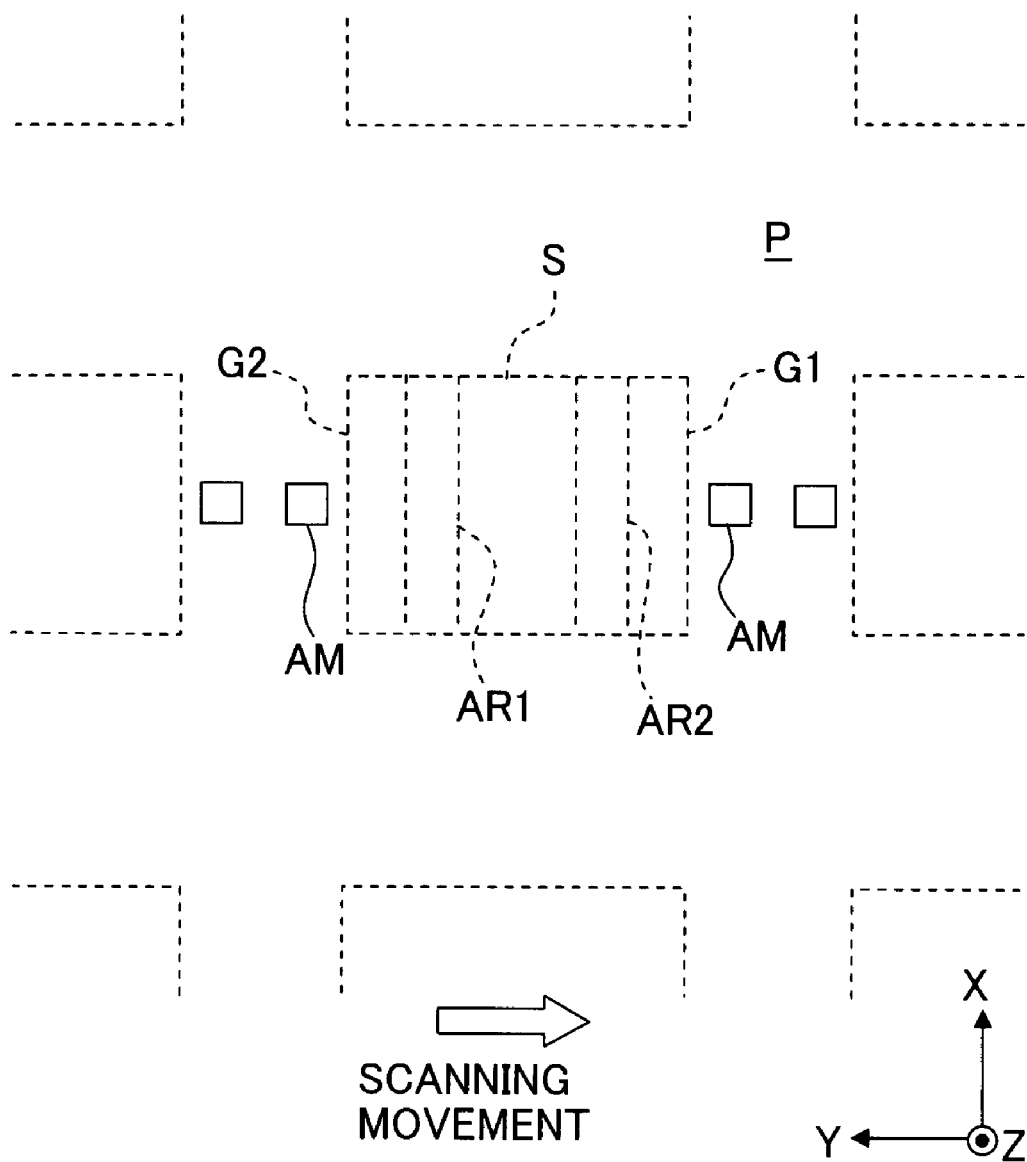
FIG. 5 schematically shows a relationship between a shot area of a substrate and first and second exposure areas.

FIG. 4 schematically shows the relationship between the first illumination area IA1 and the second illumination area IA2 and the first mask M1 and the second mask M2. FIG. 5 schematically shows the relationship between the first exposure area AR1 and the second exposure area AR2 and the shot area S as the objective exposure area on the substrate P. In this embodiment, the first exposure area AR1 onto which the first exposure light beam EL1 is irradiated and the second exposure area AR2 onto which the second exposure light beam EL2 is irradiated are the projection areas of the projection optical system PL conjugate with the first and second illumination areas IA1, IA2.

The projection optical system PL irradiates the first exposure light beam EL1 from the first pattern PA1 onto the first pattern PA1. Further, the projection optical system PL irradiates the second exposure light beam EL2 from the second pattern PA2 onto the second pattern PA2. The illumination system IL radiates the first exposure light beam EL1 onto the first pattern PA1. Further, the illumination system IL radiates the second exposure light beam EL2 onto the second pattern PA2. The projection optical system PL forms the image of the first pattern PA1 with the first exposure light beam EL1 irradiated onto the first exposure area AR1. The projection optical system PL forms the image of the second pattern PA2 with the second exposure light beam EL2 irradiated onto the second exposure area AR2.

The controller 30 irradiates the first exposure light beam EL1 and the second exposure light beam EL2 onto the first exposure area AR1 and the second exposure area AR2 respectively via the first mask M1 and the second mask M2 by means of the illumination system IL and the projection optical system PL while moving the shot area S on the substrate P in the Y axis direction with respect to the first exposure area AR1 and the second exposure area AR2 by using the substrate stage 80 in synchronization with the movement of the first mask M1 and the second mask M2 in the Y axis direction effected by the mask stage 60 with respect to the first illumination area IA1 and the second illumination area IA2. Accordingly, the shot area S on the substrate P is subjected to the multiple exposure (double exposure) with the image of the first pattern PA1 formed by the first exposure light beam EL1 irradiated onto the first exposure area AR1 and the image of the second pattern PA2 formed by the second exposure light beam EL2 irradiated onto the second exposure area AR2.

That is, in this embodiment, the controller 30 performs the multiple exposure for the shot area S on the substrate P by irradiating the first exposure light beam EL1 and the second exposure light beam EL2, which are patterned, onto the first exposure area AR1 and the second exposure area AR2 respectively by synchronously performing the movement in the Y axis direction of the substrate P with respect to the first and second exposure areas AR1, AR2, the movement in the Y axis direction of the first mask M1 with respect to the first illumination area IA1, and the movement in the Y axis direction of the second mask M2 with respect to the second illumination area IA2.

As shown in FIG. 4, in this embodiment, the first mask M1 and the second mask M2 are arranged and aligned in the Y axis direction. The first mask M1 is arranged on the −Y side with respect to the second mask M2. The first illumination area IA1, which is brought about by the first exposure light beam EL1 on the first mask M1, is defined to have a rectangular shape (slit-shaped form) in which the X axis direction is the longitudinal direction. The second illumination area IA2, which is brought about by the second exposure light beam EL2 on the second mask M2, is also defined to have a rectangular shape (slit-shaped form) in which the X axis direction is the longitudinal direction.

As shown in FIG. 5, in this embodiment, the first exposure area AR1 and the second exposure area AR2 are defined at the different positions in the Y axis direction in the field of the projection optical system PL. The substrate stage 80 is capable of moving the shot area S on the retained substrate P in the Y axis direction with respect to the first exposure area AR1 and the second exposure area AR2. The first exposure area AR1 and the second exposure area AR2 are rectangular (slit-shaped) respectively, wherein the X axis direction is the longitudinal direction. The first exposure area AR1 and the second exposure area AR2 can be simultaneously arranged in one shot area S. That is, in this embodiment, the distance between the first exposure area AR1 (center of the first exposure area AR1) and the second exposure area AR2 (center of the second exposure area AR2) in the Y axis direction is smaller than the width of one shot area S on the substrate P in the Y axis direction. In this embodiment, the first exposure area AR1 and the second exposure area AR2 are separated from each other in the Y axis direction. The first exposure area AR1 is defined on the +Y side with respect to the second exposure area AR2.

The controller 30 moves the first mask M1 having the first pattern PA1 and the second mask M2 having the second pattern PA2 respectively in the scanning direction (Y axis direction) during the exposure for the shot area S on the substrate P. Further, the controller 30 moves the substrate P in the scanning direction (Y axis direction). In this embodiment, the controller 30 illuminates the first pattern PA1 of the first mask M1 and the second pattern PA2 of the second mask M2 respectively with the first exposure light beam EL1 and the second exposure light beam EL2 while moving the first mask M1 and the second mask M2 in the identical scanning direction (Y axis direction) by using the mask stage 60 during the exposure for the shot area S on the substrate P. The first mask M1 and the second mask M2 are placed on the main stage 61. The controller 30 drives the main stage 61 by using the main stage-driving device 64. Accordingly, the first mask M1 and the second mask M2 are moved in the identical scanning direction (Y axis direction). For example, when the first mask M1 is moved in the +Y direction by the main stage 61 of the mask stage 60 during the exposure for the shot area S on the substrate P, the second mask M2 is also moved together in the +Y direction. When the first mask M1 is moved in the −Y direction, the second mask M2 is also moved together in the −Y direction. The projection optical system PL of this embodiment forms the inverted image. The controller 30 moves the first and second masks M1, M2 and the substrate P in the mutually opposite scanning directions (Y axis directions) during the exposure for the shot area S on the substrate P. For example, when the first and second masks M1, M2 are moved in the +Y direction by using the mask stage 60, the controller 30 moves the substrate P in the −Y direction by using the substrate stage 80. When the first and second masks M1, M2 are moved in the −Y direction, the controller 30 moves the substrate P in the +Y direction.

FIGS. 4 and 5 show a state in which the substrate P is moved in the −Y direction in synchronization with the movement of the first and second masks M1, M2 in the +Y direction during the exposure for the shot area S on the substrate P.

As described above, in this embodiment, the first exposure area AR1 and the second exposure area AR2 are defined at the different positions in the scanning direction (Y axis direction) of the substrate P on the substrate P. The first exposure area AR1 is defined on the +Y side with respect to the second exposure area AR2. The first mask M1 and the second mask M2 are moved in the identical scanning direction (Y axis direction). The projection optical system PL of this embodiment forms the inverted image, and the first and second masks M1, M2 and the substrate P are moved in the mutually opposite scanning directions (Y axis directions). Therefore, in this embodiment, as shown in FIG. 4, the first mask M1 is arranged on the −Y side with respect to the second mask M2. The first illumination area IA1 and the second illumination area IA2 are defined at the mutually different positions with respect to the respective centers of the first and second masks M1, M2 during the scanning exposure. In other words, the positions of the first and second masks M1, M2 in relation to the first and second illumination areas IA1, IA2 are defined, for example, as shown in FIG. 4 depending on the positional relationship between the first and second exposure areas AR1, AR2. Accordingly, the shot area S on the substrate P can be subjected to the multiple exposure with the image of the first pattern PA1 and the image of the second pattern PA2 in the desired positional relationship.

In this embodiment, when the shot area S on the substrate P is subjected to the exposure, the controller 30 is operated such that one of the illumination for the first pattern PA1 with the first exposure light beam EL1 and the illumination for the second pattern PA2 with the second exposure light beam EL2 is started and then the other is started, and one of them is completed and then the other is completed. Further, the controller 30 is operated such that one of the irradiation of the first exposure light beam EL1 onto the shot area S (projection of the image of the first pattern PA1 by the first exposure light beam EL1) and the irradiation of the second exposure light beam EL2 onto the shot area S (projection of the image of the second pattern PA2 by the second exposure light beam EL2) is started and then the other is started, and one of them is completed and then the other is completed.

For example, as shown in FIGS. 4 and 5, when the exposure is performed while moving the shot area S of the substrate P in the −Y direction, the controller 30 is operated as follows. That is, the illumination for the first pattern PA1 with the first exposure light beam EL1 is started, and then the illumination for the second pattern PA2 with the second exposure light beam EL2 is started. The illumination for the first pattern PA1 with the first exposure light beam EL1 is completed, and then the illumination for the second pattern PA2 with the second exposure light beam EL2 is completed. Further, the controller 30 is operated as follows. That is, the projection of the first pattern PA1 with the first exposure light beam EL1 onto the shot area S is started, and then the projection of the second pattern PA2 with the second exposure light beam EL2 onto the shot area S is started. The projection of the first pattern PA1 with the first exposure light beam EL1 onto the shot area S is completed, and then the projection of the second pattern PA2 with the second exposure light beam EL2 onto the shot area S is completed.

An explanation will be made with reference to FIGS. 4 and 5 about an exemplary sequence adopted when the first and second exposure light beams EL1, EL2 are irradiated onto the shot area S on the substrate P. The following description will be made as exemplified by a case in which the shot area S on the substrate P is exposed while moving the shot area S on the substrate P in the −Y direction by using the substrate stage 80 with respect to the first exposure area AR1 and the second exposure area AR2 in synchronization with the movement in the +Y direction of the first mask M1 and the second mask M2 effected by the mask stage 60.

The positions of the first exposure area AR1 and the second exposure area AR2 in the XY coordinate system (including the relative positional relationship between the first exposure area AR1 and the second exposure area AR2), which are defined by the measuring system 70 (laser interferometer 75), are determined depending on, for example, the positions of the first and second illumination areas IA1, IA2 defined by the first and second optical mechanisms BL1, BL2 of the illumination system IL and the arrangement of the respective optical elements for constructing the projection optical system PL including, for example, the intermediate optical member 40. In this embodiment, the first exposure area AR1 and the second exposure area AR2 have the identical shape and the identical size, and they are the rectangular areas which are long in the X axis direction respectively. Further, in this embodiment, the first exposure area AR1 and the second exposure area AR2 have the identical position in the X axis direction, and they are away from each other by the predetermined distance in the Y axis direction.

With reference to FIG. 4, the illumination with the first exposure light beam EL1 for the first pattern PA1 is started at the point of time at which the edge of the first pattern formation area SA1 on the +Y side of the first mask M1 formed with the first pattern PA1 arrives at the edge of the first illumination area IA1 on the −Y side. With reference to FIG. 5, the setting is made such that the edge G1 of the shot area S on the −Y side on the substrate P arrives at the edge of the first exposure area AR1 on the +Y side at the point of time at which the edge of the first pattern formation area SA1 on the +Y side of the first mask M1 arrives at the first illumination area IA1. The irradiation of the first exposure light beam EL1 onto the first exposure area AR1 is started.

The controller 30 continuously illuminates the first pattern PA1 with the first exposure light beam EL1 by continuing the movement of the mask stage 60 (main stage 61) in the +Y direction. The first pattern PA1 passes across the first illumination area IA1 by continuing the movement of the mask stage 60 in the +Y direction.

The controller 30 continuously performs the irradiation of the first exposure light beam EL1 onto the first exposure area AR1, i.e., the projection of the image of the first pattern PA1 with the first exposure light beam EL1 onto the shot area S on the substrate P by continuing the movement of the substrate stage 80 in the −Y direction in synchronization with the movement of the mask stage 60 in the +Y direction. The shot area S on the substrate P passes across the first exposure area AR1 by continuing the movement of the substrate stage 80 in the −Y direction.

The illumination with the first exposure light beam EL1 for the first pattern PA1 is completed at the point of time at which the edge of the first pattern formation area SA1 on the −Y side of the first mask M1 arrives at edge of the first illumination area IA1 on the +Y side. With reference to FIG. 5, the edge G2 of the shot area S on the substrate P on the +Y side arrives at the edge of the first exposure area AR1 on the −Y side at the point of time at which the edge of the first pattern formation area SA1 of the first mask M1 on the −Y side arrives at the edge of the first illumination area IA1 on the +Y side. The irradiation of the first exposure light beam EL1 onto the first exposure area AR1 is stopped at the point of time at which the edge G2 of the shot area S on the +Y side arrives at the edge of the first exposure area AR1 on the −Y side. Accordingly, the exposure of the shot area S with the first exposure light beam EL1 irradiated onto the first exposure area AR1, i.e., the projection of the image of the first pattern PA1 with the first exposure light beam EL1 onto the shot area S comes to an end.

The edge on the +Y side of the second pattern formation area SA2 of the second mask M2 formed with the second pattern PA2 arrives at the edge on the −Y side of the second illumination area IA2 at a predetermined timing during the period in which the first pattern formation area SA1 of the first mask M1 passes across the first illumination area IA1. The illumination with the second exposure light beam EL2 for the second pattern PA2 is started. With reference to FIG. 5, the edge G1 on the −Y side of the shot area S on the substrate P arrives at the edge on the +Y side of the second exposure area AR2 at the point of time at which the edge on the +Y side of the second pattern formation area SA2 of the second mask M2 arrives at the second illumination area IA2. The irradiation of the second exposure light beam EL2 onto the second exposure area AR2 is started. That is, the edge G1 on the −Y side of the shot area S arrives at the second exposure area AR2 at a predetermined timing during the period in which the shot area S on the substrate P passes across the first exposure area AR1. The projection of the image of the second pattern PA2 with the second exposure light beam EL2 onto the shot area S is started.

The controller 30 continuously illuminates the second pattern PA2 with the second exposure light beam EL2 by continuing the movement of the mask stage 60 (main stage 61) in the +Y direction. The second pattern PA2 passes across the second illumination area IA2 by continuing the movement of the mask stage 60 in the +Y direction.

The controller 30 continuously performs the projection of the image of the second pattern PA2 with the second exposure light beam EL2 onto the shot area S on the substrate P by continuing the movement of the substrate stage 80 in the −Y direction in synchronization with the movement of the mask stage 60 in the +Y direction. The shot area S on the substrate P passes across the second exposure area AR2 by continuing the movement of the substrate stage 80 in the −Y direction.

The illumination with the second exposure light beam EL2 for the second pattern PA2 is completed at the point of time at which the edge of the second pattern formation area SA2 on the −Y side of the second mask M2 arrives at edge of the second illumination area IA2 on the +Y side. With reference to FIG. 5, the edge G2 of the shot area S on the substrate P on the +Y side arrives at the edge of the second exposure area AR2 on the −Y side at the point of time at which the edge of the second pattern formation area SA2 of the second mask M2 on the −Y side arrives at the edge of the second illumination area IA2 on the +Y side. The irradiation of the second exposure light beam EL2 onto the second exposure area AR2 is stopped at the point of time at which the edge G2 of the shot area S on the +Y side arrives at the edge of the second exposure area AR2 on the −Y side. Accordingly, the exposure of the shot area S with the second exposure light beam EL2 irradiated onto the second exposure area AR2, i.e., the projection of the image of the second pattern PA2 with the second exposure light beam EL2 onto the shot area S comes to an end.

Thus, the photosensitive material layer of the shot area S on the substrate P, which is exposed with the first exposure light beam EL1 irradiated onto the first exposure area AR1, is exposed again (subjected to the double exposure) with the second exposure light beam EL2 irradiated onto the second exposure area AR2 without performing, for example, the developing step.

The illumination with the first exposure light beam EL1 for the first pattern PA1 is completed at the predetermined timing during the period in which the second pattern formation area SA2 passes across the second illumination area IA2. The irradiation of the first exposure light beam EL1 onto the shot area S is completed at the predetermined timing during the period in which the shot area S on the substrate P passes across the second exposure area AR2.

As described above, in this embodiment, one shot area S on the substrate P can be subjected to the multiple exposure (double exposure) with the image of the first pattern PA1 and the image of the second pattern PA2 by means of one time of the scanning operation.

Next, the alignment mark will be explained. As shown in FIG. 4, a first alignment mark RM1, which is formed in a predetermined positional relationship with respect to the first pattern PA1, is formed on the first mask M1. The first alignment mark RM1 includes a pair of marks RM1a, RM1b provided while being away from each other by a predetermined distance in the X axis direction. Similarly, a second alignment mark RM2, which is formed in a predetermined positional relationship with respect to the second pattern PA2, is formed on the second mask M2. The second alignment mark RM2 also includes a pair of marks RM2a, RM2b provided while being away from each other by a predetermined distance in the X axis direction. The first alignment mark RM1 and the second alignment mark RM2 are provided at the corresponding positions on the first mask M1 and on the second mask M2. In FIG. 4, the first and second alignment marks RM1, RM2 are formed outside the first and second pattern formation areas SA1, SA2 on the first and second masks M1, M2 respectively. However, the alignment marks RM1, RM2 may be formed inside the first and second pattern formation areas SA1, SA2 respectively. The following description will be made assuming that the alignment marks RM1, RM2 are arranged inside the first and second pattern formation areas SA1, SA2 respectively.

As shown in FIG. 5, substrate alignment marks AM, which are formed in a predetermined positional relationship with respect to the shot area S, are formed on the substrate P. In this embodiment, the alignment marks AM are formed on the both sides in the Y axis direction of the shot area S respectively. However, the number and the positions of the alignment marks AM are not limited thereto. As shown in FIG. 6B, a reference plate 50, on which a reference mark FM and a reference mark FP are formed in a predetermined positional relationship, is provided on the measuring stage 90. The reference mark FM includes a pair of marks FMa, FMb which are provided while being away from each other in the X axis direction. In this embodiment, the reference mark FM is used not only for the detection of the position information about at least one of the images of the first and second patterns PA1, PA2 as described later on but also for the baseline measurement of the second detecting system 20 together with the reference mark FP.

Next, the first detecting system 10 will be explained. The first detecting system 10 obtains at least one of the position information about the image of the first pattern PA1 formed in the first exposure area AR1 and the position information about the image of the second pattern PA2 formed in the second exposure area AR2. As shown in FIG. 1, the first detecting system 10 is provided over or above the mask stage 60. As described above, the reference mark FM is provided on the reference plate 50 disposed on the measuring stage 90. In this embodiment, the reference mark FM is detected by the first detecting system 10 via the projection optical system PL to thereby obtain at least one of the position information about the image of the first pattern PA1 and the position information about the image of the second pattern PA2.

The first detecting system 10 is an alignment system based on the TTR (Through The Reticle) system based on the use of the light beam having the exposure wavelength. The first detecting system 10 includes a first sub-detecting system 11 which detects the first positional relationship between the first pattern PA1 and the reference mark FM and the second sub-detecting system 12 which detects the second positional relationship between the second pattern PA2 and the reference mark FM. The first sub-detecting system 11 has a pair of mark detecting systems 11A, 11B which are provided while being away from each other by a predetermined distance in the X axis direction. The second sub-detecting system 12 also has a pair of mark detecting systems 12A, 12B which are provided while being away from each other by a predetermined distance in the X axis direction. The mark detecting systems 11A, 11B, 12A, 12B are arranged over or above the mask stage 60.

The mark detecting systems 11A, 11B of the first sub-detecting system 11 observe (detect), via the projection optical system PL, the pair of marks RM1a, RM1b of the first mask M1 and the pair of marks FMa, FMb provided on the reference plate 50 corresponding to the pair of marks RM1a, RM1b. Similarly, the mark detecting systems 12A, 12B of the second sub-detecting system 12 observe (detect), via the projection optical system PL, the pair of marks RM2a, RM2b of the second mask M2 and the pair of marks FMa, FMb provided on the reference plate 50 corresponding to the pair of marks RM2a, RM2b.

The first detecting system 10 (first and second sub-detecting systems 11, 12) of this embodiment is an alignment system based on the VRA (Visual Reticle Alignment) system in which the light beam is irradiated onto the mark, and the image data of the mark photographed, for example, by a CCD camera or the like is subjected to the image processing to detect the mark position as disclosed, for example, in Japanese Patent Application Laid-open No. 7-176468 (corresponding to U.S. Pat. No. 6,498,352).

The first sub-detecting system 11 of the first detecting system 10 simultaneously observes, via the projection optical system PL, the reference mark FM (FMa, FMb) and the first alignment mark RM1 (RM1a, RM1b) provided in the predetermined positional relationship with respect to the first pattern PA1. Accordingly, it is possible to detect the first positional relationship in relation to the X axis direction, the Y axis direction, and the θZ direction between the first pattern PA1 and the reference mark FM. The second sub-detecting system 12 of the first detecting system 10 simultaneously observes, via the projection optical system PL, the reference mark FM (FMa, FMb) and the second alignment mark RM2 (RM2a, RM2b) provided in the predetermined positional relationship with respect to the second pattern PA2. Accordingly, it is possible to detect the second positional relationship in relation to the X axis direction, the Y axis direction, and the θZ direction between the second pattern PA2 and the reference mark FM. That is, the first detecting system 10 detects, via the projection optical system PL, the positional relationship between the reference mark FM and the first alignment mark RM1 formed in the predetermined positional relationship with respect to the first pattern PA1 and the positional relationship between the reference mark FM and the second alignment mark RM2 formed in the predetermined positional relationship with respect to the second pattern PA2. Accordingly, it is possible to detect the first positional relationship between the first pattern PA1 and the reference mark FM and the second positional relationship between the second pattern PA2 and the reference mark FM. In this embodiment, the first detecting system 10 is also used for the baseline measurement of the second detecting system 20.

Next, the second detecting system 20 will be explained. As shown in FIG. 1, a part of the second detecting system 20 is provided in the vicinity of the end portion of the projection optical system PL, which is arranged on the +Y side of the projection optical system PL. As described above, the reference mark FP, which is provided in the predetermined positional relationship with respect to the reference mark FM, is provided on the measuring stage 90. The second detecting system 20 detects the reference mark FP and the alignment mark AM provided on the substrate P.

The second detecting system 20 is an alignment system of the off-axis manner, which is such an alignment system of the FIA (Field Image Alignment) manner that a broad band detecting light flux, which does not photosensitive the photosensitive material on the substrate P, is irradiated onto the objective mark (alignment mark AM formed on the substrate P and reference mark FP formed on the reference plate 50), and an image of the objective mark focused on a light-receiving surface by the reflected light beam from the objective mark and an image of an index (index mark or reference mark on a reference plate provided in the second detecting system 20) are photographed by using an image pickup device (CCD or the like) to perform the image processing for the image pickup signals thereof so that the position of the mark is measured, as disclosed, for example, in Japanese Patent Application Laid-open No. 4-65603 (corresponding to U.S. Pat. No. 5,493,403). The disclosure of U.S. Pat. No. 5,493,403 is incorporated herein by reference within a range of permission of the domestic laws and ordinances of the designated or selected state. The index defines the detection reference position of the second detecting system 20 in the XY coordinate system defined by the measuring system 70. The second detecting system 20 detects the positional relationship (positional deviation) between the index and the image of the detection objective mark. The controller 30 can detect the position (coordinate value) of the detection objective mark in the XY coordinate system defined by the measuring system 70 based on the detected positional relationship and the position information about the measuring stage 90 or the substrate stage 80 obtained from the measuring system 70 upon the mark detection by the second detecting system 20. The baseline amount of the second detecting system 20, i.e., the distance between the detection reference position of the second detecting system 20 in the XY coordinate system and the projection position of at least one of the images of the first and second patterns PA1, PA2 is obtained by the detection of the reference mark FM by the first detecting system 10 and the detection of the reference mark FP by the second detecting system 20, which is stored in the controller 30.

Figure 6A:
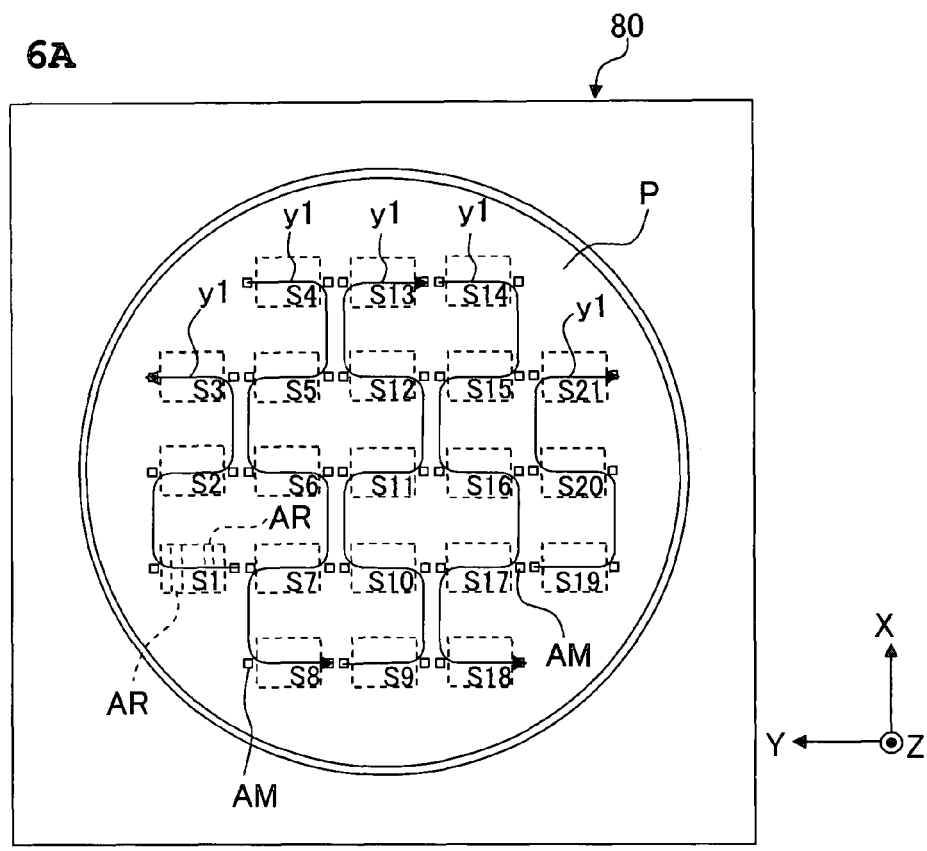
FIG. 6A shows a plan view illustrating a substrate stage as viewed from a position thereover or thereabove.
Figure 6B:
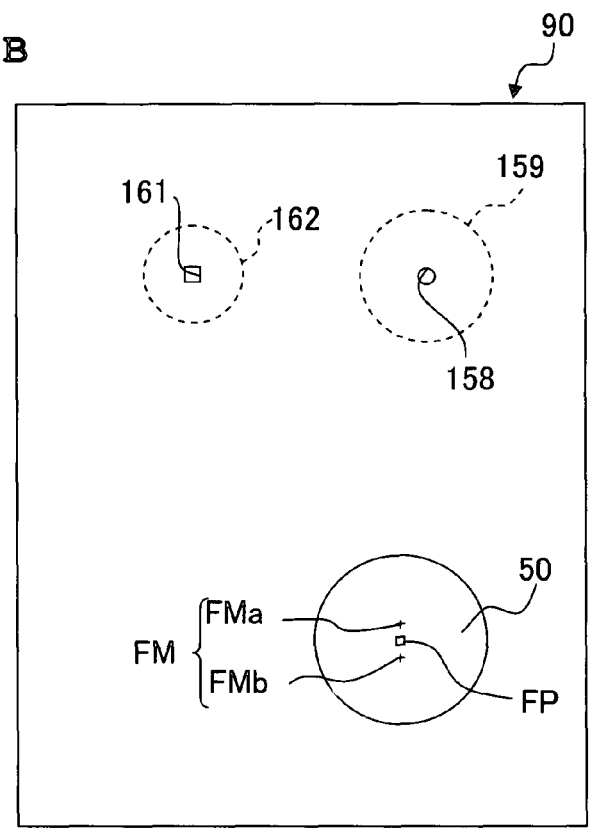
FIG. 6B shows a measuring stage as viewed from a position thereover or thereabove.

FIGS. 6A and 6B show plan views illustrating the substrate stage 80 and the measuring stage 90. As shown in FIG. 6A, a plurality of shot areas S1 to S21 as exposure objective areas are provided in a matrix form on the substrate P. Further, a plurality of alignment marks AM are provided corresponding to the shot areas S1 to S21 respectively. When the shot areas S1 to S21 of the substrate P are subjected to the exposure respectively, the controller 30 irradiates the first and second exposure light beams EL1, EL2 onto the substrate P by irradiating the exposure light beams EL1, EL2 onto the first and second exposure areas AR1, AR2 while relatively moving the first and second exposure areas AR1, AR2 and the substrate P, for example, as indicated by arrows y1 in FIG. 6. The controller 30 controls the operation of the substrate stage 80 so that the first and second exposure areas AR1, AR2 are moved along the arrows y1 with respect to the substrate P.

As shown in FIG. 6B, the reference plate 50, on which a plurality of reference marks are formed, is provided as one of the measuring instrument (measuring member) at a predetermined position of the upper surface of the measuring stage 90. The reference marks FM to be detected by the first detecting system 10 as described above and the reference mark FP to be detected by the second detecting system 20 are formed in the predetermined positional relationship on the upper surface of the reference plate 50. The first detecting system 10 detects the reference mark FM provided on the reference plate 50, and the second detecting system 20 detects the reference mark FP provided on the reference plate 50.

In the following description, the reference mark FM, which is detected by the first detecting system 10, is appropriately referred to as "first reference mark FM". The reference mark FP, which is detected by the second detecting system 20, is appropriately referred to as "second reference mark FP".

As described above, the first reference mark FM includes the pair of marks FMa, FMb which are provided while being away from each other in the X axis direction. The spacing distance (distance) L1 in the X axis direction between the pair of marks FMa, FMb of the first reference mark FM formed on the reference plate 50 is defined to satisfy the condition of L1=L2×β provided that L2 represents the spacing distance between the pair of marks RM1a, RM1b of the first alignment mark RM1 formed on the first mask M1, and β represents the projection magnification of the projection optical system PL. The spacing distance between the pair of marks RM2a, RM2b of the second alignment mark RM2 formed on the second mask M2 is also set to L2. The shape and the size of the first reference mark FM are formed in consideration of the shape and the size of the first and second alignment marks RM1, RM2. The first reference mark FM has the size capable of being arranged in the first and second exposure areas AR1, AR2 respectively. In this embodiment, the second reference mark FP is arranged between the two marks FMa, FMb of the first reference mark FM. In this embodiment, each of the first and second alignment marks RM1, RM2 and the first reference mark FM includes a two-dimensional mark, for example, a cross-shaped mark. Each of the second reference mark FP and the alignment mark AM of the substrate P includes a two-dimensional mark, for example, two periodic marks arranged periodically in the X axis direction and the Y axis direction respectively.

As shown in FIG. 6, an aperture 158 is formed at a position separated from the reference plate 50 on the upper surface of the measuring stage 90. At least a part of a wave front aberration-measuring device 159, which is as disclosed, for example, in International Publication No. 99/60361 (corresponding to European Patent No. 1,079,223), is arranged under the aperture 158 (in the −Z direction).

An aperture 161 is formed at a position separated from the reference plate 50 on the upper surface of the measuring stage 90. At least a part of a spatial image-measuring device 162, which is as disclosed, for example, in Japanese Patent Application Laid-open No. 2002-14005 (corresponding to United States Patent Publication No. 2002/0041377), is arranged under the aperture 161 (in the −Z direction).

Although not shown, the measuring stage 90 is arranged with an exposure light beam-measuring device which measures information (for example, light amount, illuminance, and uneven illuminance) about the exposure energy of the first and second exposure light beams EL1, EL2 irradiated onto the measuring stage 90 via the projection optical system PL. Those usable as the exposure light beam-measuring device include an unevenness measuring device for measuring the uneven illuminance as disclosed, for example, in Japanese Patent Application Laid-open No. 57-117238 (corresponding to U.S. Pat. No. 4,465,368) or for measuring the fluctuation amount of the transmittance of the projection optical system PL with respect to the exposure light beam EL as disclosed in Japanese Patent Application Laid-open No. 2001-267239, and an irradiation amount measuring device (illuminance measuring device) as disclosed, for example, in Japanese Patent Application Laid-open No. 11-16816 (corresponding to United States Patent Publication No. 2002/0061469). The disclosures of U.S. Pat. No. 4,465,368, United States Patent Publication No. 2002/0061469, United States Patent Publication No. 2002/0041377, and U.S. Pat. No. 4,629,313, which disclose the measuring device as described above, are incorporated herein by reference within a range of permission of the domestic laws and ordinances of the designated or selected state.

Figure 7:
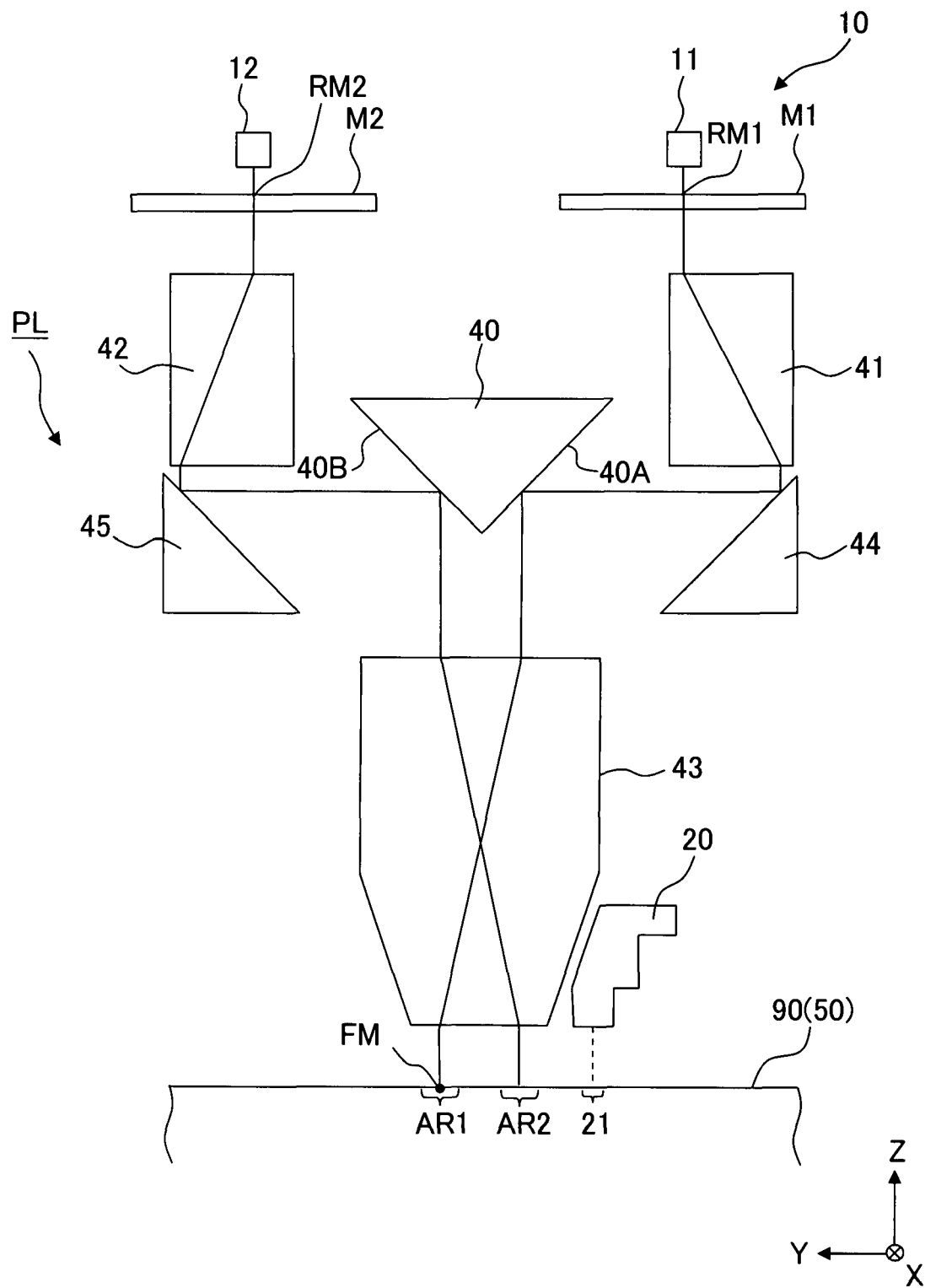
FIG. 7 schematically shows a relationship among a projection optical system, a first detecting system, a second detecting system, and respective marks.
Figure 8:
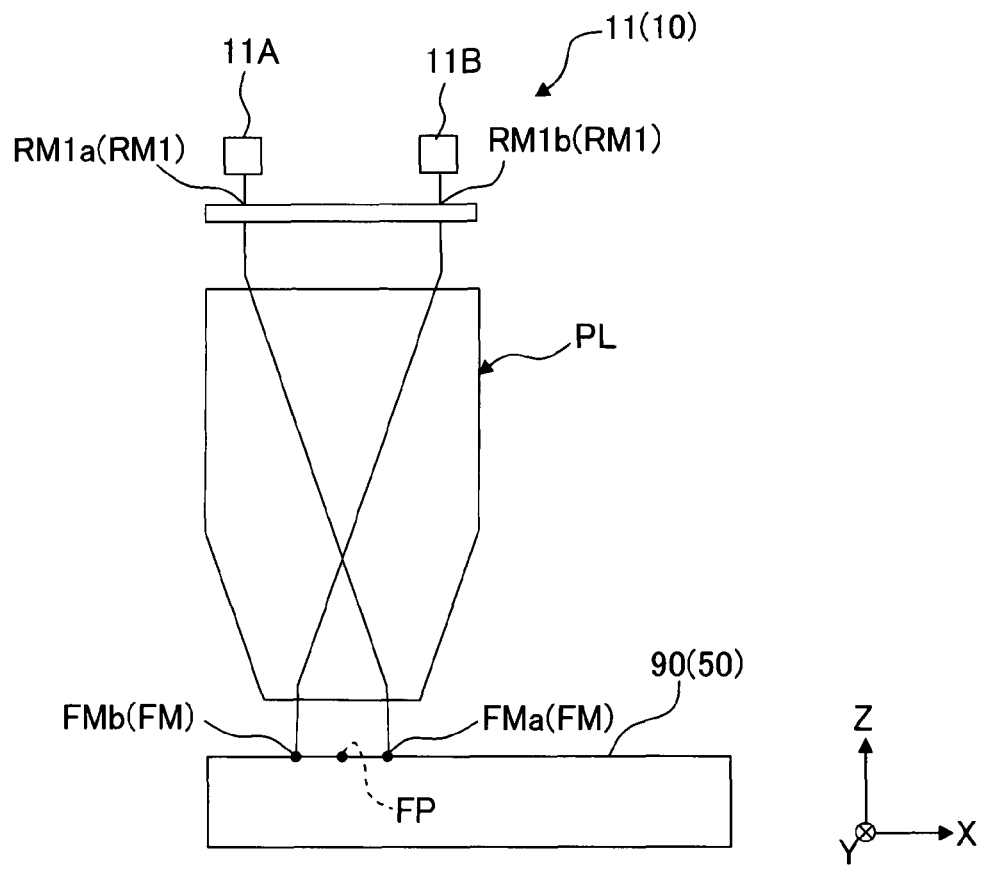
FIG. 8 schematically shows a view as viewed in the -Y direction in FIG. 7.
Figure 9:
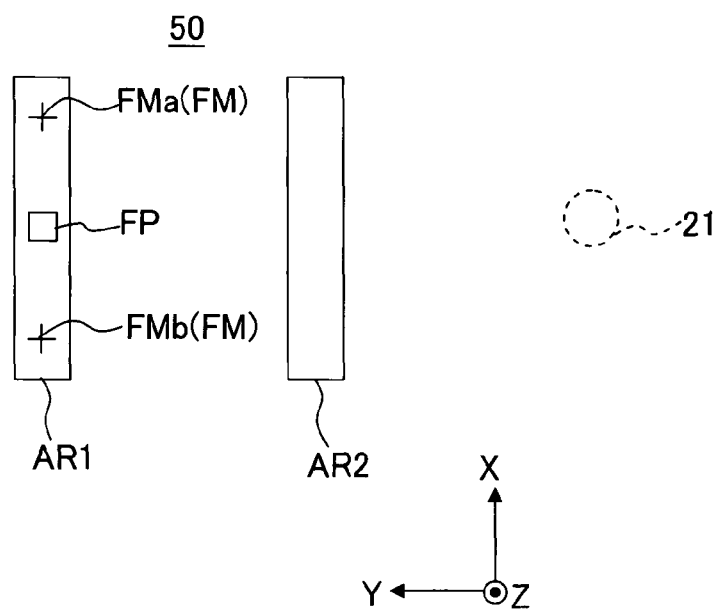
FIG. 9 schematically shows the positional relationship among the first exposure area, the second exposure area, the detection area, and the reference mark according to the first embodiment.

Next, the operation of the first detecting system 10 will be explained with reference to FIGS. 7 to 9. FIG. 7 schematically shows a state in which the first sub-detecting system 11 of the first detecting system 10 detects the first positional relationship between the first pattern PA1 and the first reference mark FM. FIG. 8 schematically shows a view as viewed from the −Y side of FIG. 7. FIG. 9 schematically shows the positional relationship among the first exposure area AR1, the second exposure area AR2, the detection area 21 of the second detecting system 20, and the reference marks FM, FP when the first sub-detecting system 11 of the first detecting system 10 detects the first positional relationship. In FIG. 7, the first, second, and third optical systems 41, 42, 43 of the projection optical system PL are schematically shown. In FIG. 8, the entire projection optical system PL is schematically shown. In this embodiment, the first exposure area AR1, the second exposure area AR2, the detection area 21 are arranged in the Y axis direction. The detection area 21 is arranged on the side opposite to the first exposure area AR1 in relation to the second exposure area AR2.

The reference marks FM, FP, which are provided on the measuring stage 90, can be arranged on the image plane side (light-exit side) of the projection optical system PL. In this embodiment, the first reference mark FM can be arranged in at least one of the first exposure area AR1 and the second exposure area AR2.

As described above, the positions of the first exposure area AR1 and the second exposure area AR2 are determined depending on, for example, the positions of the first and second illumination areas IA1, IA2 defined by the first and second optical mechanisms BL1, BL2 of the illumination system IL and the arrangement of the respective optical elements for constructing the projection optical system PL including, for example, the intermediate optical member 40. The positions of the first exposure area AR1 and the second exposure area AR2 in the XY coordinate system defined by the measuring system 70 are known. The positions of the first and second exposure areas AR1, AR2 may be previously measured by using, for example, the unevenness measuring device as described above. For example, the first exposure light beam EL1 and the second exposure light beam EL2 are irradiated onto the first and second exposure areas AR1, AR2 respectively, and the measuring stage 90 is moved while detecting the measuring stage 90 by the measuring system 70 so that the unevenness measuring device traverses the edge extending in the X axis direction and/or the edge extending in the Y axis direction of the first and second exposure areas AR1, AR2. The edge positions of the first and second exposure areas AR1, AR2 can be determined in the XY coordinate system defined by the measuring system 70 by allowing the intensity change of the light received by the unevenness measuring device to correspond to the position of the measuring stage 90 measured by the measuring system 70. At least one of the positions of the first and second exposure areas AR1, AR2 may be adjusted by adjusting the first and second optical mechanisms BL1, BL2 of the illumination system IL and/or the projection optical system PL based on the measurement result. The respective positions of the first and second exposure areas AR1, AR2 in the XY coordinate system defined by the measuring system 70 and the positional relationship (for example, the distance in the Y axis direction) between the first and second exposure areas AR1, AR2 are stored in a storage device of the controller 30. Therefore, the controller 30 is capable of arranging the first reference mark FM on the measuring stage 90 in any one of the first exposure area AR1 and the second exposure area AR2 by driving the measuring stage-driving device 70D while detecting the position of the measuring stage 90 by means of the measuring system 70 (laser interferometer 77).

In this embodiment, the first reference mark FM is successively arranged in the first and second exposure areas AR1, AR2. When the first positional relationship between the first pattern PA1 and the first reference mark FM is detected by using the first sub-detecting system 11 of the first detecting system 10, the controller 30 arranges the first reference mark FM in the first exposure area AR1 by moving the measuring stage 90 while detecting the position of the measuring stage 90. The controller 30 simultaneously observes the first alignment mark RM1 provided on the first mask M1 and the first reference mark FM provided on the reference plate 50 arranged on the image plane side of the projection optical system PL by using the first sub-detecting system 11. As shown in FIG. 8, the first sub-detecting system 11 has the pair of mark detecting systems 11A, 11B which are provided while being away from each other by the predetermined distance in the X axis direction. It is possible to detect the pair of marks RM1a, RM1b of the first alignment mark RM1 and the pair of marks FMa, FMb of the first reference mark FM. The first positional relationship between the first pattern PA1 and the first reference mark FM is detected by simultaneously observing, via the projection optical system PL (first optical system 41, third optical system 43), the first reference mark FM (FMa, FMb) and the first alignment mark RM1a, RM1b provided in the predetermined positional relationship with respect to the first pattern PA1 by using the first sub-detecting system 11 of the first detecting system 10. That is, the positional deviation between the mark RM1a and the mark FMa in the X axis direction and the Y axis direction is detected by using the first sub-detecting system 11 (11A), and the positional deviation between the mark RM1b and the mark FMb in the X axis direction and the Y axis direction is detected by using the first sub-detecting system 11 (11B). In this arrangement, the positions in the XY coordinate system defined by the measuring system 70 are obtained for the marks FMa, FMb on the measuring stage 90. Therefore, when the extent of separation of the mark RM1a in any direction from the marks FMa, FMb is known, the positions of the marks RM1a, RM1b in the XY coordinate system defined by the measuring system 70 are consequently obtained as well. Further, the positional relationship between the pattern PA1 and the marks RM1a, RM1b on the first mask M1 is known. Therefore, it is possible to detect the first positional relationship including the positional relationship in the X axis direction, the Y axis direction, and the θZ direction between the first pattern PA1 and the reference mark FM base on the known information and the detection result.

Similarly, when the second positional relationship between the second pattern PA2 and the first reference mark FM is detected by using the second sub-detecting system 12 of the first detecting system 10, the controller 30 arranges the first reference mark FM in the second exposure area AR2 by moving the measuring stage 90 based on the positional relationship between the first exposure area AR1 and the second exposure area AR2. The controller 30 simultaneously observes the second alignment mark RM2 provided on the second mask M2 and the first reference mark FM provided on the reference plate 50 arranged on the image plane side of the projection optical system PL by using the second sub-detecting system 12. The second sub-detecting system 12 also has the mark detecting systems 12A, 12B which are provided while being away from each other by the predetermined distance in the X axis direction. It is possible to detect the pair of marks RM2a, RM2b of the second alignment mark RM2 and the pair of marks FMa, FMb of the reference mark FM respectively. The second sub-detecting system 12 of the first detecting system 10 detects the second positional relationship between the second pattern PA2 and the first reference mark FM by simultaneously observing, via the projection optical system PL (second and third optical systems 42, 43), the first reference mark FM (FMa, FMb) and the second alignment mark RM2 (RM2a, RM2b) provided in the predetermined positional relationship with respect to the second pattern PA2. That is, the positional deviation between the mark RM2a and the mark FMa in the X axis direction and the Y axis direction is detected by using the second sub-detecting system 12 (12A), and the positional deviation between the mark RM2b and the mark FMb in the X axis direction and the Y axis direction is detected by using the second sub-detecting system 12 (12B). It is possible to detect the second positional relationship including the positional relationship in the X axis direction, the Y axis direction, and the θZ direction between the second pattern PA2 and the reference mark FM based on the obtained result.

As described above, in this embodiment, it is important that the image of the first pattern PA1 and the image of the second pattern PA2 are projected at the desired timings onto the first exposure area AR1 and the second exposure area AR2 respectively in order that the image of the first pattern PA1 and the image of the second pattern PA2 are formed in the shot area S on the substrate P while they are positionally adjusted correctly. Therefore, in this embodiment, the positional relationship between the first pattern PA1 of the first mask M1 and the second pattern PA2 of the second mask M2 is adjusted by moving at least one of the first substage 62 and the second substage 63 with respect to the main stage 61 of the mask stage 60 based on the detection result of the first detecting system 10 as described later on.

Figure 10:
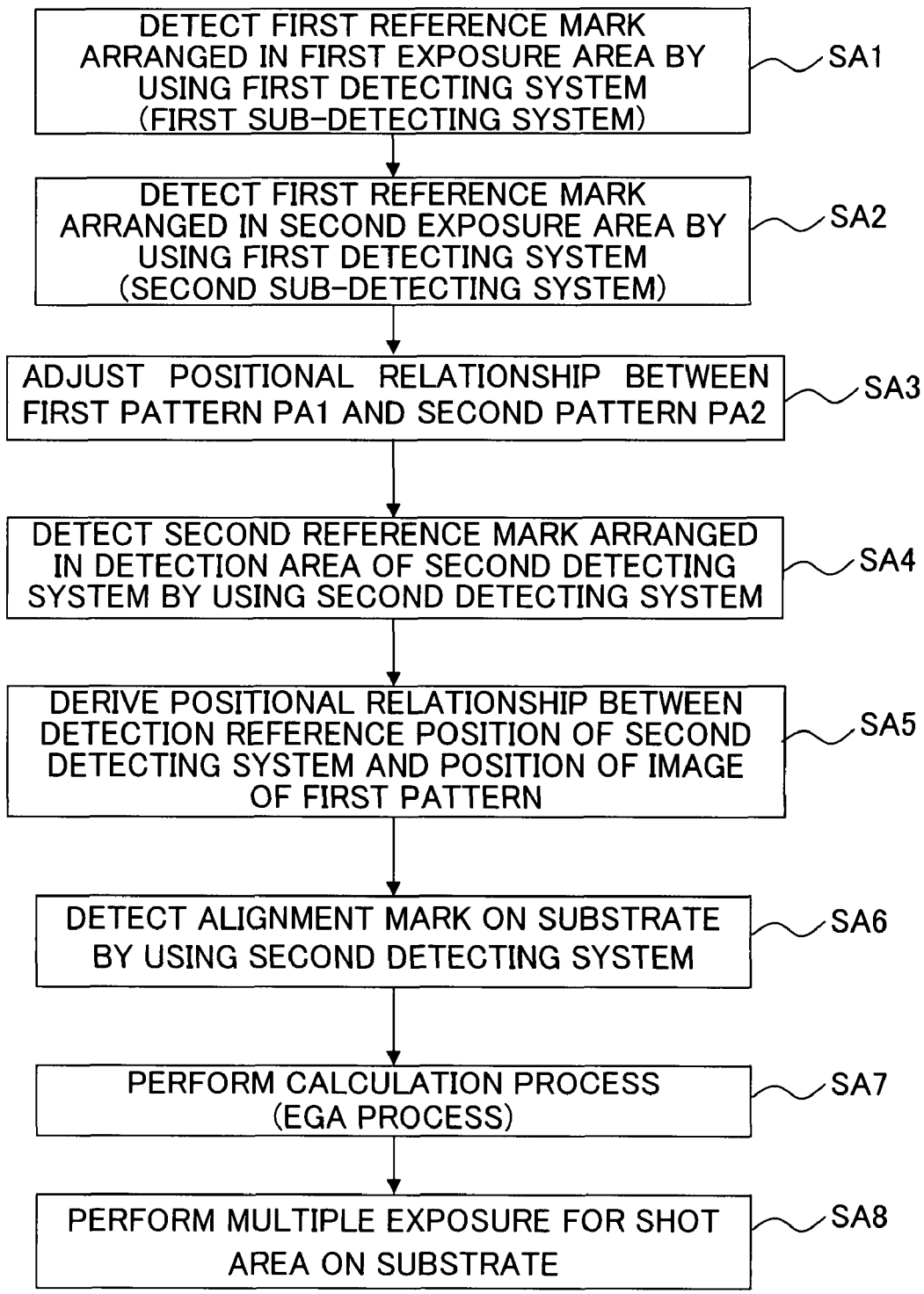
FIG. 10 shows a flow chart illustrating an exposure method according to the first embodiment.

Next, an explanation will be made with reference to FIGS. 10 to 12 about the method for exposing the substrate P by using the exposure apparatus EX constructed as described above. FIG. 10 shows a flow chart illustrating the exposure method according to this embodiment. FIG. 11 shows side views schematically illustrating the operation of the exposure apparatus EX. FIG. 12 shows plan views schematically illustrating the positional relationship among the first exposure area AR1, the second exposure area AR2, the detection area 21 of the second detecting system 20, and the reference marks FM, FP.

Figure 11A:
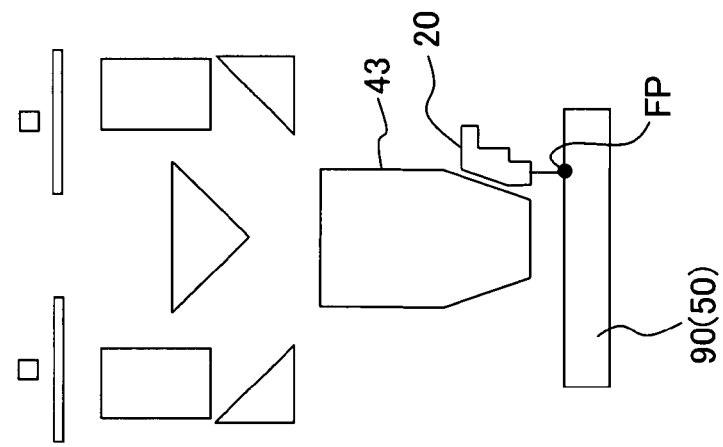
FIGS. 11A to 11C schematically illustrate the operation of the exposure apparatus according to the first embodiment.
Figure 12A:
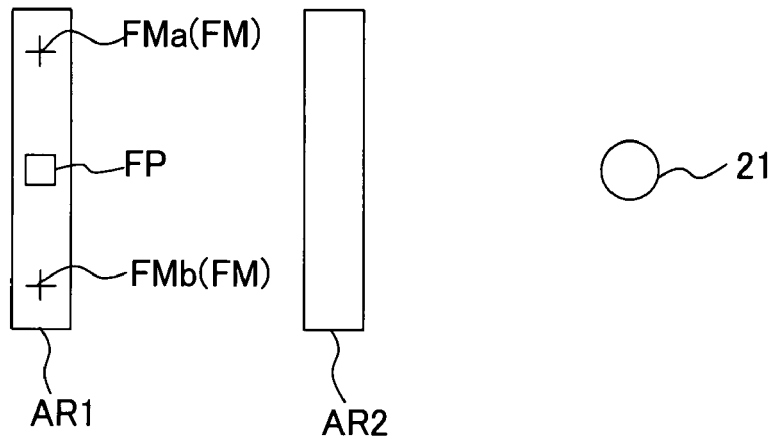
FIGS. 12A to 12C schematically show the positional relationship among the first exposure area, the second exposure area, the detection area, and the reference mark according to the first embodiment.

As shown in FIGS. 11A and 12A, the controller 30 moves the measuring stage 90 in the XY directions so that the first reference mark FM on the measuring stage 90 is arranged in the first exposure area AR1 including the detection area of the first sub-detecting system 11 of the first detecting system 10. The controller 30 detects the first reference mark FM on the measuring stage 90 via the projection optical system PL by using the first sub-detecting system 11 of the first detecting system 10 while measuring the position information about the measuring stage 90 by using the measuring system 70 (Step SA1). Specifically, the controller 30 detects the first reference mark FM on the fiducial plate 50 and the first alignment mark RM1 on the first mask M1 corresponding thereto to detect the positional relationship between the first reference mark FM and the first alignment mark RM1. The first pattern PA1 on the first mask M1 and the first alignment mark RM1 are formed in the predetermined positional relationship. Therefore, the controller 30 can obtain the first positional relationship between the first pattern PA1 and the first reference mark FM based on the detection result of the first sub-detecting system 11 of the first detecting system 10. Further, the controller 30 can obtain the positional relationship between the position of the first reference mark FM and the projection position of the image of the first pattern PA1 in the XY coordinate system defined by the measuring system 70. That is, the controller 30 can obtain the position information about the image of the first pattern PA1 formed in the first exposure area AR1 based on the detection result of the first sub-detecting system 11 of the first detecting system 10.

Figure 11B:
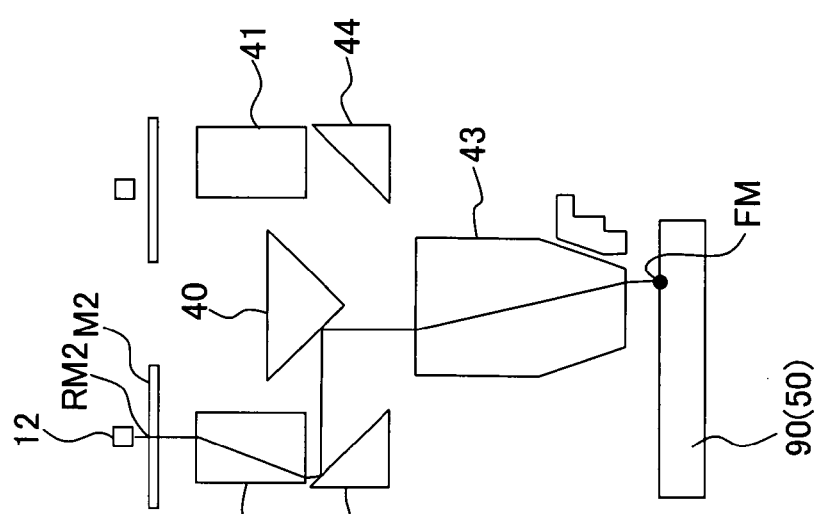
Figure 12B:
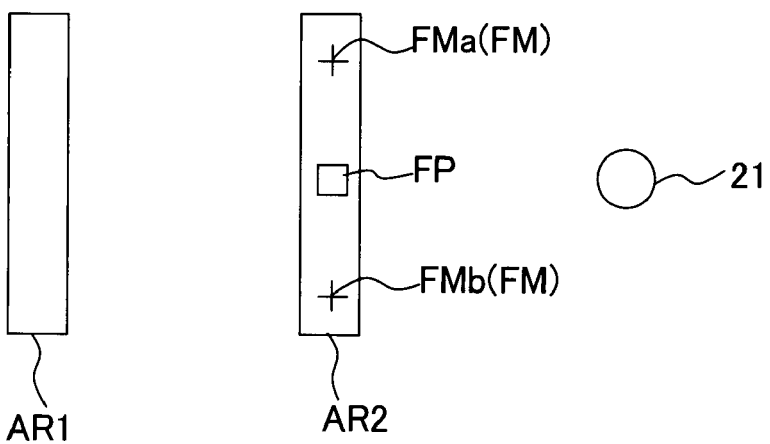

Subsequently, as shown in FIGS. 11B and 12B, the controller 30 moves the measuring stage 90 in the Y axis direction by a predetermined distance (for example, by a distance in the Y axis direction of the first exposure area AR1 and the second exposure area AR2) to arrange the first reference mark FM on the measuring stage 90 in the second exposure area AR2 including the detection area of the second sub-detecting system 12 of the first detecting system 10 while detecting the measuring stage 90 with the measuring system 70 based on the positional relationship (for example, the spacing distance in the Y axis direction) between the first exposure area AR1 and the second exposure area AR2. The controller 30 detects the first reference mark FM on the measuring stage 90 via the projection optical system PL by using the second sub-detecting system 12 of the first detecting system 10 while measuring the position information about the measuring stage 90 by using the measuring system 70 (Step SA2). Specifically, the controller 30 detects the first reference mark FM on the fiducial plate 50 and the second alignment mark RM2 on the second mask M2 corresponding thereto to detect the positional relationship between the first reference mark FM and the second alignment mark RM2. The second pattern PA2 on the second mask M2 and the second alignment mark RM2 are formed in the predetermined positional relationship. Therefore, the controller 30 can obtain the second positional relationship between the second pattern PA2 and the first reference mark FM based on the detection result of the second sub-detecting system 12 of the first detecting system 10. Further, the controller 30 can obtain the positional relationship between the position of the first reference mark FM and the projection position of the image of the second pattern PA2 in the XY coordinate system defined by the measuring system 70. That is, the controller 30 can obtain the position information about the image of the second pattern PA2 formed in the second exposure area AR2 based on the detection result of the second sub-detecting system 12 of the first detecting system 10.

As described above, in this embodiment, the first reference mark FM is arranged in the first exposure area AR1 to detect the first positional relationship between the first pattern PA1 and the first reference mark FM by using the first detecting system 10, and then the first reference mark FM is arranged in the second exposure area AR2 to detect the second positional relationship between the second pattern PA2 and the first reference mark FM by using the first detecting system 10. The detection of the first positional relationship and the detection of the second positional relationship are performed unsimultaneously.

Subsequently, the controller 30 moves at least one of the first substage 62 and the second substage 63 to adjust the positional relationship between the first pattern PA1 of the first mask M1 and the second pattern PA2 of the second mask M2 based on the positional relationship between the first reference mark FM and the projection position of the image of the first pattern PA1 obtained in Step SA1 and the positional relationship between the first reference mark FM and the projection position of the image of the second pattern PA2 obtained in Step SA2 so that the image of the first pattern PA1 and the image of the second pattern PA2 are projected at the desired positions respectively onto each of the shot areas on the substrate P (Step SA3). In this embodiment, the measuring stage 90 is moved by the predetermined distance to obtain the projection position information about the image of the second pattern PA2 by using the first reference mark FM while detecting the position of the measuring stage 90 by means of the measuring system 70 based on the positional relationship between the first exposure area AR1 and the second exposure area AR2 after obtaining the projection position information about the image of the first pattern PA1 by using the first reference mark FM (after Step SA1). Therefore, the controller 30 can obtain the positional relationship between the projection position of the image of the first pattern PA1 and the projection position of the image of the second pattern PA2 in the XY coordinate system defined by the measuring system 70 based on the projection position information about the image of the first pattern PA1 obtained in Step SA1, the projection position information about the image of the second pattern PA2 obtained in Step SA2, and the measurement result of the measuring system 70 (movement information about the measuring stage 90) when the first reference mark FM is moved from the first exposure area AR1 to the second exposure area AR2. The controller 30 adjusts the positional relationship between the first pattern PA1 and the second pattern PA2 so that the image of the first pattern PA1 and the image of the second pattern PA2 are projected onto (formed on) the desired positions in the XY coordinate system defined by the measuring system 70 respectively (i.e., so that the image of the first pattern PA1 and the image of the second pattern PA2 are projected at the desired timings respectively). More specifically, at least one of the first substage 62 and the second substage 63 (i.e., at least one of the first pattern PA1 and the second pattern PA2) is moved in at least one of the directions of the X axis direction, the Y axis direction, and the θZ direction while detecting the positions of the first substage 62 and the second substage 63 by using the measuring system 70 based on the projection position information about the image of the first pattern PA1 obtained in Step SA1, the projection position information about the image of the second pattern PA2 obtained in Step SA2, and the measurement result of the measuring system 70 when the first reference mark FM is moved from the first exposure area AR1 to the second exposure area AR2. In this procedure, both of the first pattern PA1 and the second pattern PA2 may be moved. However, only any one of them may be moved. In this embodiment, the positional relationship between the first pattern PA1 and the second pattern PA2 is adjusted after Step SA1 and Step SA2. However, the positional relationship between the first pattern PA1 and the second pattern PA2 may be adjusted by adjusting the position of the first pattern PA1 based on the projection position information about the image of the first pattern PA1 obtained in Step SA1 after Step SA1 and adjusting the position of the second pattern PA2 based on the projection position information about the image of the second pattern PA2 obtained in Step SA2 after Step SA2. In this procedure, the positional adjustment of the second pattern PA2 is performed in consideration of the positional adjustment of the first pattern PA1 having been performed before Step SA2. In this embodiment, the positional relationship between the first pattern PA1 and the second pattern PA2 is adjusted after Step SA1 and Step SA2. However, the adjustment of the positional relationship between the first pattern PA1 and the second pattern PA2 may be executed concurrently with at least a part of Step SA4 as described later on.

FIG. 13 schematically shows the positional relationship between the first pattern PA1 of the first mask M1 and the second pattern PA2 of the second mask M2 and the relationship between the partial image of the first pattern PA1 projected onto the shot area S on the substrate P and the partial image of the second pattern PA2.

For example, as schematically shown in FIG. 13A, a situation is considered, in which the first pattern PA1 of the first mask M1 and the second pattern PA2 of the second mask M2 are not in the desired positional relationship before starting the scanning exposure. When the images of the first and second patterns PA1, PA2 are projected onto the shot area S on the substrate P while moving the substrate P in the Y axis direction in synchronization with the movement of the first and second masks M1, M2 in the Y axis direction while maintaining the state in which the first pattern PA1 of the first mask M1 and the second pattern PA2 of the second mask M2 are not in the desired positional relationship, the image of the first pattern PA1 and the image of the second pattern PA2 are not formed in the desired positional relationship in the shot area S on the substrate P. In this embodiment, as schematically shown in FIG. 13B, the first pattern PA1 of the first mask M1 and the second pattern PA2 of the second mask M2 are adjusted to be in the desired positional relationship before starting the scanning exposure, and then the images of the first and second patterns PA1, PA2 are projected onto the shot area S on the substrate P while moving the substrate P in the Y axis direction in synchronization with the movement of the first and second masks M1, M2 in the Y axis direction in a state in which the desired positional relationship is maintained. Accordingly, the image of the first pattern PA1 and the image of the second pattern PA2 can be formed in the desired positional relationship in the shot area S on the substrate P.

Figure 11C:
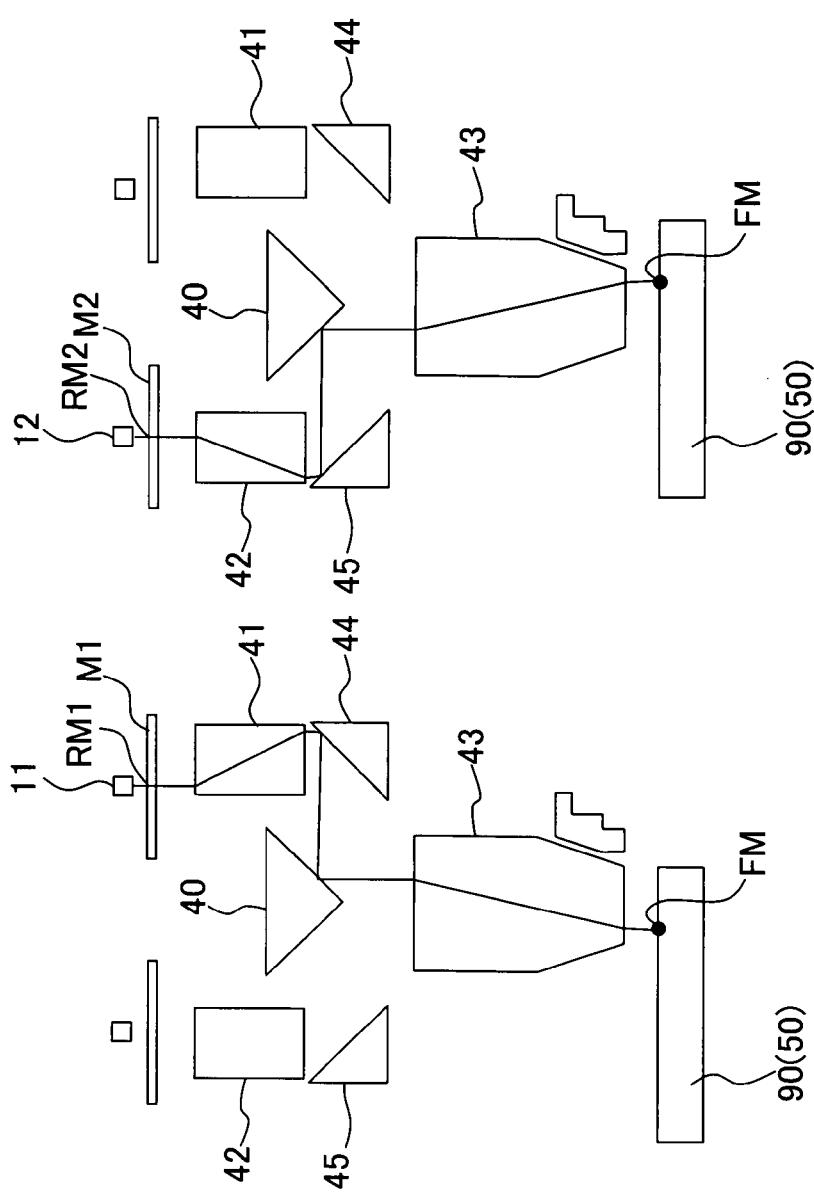
Figure 12C:
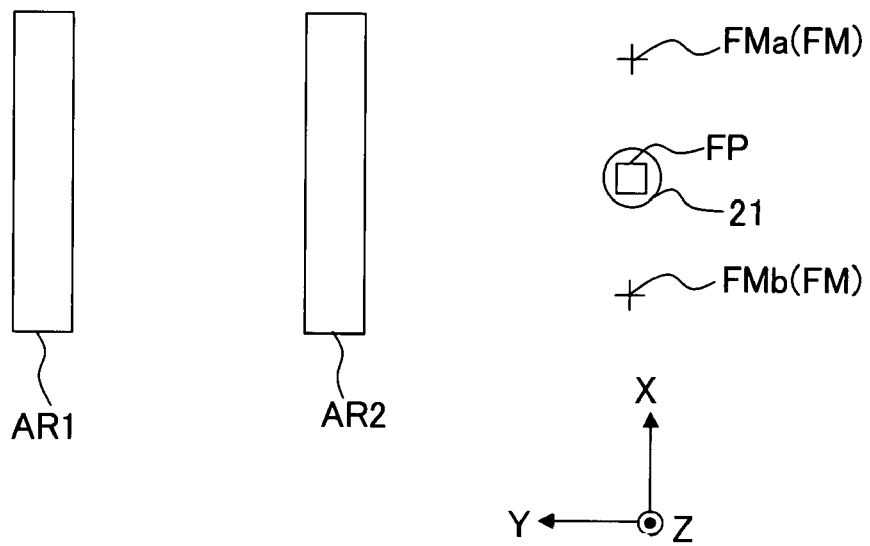

Subsequently, as shown in FIGS. 11C and 12C, the controller 30 moves the measuring stage 90 in the XY directions to arrange the second reference mark FP on the measuring stage 90 in the detection area 21 of the second detecting system 20. In this embodiment, the detection area 21 of the second detecting system 20 is arranged on the −Y side of the second exposure area AR2. Therefore, the second reference mark FP can be arranged in the detection area 21 of the second detecting system 20 immediately after Step SA2. The controller 30 detects the second reference mark FP on the measuring stage 90 by using the second detecting system 20 while measuring the position information about the measuring stage 90 by using the measuring system 70 (Step SA4). Accordingly, the controller 30 can obtain the positional relationship between the second reference mark FP and the detection reference position of the second detecting system 20 in the XY coordinate system defined by the measuring system 70.

Subsequently, the controller 30 derives the positional relationship between the detection reference position of the second detecting system 20 and the projection position of the image of the first pattern PA1 (Step SA5). The first reference mark FM on the fiducial plate 50 and the second reference mark FP are formed in the predetermined positional relationship. The positional relationship between the first reference mark FM and the second reference mark FP is known. The controller 30 can derive the positional relationship between the projection position of the image of the first pattern PA1 of the first mask M1 and the detection reference position of the second detecting system 20 in the XY coordinate system defined by the measuring system 70 based on the positional relationship between the first reference mark FM and the projection position of the image of the first pattern PA1 determined in Step SA1, the positional relationship between the second reference mark FP and the detection reference position of the second detecting system 20 determined in Step SA4, and the known positional relationship between the first reference mark FM and the second reference mark FP. That is, the controller 30 can determine the baseline amount of the second detecting system 20 based on the projection position of the image of the first pattern PA1 determined in Step SA1, the detection reference position of the second detecting system 26 determined in Step SA4, and the positional relationship between the first reference mark FM and the second reference mark FP. In this embodiment, the projection position of the image of the first pattern PA1 obtained in Step SA1 is used. However, the baseline amount may be determined by using the projection position of the image of the second pattern PA2 obtained in Step SA2 in place thereof or in combination thereof.

The detection of the first reference mark FM may be performed by using the first detecting system 10 after detecting the second reference mark FP by using the second detecting system 20.

Subsequently, the controller 30 starts the alignment process for the substrate P disposed on the substrate stage 80. The controller 30 retracts the measuring stage 90 to the position at which the substrate stage 80 is not inhibited. Further, the substrate stage 80 is moved in the XY directions so that at least parts of the plurality of alignment marks AM, which are provided corresponding to the respective shot areas S1 to S21 on the substrate P, are successively arranged in the detection area 21 of the second detecting system 20. The controller 30 successively detects the plurality of alignment marks AM on the substrate P by using the second detecting system 20 while measuring the position information about the substrate stage 80 by using the measuring system 70 (Step SA6). Accordingly, the controller 30 can obtain the positional relationship between the alignment mark AM and the detection reference position of the second detecting system 20 in the XY coordinate system defined by the measuring system 70.

Subsequently, the controller 30 obtains the position information about the plurality of shot areas S1 to S21 on the substrate P respectively with respect to the detection reference position of the second detecting system 20 based on the position information about the respective alignment marks AM on the substrate P obtained in Step SA6 by means of the calculation process (Step SA7). When the position information is obtained about the plurality of shot areas S1 to S21 on the substrate P respectively by means of the calculation process, it is possible to obtain by using the so-called EGA (Enhanced Global Alignment) as disclosed, for example, in Japanese Patent Application Laid-open No. 61-44429 (corresponding to U.S. Pat. No. 4,780,617). Accordingly, the controller 30 can determine the respective position coordinates (arrangement coordinates) of the plurality of shot areas S1 to S21 provided on the substrate P in the XY coordinate system defined by measuring system 70 by detecting the alignment mark AM on the substrate P by using the second detecting system 20. That is, the controller 30 can know the locating positions of the respective shot areas S1 to S21 on the substrate P with respect to the detection reference position of the second detecting system 20 in the XY coordinate system defined by the measuring system 70.

The controller 30 derives the positional relationship between the positions of the shot areas S1 to S21 on the substrate P and the projection position of the first pattern PA1 of the first mask M1 in the XY coordinate system based on the positional relationship between the shot areas S1 to S21 on the substrate P and the detection reference position of the second detecting system 20 in the XY coordinate system obtained in Step SA7 (arrangement information about the shot areas with respect to the detection reference position) and the positional relationship between the projection position of the image of the first pattern PA1 of the first mask M1 and the detection reference position of the second detecting system 20 in the XY coordinate system obtained in Step SA5 (baseline amount described above). That is, the controller 30 determines the position (coordinate value) in the XY coordinate system at which the image of the first pattern PA1 is correctly exposed for each of the shot areas on the substrate P. In this embodiment, the positional relationship between the first pattern PA1 and the second pattern PA2 has been already adjusted in Step SA3. Therefore, when the substrate P is moved based on the determined position, the image of the first pattern PA1 and the image of the second pattern PA2 can be formed in the desired positional relationship in each of the shot areas on the substrate P.

Subsequently, the controller 30 starts the exposure for the shot area S on the substrate P (Step SA8). That is, the controller 30 illuminates the first pattern PA1 of the first mask M1 and the second pattern PA2 of the second mask M2 with the first exposure light beam EL1 and the second exposure light beam EL2 respectively while moving the first mask M1 and the second mask M2 in the Y axis direction by using the mask stage 60 while detecting the position information about the mask stage 60 by using the laser interferometer 74 of the measuring system 70. The controller 30 irradiates the first exposure light beam EL1 and the second exposure light beam EL2 onto the first exposure area AR1 and the second exposure area AR2 respectively while moving the substrate P in the Y axis direction by using the substrate stage 80 while detecting the position information about the substrate stage 80 by using the laser interferometer 75 of the measuring system 70 in synchronization with the movement of the first mask M1 and the second mask M2 in the Y axis direction effected by the mask stage 60. As described above, in this embodiment, the controller 30 illuminates the first pattern PA1 and the second pattern PA2 with the first exposure light beam EL1 and the second exposure light beam EL2 respectively while moving the first mask M1 and the second mask M2 in the identical scanning direction (for example, in the +Y direction) by using the mask stage 60 when the shot area S on the substrate P is subjected to the exposure. The controller 30 moves the shot area S on the substrate P in the scanning direction (for example, in the −Y direction) opposite to the direction of the first and second masks M1, M2 by using the substrate stage 80 in synchronization with the movement of the mask stage 60 in the scanning direction when the shot area S on the substrate P is subjected to the exposure. Accordingly, the shot area S on the substrate P is subjected to the multiple exposure (double exposure) with the image of the first pattern PA1 and the image of the second pattern PA2. The plurality of shot areas S are provided on the substrate P. The controller 30 successively exposes the plurality of shot areas S1 to S21 on the substrate P with the image of the first pattern PA1 and the image of the second pattern PA2 in the step-and-scan manner (Step SA8). The controller 30 successively performs the multiple exposure for the plurality of shot areas S1 to S21 on the substrate P by repeating the scanning operation of the substrate P in the −Y direction and the scanning operation in the +Y direction.

In this embodiment, the positional relationship between the first pattern and the second pattern is adjusted based on the detection result of the first detecting system 10. Further, the main stage 61 and the substrate stage 80 are synchronously moved while adjusting the position of the substrate P with respect to the first pattern PA1 and the second pattern PA2 based on the positional relationship between the first pattern PA1 and the detection reference position of the second detecting system 20 determined in Step SA5 and the arrangement information about the shot area on the substrate P with respect to the detection reference position of the second detecting system 20 determined in Step SA7. Accordingly, the image of the first pattern PA1 and the image of the second pattern PA2 are projected onto (formed on) the shot area S on the substrate P at the desired positions respectively.

As explained above, the shot area S on the substrate P can be subjected to the multiple exposure efficiently by irradiating the first exposure light beam EL1 and the second exposure light beam EL2 onto the first exposure area AR1 and the second exposure area AR2 respectively and moving the substrate P in the Y axis direction so that the shot area S on the substrate P passes across the first exposure area AR1 and the second exposure area AR2. In this embodiment, when the plurality of shot areas S on the substrate P are subjected to the multiple exposure (double exposure), one shot area S can be subjected to the multiple exposure with the image of the first pattern PA1 and the image of the second pattern PA2 by means of one time of the scanning operation. It is possible to improve the throughput. The plurality of shot areas S on the substrate P can be efficiently subjected to the multiple exposure by repeating the scanning operation in the −Y direction and the scanning operation in the +Y direction for the substrate P. The image of the first pattern PA1 and the image of the second pattern PA2 can be formed in the desired positional relationship in each of the shot areas S, because one shot area S can be subjected to the multiple exposure by means of one time of the scanning operation.

The position information about the image of the first pattern PA1 formed in the first exposure area AR1 and the position information about the image of the second pattern PA2 formed in the second exposure area AR2 are detected by using the first detecting system 10 to adjust the positional relationship among the image of the first pattern PA1, the image of the second pattern PA2, and the shot area S on the substrate P based on the detection result. Therefore, the first pattern PA1 and the second pattern PA2 can be satisfactorily subjected to the positional adjustment on the substrate P. The multiple exposure can be performed while forming the image of the first pattern PA1 and the image of the second pattern PA2 in the desired positional relationship in each of the shot areas S.

In this embodiment, the first exposure light beam EL1 irradiated onto the first exposure area AR1 and the second exposure light beam EL2 irradiated onto the second exposure area AR2 are irradiated onto the substrate P via one terminal end optical element FL. Therefore, it is possible to simplify the structure or the arrangement of the projection optical system PL. The first exposure area AR1 and the second exposure area AR2 are defined at the different positions. Therefore, the first exposure light beam EL1 from the first mask M1 and the second exposure light beam EL2 from the second mask M2 can be guided to the third optical system 43 by arranging the reflecting surfaces 40A, 40B in the vicinity of the positions optically conjugate with the first and second exposure areas AR1, AR2. The first exposure light beam EL1 and the second exposure light beam EL2 can be irradiated onto the first and second exposure areas AR1, AR2 respectively.

In this embodiment, the positional adjustment is performed for the image of the first pattern PA1 and the image of the second pattern PA2 by adjusting the positional relationship between the first pattern PA1 of the first mask M1 and the second pattern PA2 of the second mask M2 before the scanning exposure for each of the shot areas S of the substrate P. However, the positional relationship between the first pattern PA1 of the first mask M1 and the second pattern PA2 of the second mask M2 may be adjusted by moving at least one of the first substage 62 and the second substage 63 with respect to the main stage 61 of the mask stage 60 during the scanning exposure so that the image of the first pattern PA1 and the image of the second pattern PA2 are projected at the desired positions respectively onto each of the shot areas S1 to S21 on the substrate P.

There is such a possibility that the relative position between the main stage 61 and the substrate stage 80 may be deviated from the target relative position when one shot area S on the substrate P is subjected to the multiple exposure. The deviation of the relative position between the main stage 61 and the substrate stage 80 can be detected based on the measurement results of the laser interferometers 74, 75. Therefore, when the deviation of the relative position between the main stage 61 and the substrate stage 80 is detected, the controller 30 moves at least one of the first substage 62 and the second substage 63 based on the measurement results of the laser interferometers 74, 75 to adjust the position of at least one of the first mask M1 and the second mask M2. Accordingly, the positional relationship among the first pattern PA1 of the first mask M1, the second pattern PA2 of the second mask M2, and the shot area S on the substrate P is always adjusted to be in the desired state. The image of the first pattern PA1 and the image of the second pattern PA2 can be formed in the desired positional relationship in the shot area S. Of course, the position of the substrate P may be adjusted together with or in place of at least one of those of the first mask M1 and the second mask M2.

In the embodiment described above, at least one of the positions of the image of the first pattern PA1 and the image of the second pattern PA2 is adjusted by adjusting at least one of the positions of the first mask M1 having the first pattern PA1 and the second mask M2 having the second pattern PA2. However, the projection positions of the images of the first and second patterns PA1, PA2 on the substrate P may be adjusted (subjected to the shift adjustment) by using the first and second imaging characteristic-adjusting devices LC1, LC2 described above in place of the positional adjustment or together with the positional adjustment.

Figure 14:
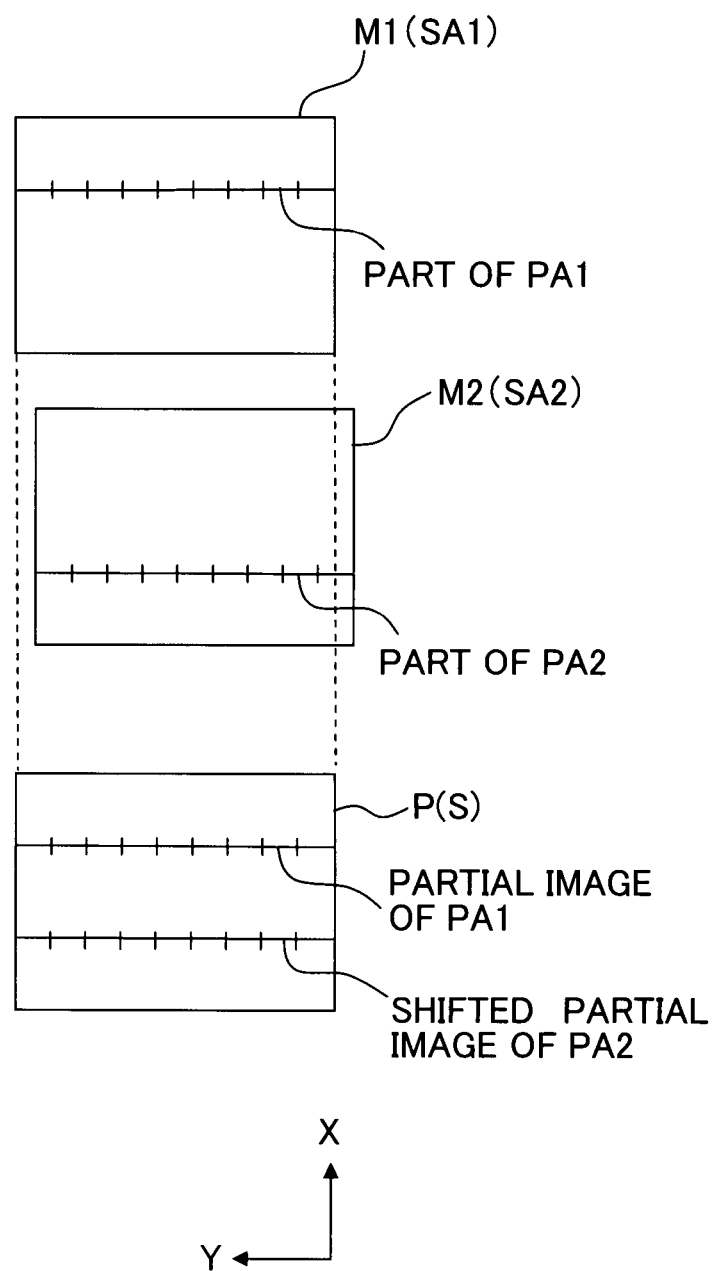
FIG. 14 schematically illustrates the positional relationship among the first and second patterns and the shot area.

For example, as schematically shown in FIG. 14, even when the first pattern PA1 of the first mask M1 and the second pattern PA2 of the second mask M2 are not in the desired positional relationship, the image of the first pattern PA1 and the image of the second pattern PA2 can be formed in the desired positional relationship in the shot area S on the substrate P, for example, by adjusting the projection position of the image of the second pattern PA2 by using the second imaging characteristic-adjusting device LC2, specifically by shifting, in the Y axis direction, the position of the second exposure area AR2 in which the image of the second pattern PA2 is formed.

In the foregoing description, at least one of the positions of the image of the first pattern PA1 and the image of the second pattern PA2 is adjusted based on the detection result of the first detecting system 10. However, at least one of the positions of the first exposure area AR1 and the second exposure area AR2 may be adjusted by moving, for example, at least one of the optical mechanisms BL1, BL2 of the illumination system IL in place of the positional adjustment or together with the positional adjustment.

Second Embodiment

Next, a second embodiment will be explained. In the first embodiment described above, the first detecting system 10 uses the identical first reference mark FM in order to obtain the position information about the image of the first pattern PA1 and the position information about the image of the second pattern PA2. However, the feature of the second embodiment resides in that the first detecting system 10 uses different first reference marks FM1, FM2 in order to obtain the position information about the first pattern PA1 and the position information about the second pattern PA2. In the following description, the constitutive components, which are the same as or equivalent to those of the embodiment described above, are designated by the same reference numerals, any explanation of which will be simplified or omitted.

Figure 15:
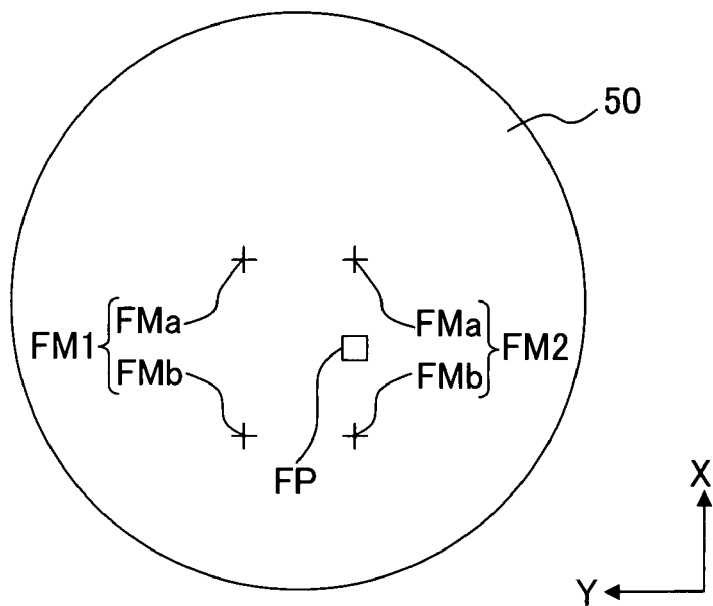
FIG. 15 shows a reference plate according to a second embodiment.
Figure 16:
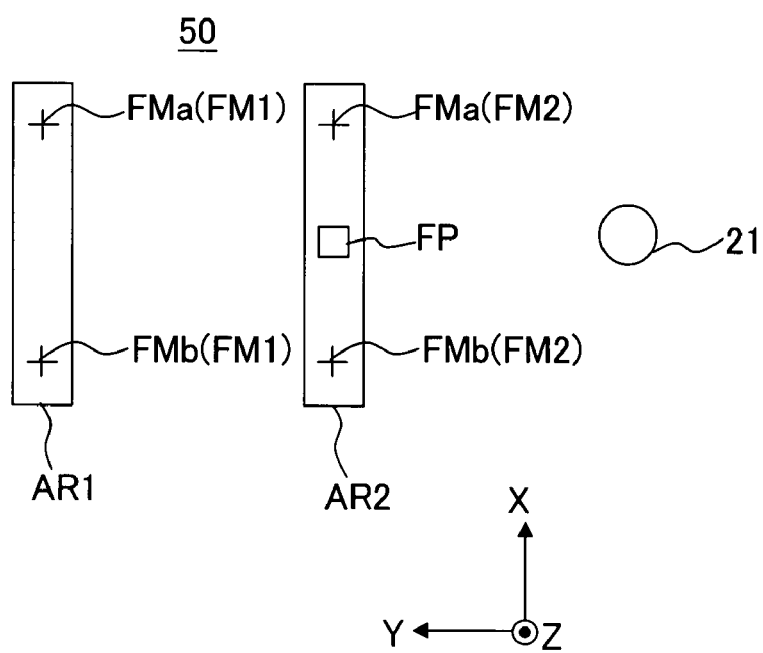
FIG. 16 schematically shows the positional relationship among the first exposure area, the second exposure area, the detection area, and the reference mark according to the second embodiment.

FIG. 15 shows a fiducial plate 50 according to the second embodiment. FIG. 16 schematically shows the positional relationship among the first exposure area AR1, the second exposure area AR2, the detection area 21 of the second detecting system 20, and the reference marks FM1, FM2, FP.

As shown in FIG. 15, the pairs of first reference marks FM1 (first reference sections), FM2 (second reference sections) to be detected by the first detecting system 10 described above and the second reference mark FP to be detected by the second detecting system 20 are formed in the predetermined positional relationship on the upper surface of the fiducial plate 50 of this embodiment. The first reference mark FM1 and the first reference mark FM2 can be arranged on the image plane side of the projection optical system PL, which are formed in the predetermined positional relationship. The first sub-detecting system 11 of the first detecting system 10 detects the first reference mark FM1, and the second sub-detecting system 12 detects the first reference mark FM2. The second detecting system 20 detects the second reference mark FP.

Each of the first reference marks FM1, FM2 includes a pair of marks FMa, FMb which are provided while being separated from each other by a predetermined distance in the X axis direction, in the same manner as in the first embodiment.

As shown in FIG. 16, also in this embodiment, the first exposure area AR1 and the second exposure area AR2 are separated from each other in the Y axis direction. The first reference mark FM1 has a size capable of being arranged in the first exposure area AR1. The first reference mark FM2 has a size capable of being arranged in the second exposure area AR2. When the first reference mark FM1 is arranged in the first exposure area AR1, the first reference mark FM2 is arranged in the second exposure area AR2. That is, the positional relationship between the first reference marks FM1, FM2 is determined so that the first reference mark FM1 and the first reference mark FM2 can be simultaneously arranged in the first exposure area AR1 and the second exposure area AR2. In this embodiment, the first reference mark FM1 is arranged on the +Y side with respect to the first reference mark FM2.

The controller 30 is capable of simultaneously arranging the first reference mark FM1 and the first reference mark FM2 on the measuring stage 90 in the first exposure area AR1 and the second exposure area AR2 while detecting the position of the measuring stage 90 by means of the measuring system 70 (laser interferometer 77).

In this embodiment, the second reference mark FP is arranged between the two marks FMa, FMb of the first reference mark FM2.

Next, an explanation will be made with reference to FIGS. 17 and 18 about the operation of the first detecting system 10 in the second embodiment. FIG. 17 shows side views schematically illustrating the operation of the exposure apparatus EX. FIG. 18 shows plan views schematically illustrating the positional relationship among the first exposure area AR1, the second exposure area AR2, the detection area 21 of the second detecting system 20, and the reference marks FM, FP.

Figure 17A:
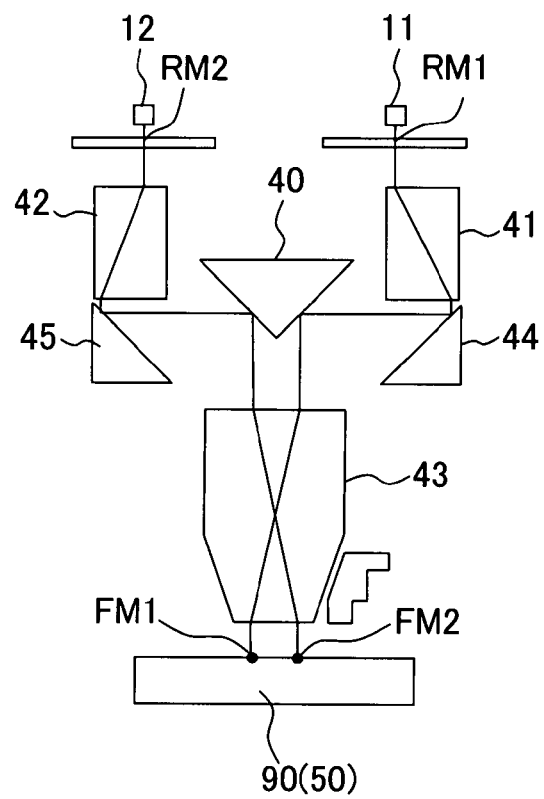
FIGS. 17A and 17B schematically illustrate the operation of an exposure apparatus according to the second embodiment.
Figure 18A:
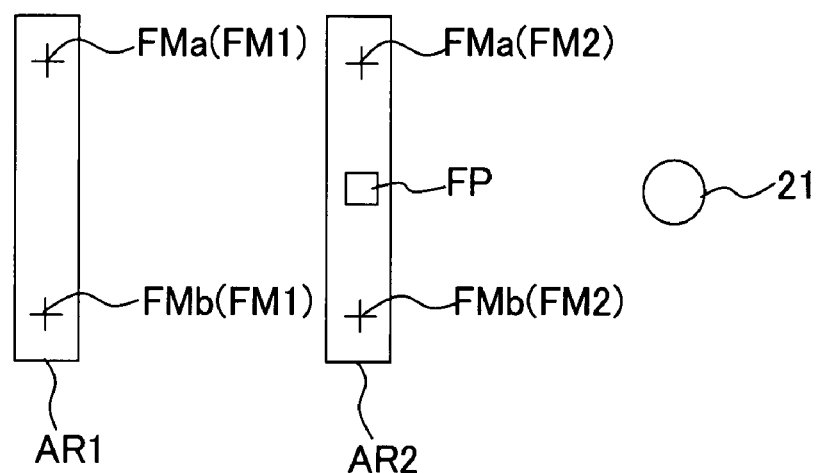
FIGS. 18A and 18B schematically show the positional relationship among the first exposure area, the second exposure area, the detection area, and the reference mark according to the second embodiment.

As shown in FIGS. 17A and 18A, the controller 30 moves the measuring stage 90 in the XY directions so that the first reference mark FM1 on the fiducial plate 50 is arranged in the first exposure area AR1 including the detection area of the first sub-detecting system 11 of the first detecting system 10 and the first reference mark FM2 on the fiducial plate 50 is arranged in the second exposure area AR2 including the detection area of the second sub-detecting system 12 of the first detecting system 10. The controller 30 detects the first reference marks FM1, FM2 on the measuring stage 90 substantially simultaneously via the projection optical system PL by using the first and second sub-detecting systems 11, 12 of the first detecting system 10 while measuring the position information about the measuring stage 90 by using the measuring system 70.

Specifically, the controller 30 detects the first reference mark FM1 on the fiducial plate 50 and the first alignment mark RM1 on the first mask M1 corresponding thereto to detect the positional relationship between the first reference mark FM1 and the first alignment mark RM1. That is, the controller 30 simultaneously observes the first alignment mark RM1 on the first mask M1 and the first reference mark FM1 on the fiducial plate 50 by using the first sub-detecting system 11. The first pattern PA1 on the first mask M1 and the first alignment mark RM1 are formed in the predetermined positional relationship. Therefore, the first sub-detecting system 11 of the first detecting system 10 can detect the first positional relationship between the first pattern PA1 and the first reference mark FM1 by simultaneously observing the first alignment mark RM1 and the first reference mark FM1 via the projection optical system PL in the same manner as in the first embodiment.

Similarly, the controller 30 detects the first reference mark FM2 on the fiducial plate 50 and the second alignment mark RM2 on the second mask M2 corresponding thereto to detect the positional relationship between the first reference mark FM2 and the second alignment mark RM2. That is, the controller 30 simultaneously observes the second alignment mark RM2 on the second mask M2 and the first reference mark FM2 on the fiducial plate 50 by using the second sub-detecting system 12. The second pattern PA2 on the second mask M2 and the second alignment mark RM2 are formed in the predetermined positional relationship. Therefore, the second sub-detecting system 12 of the first detecting system 10 can detect the second positional relationship between the second pattern PA2 and the first reference mark FM2 by simultaneously observing the second alignment mark RM2 and the first reference mark FM2 via the projection optical system PL in the same manner as in the first embodiment.

As described above, in the second embodiment, the first reference mark FM1 is arranged in the first exposure area AR1, simultaneously with which the first reference mark FM2 is arranged in the second exposure area AR2. Thus, it is possible to substantially simultaneously perform the detection of the first positional relationship between the first pattern PA1 and the first reference mark FM1 (obtaining the projection position information about the first pattern PA1) and the detection of the second positional relationship between the second pattern PA2 and the first reference mark FM2 (obtaining the projection position information about the second pattern PA2).

Subsequently, the controller 30 moves at least one of the first substage 62 and the second substage 63 so that the image of the first pattern PA1 and the image of the second pattern PA2 are projected onto the desired positions respectively in the shot area S on the substrate P to adjust the positional relationship between the first pattern PA1 of the first mask M1 and the second pattern PA2 of the second mask M2. In the second embodiment, the first reference marks FM1, FM2 are formed in the predetermined positional relationship on the fiducial plate 50. Therefore, it is possible to obtain not only the projection position information about the image of the first pattern PA1 and the projection position information about the image of the second pattern PA2 but also the positional relationship between the projection position of the image of the first pattern PA1 and the projection position of the image of the second pattern PA2 in the XY coordinate system defined by the measuring system 70 substantially simultaneously. In the same manner as in the first embodiment described above, the controller 30 adjusts the positional relationship between the first pattern PA1 and the second pattern PA2 based on positional relationship between the projection position of the image of the first pattern PA1 and the projection position of the image of the second pattern PA2 so that the image of the first pattern PA1 and the image of the second pattern PA2 are projected onto (formed on) the desired positions in the XY coordinate system defined by the measuring system 70 (i.e., so that the image of the first pattern PA1 and the image of the second pattern PA2 are projected at the desired timings). More specifically, at least one of the first substage 62 and the second substage 63 (i.e., at least one of the first pattern PA1 and the second pattern PA2) is moved at least one of the directions of the X axis direction, the Y axis direction, and the θZ direction while detecting the positions of the first substage 62 and the second substage 63 by means of the measuring system 70. In this procedure, both of the first pattern PA1 and the second pattern PA2 may be moved. However, it is also enough that any one of them is moved. In the same manner as in the first embodiment described above, at least one of the first and second imaging characteristic-adjusting devices LC1, LC2 may be used to perform the adjustment (shift adjustment) for the projection positions of the images of the first and second patterns PA1, PA2 on the substrate P. Alternatively, at least one of the optical mechanisms BL1, BL2 of the illumination system IL may be moved to adjust at least one of the positions of the first exposure area AR1 and the second exposure area AR2.

Figure 17B:
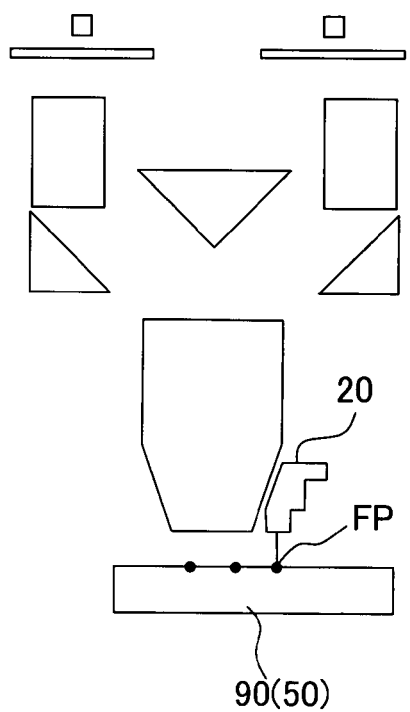
Figure 18B:
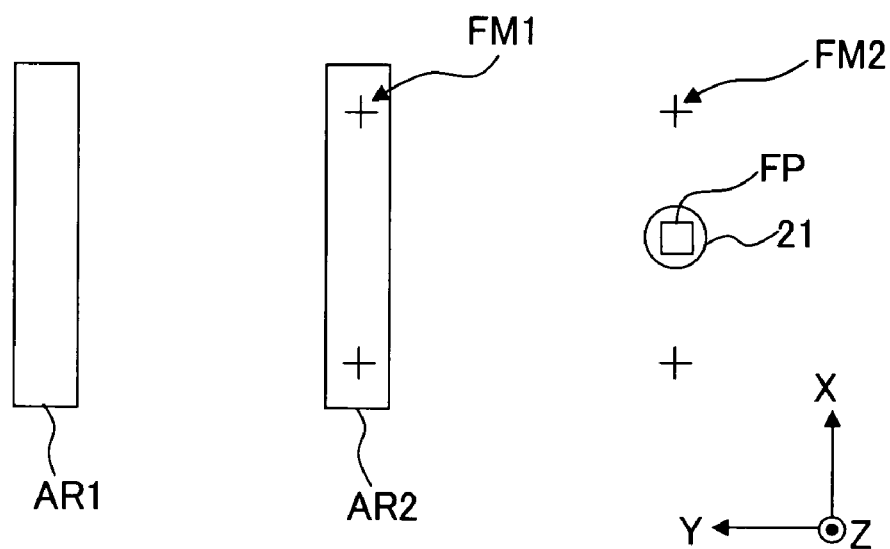

Subsequently, as shown in FIGS. 17B and 18B, the controller 30 moves the measuring stage 90 in the XY directions to arrange the second reference mark FP on the measuring stage 90 in the detection area 21 of the second detecting system 20.

Subsequently, the shot areas (S1 to S21) on the substrate P are successively subjected to the multiple exposure respectively while adjusting the positional relationship among the first pattern PA1, the second pattern PA2, and the substrate P in the same manner as in Step SA5 to Step SA8 of the first embodiment.

As explained above, in the second embodiment, the first reference mark FM1 and the first reference mark FM2 are provided. The first reference marks FM1, FM2 can be used to substantially simultaneously adjust the first positional relationship between the first pattern PA1 and the first reference mark FM1 and the second positional relationship between the second pattern PA2 and the first reference mark FM2. Accordingly, it is possible to quickly perform the alignment process for the image of the first pattern PA1, the image of the second pattern PA2, and the shot area S.

In this embodiment, the detection of the first positional relationship and the detection of the second positional relationship may be performed unsimultaneously such that the first positional relationship is detected by using the first sub-detecting system 11, and then the second positional relationship is detected by using the second sub-detecting system 12 in a state in which the first reference mark FM1 and the first reference mark FM2 are arranged in the first exposure area AR1 and the second exposure area AR2.

Third Embodiment

A third embodiment will be explained. The feature of this embodiment resides in that the second detecting system detects the second reference mark FP via the terminal end optical element FL. In the following description, the constitutive components, which are the same as or equivalent to those of the embodiment described above, are designated by the same reference numerals, any explanation of which will be simplified or omitted.

Figure 19:
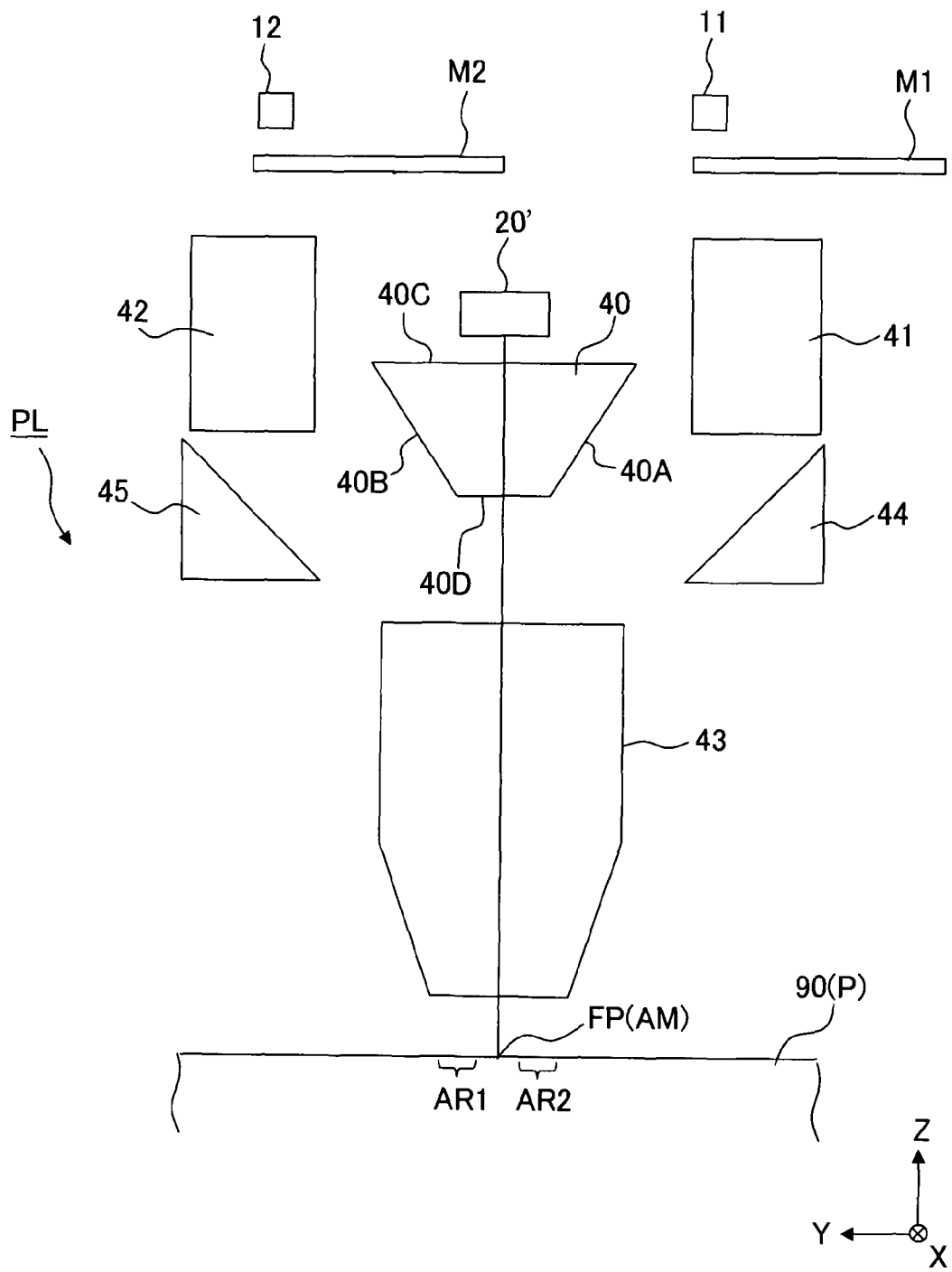
FIG. 19 shows an exposure apparatus according to a third embodiment.

FIG. 19 schematically shows an exposure apparatus EX according to the third embodiment. The exposure apparatus EX of this embodiment exposes the substrate P while moving the substrate P in the Y axis direction in the same manner as in the embodiment described above. The exposure apparatus EX of this embodiment is provided with the projection optical system PL which has the terminal end optical element FL arranged opposingly to the surface of the substrate P, which is capable of irradiating the first exposure light beam EL1 from the first pattern PA1 onto the first exposure area AR1 via the terminal end optical element FL, and which is capable of irradiating the second exposure light beam EL2 from the second pattern PA2 onto the second exposure area AR2 via the terminal end optical element FL, the second exposure area AR2 being set at the position in the Y axis direction different from the position of the first exposure area AR1. The first exposure area AR1 and the second exposure area AR2 are defined at the positions separated from each other in the Y axis direction.

The projection optical system PL has the first reflecting surface 40A which is arranged in the vicinity of the positions optically conjugate with the first exposure area AR1 and the second exposure area AR2 and which guides the first exposure light beam EL1 to the terminal end optical element FL, and the second reflecting surface 40B which is arranged in the vicinity of the positions optically conjugate with the first exposure area AR1 and the second exposure area AR2 and which guides the second exposure light beam EL2 to the terminal end optical element FL, in the same manner as in the embodiment described above.

The exposure apparatus EX is provided with a second detecting system 20' which detects the second reference mark FP and the alignment mark AM on the substrate P. In this embodiment, the second detecting system 20' irradiates the detection light beam onto the substrate P via the terminal end optical element FL from a position between the first reflecting surface 40A and the second reflecting surface 40B to detect the second reference mark FP and the alignment mark AM on the substrate P.

The first reflecting surface 40A and the second reflecting surface 40B are provided on the intermediate optical member 40 provided at the predetermined position in the same manner as in the embodiment described above. The second detecting system 20' irradiates the detection light beam for detecting the alignment mark AM onto the substrate P via the third optical system 43 including the intermediate optical member 40 and the terminal end optical element FL.

The intermediate optical member 40 of this embodiment has the upper surface 40C and the lower surface 40D. The upper surface 40C and the lower surface 40D are flat surfaces which are substantially parallel to the XY directions. That is, the upper surface 40C and the lower surface 40D are parallel to one another. The second detecting system 20' is arranged over or above the upper surface 40C of the intermediate optical member 40. In this embodiment, at least a part of the second detecting system 20' is arranged over or above the intermediate optical member 40 between the first optical system 41 and the second optical system 42. The detection light beam, which is radiated from the second detecting system 20', comes into the upper surface 40C of the intermediate optical member 40, and it passes through the intermediate optical member 40. After that, the detection light beam outgoes from the lower surface 40D of the intermediate optical member 40. The detection light beam, which is allowed to outgo from the lower surface 40D of the intermediate optical member 40, is irradiated onto the substrate P or onto the fiducial plate 50 via the third optical system 43 including the terminal end optical element FL.

Figure 20:
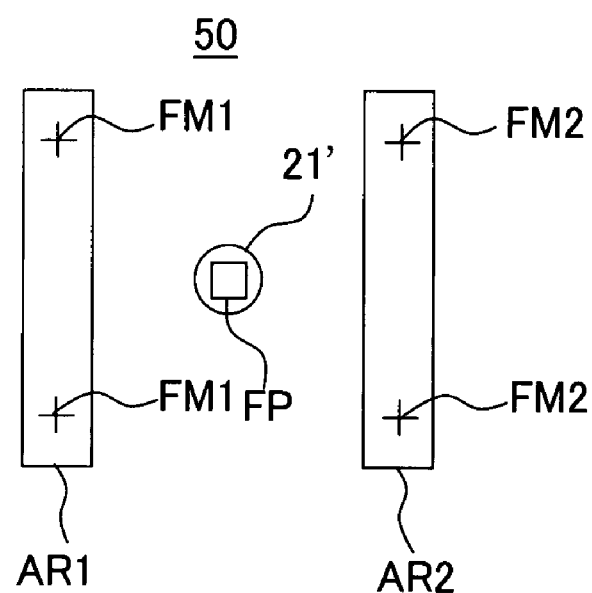
FIG. 20 schematically shows the positional relationship among the first exposure area, the second exposure area, the detection area, and the reference mark according to the third embodiment.

FIG. 20 schematically shows the positional relationship among the first exposure area AR1, the second exposure area AR2, the detection area 21' of the second detecting system 20', and the reference marks FM1, FM2, FP according to this embodiment. Also in this embodiment, the first reference mark FM1 and the first reference mark FM2 are separated from each other in the Y axis direction so that they can be simultaneously arranged in the first exposure area AR1 and the second exposure area AR2 in the same manner as in the second embodiment described above. In this embodiment, the detection area 21' of the second detecting system 20' is defined between the first exposure area AR1 and the second exposure area AR2.

The second reference mark FP is provided between the first reference mark FM1 and the first reference mark FM2 in relation to the Y axis direction so that the second reference mark FP is arranged in the detection area 21' of the second detecting system 20' when the first reference marks FM1, FM2 are arranged in the first and second exposure areas AR1, AR2.

According to this embodiment, it is possible to shorten the distance between the detection area 21' of the second detecting system 20' and the first and second exposure areas AR1, AR2. Accordingly, for example, even when any fluctuation arises in the environment in which the exposure apparatus EX is placed, it is possible to suppress the increase in the fluctuation amount of the positional relationship (distance) between the first exposure area AR1 (projection position of the first pattern PA1) and the detection area 21' (detection reference position of the second detecting system 20').

In this embodiment, the first reference mark FM1, the first reference mark FM2, and the second reference mark FP are simultaneously arranged in the first exposure area AR1, the second exposure area AR2, and the detection area 21. Therefore, it is possible to substantially simultaneously perform the detecting operations of at least two of the detecting systems of the first sub-detecting system 11, the second sub-detecting system 12, and the second detecting system 20'.

Also in the first and second embodiments, the positional relationship among the first exposure area AR1, the second exposure area AR2, and the detection area 21 and the positional relationship between the first reference mark and the second reference mark can be set so that the second reference mark FP is arranged in the detection area 21 of the second detecting system 20 when the first reference mark is arranged in at least one of the first exposure area AR1 and the second exposure area AR2. It is also allowable to simultaneously perform the detection of the first reference mark FM by the first detecting system 10 and the detection of the second reference mark FP by the second detecting system 20.

Fourth Embodiment

Figure 21:
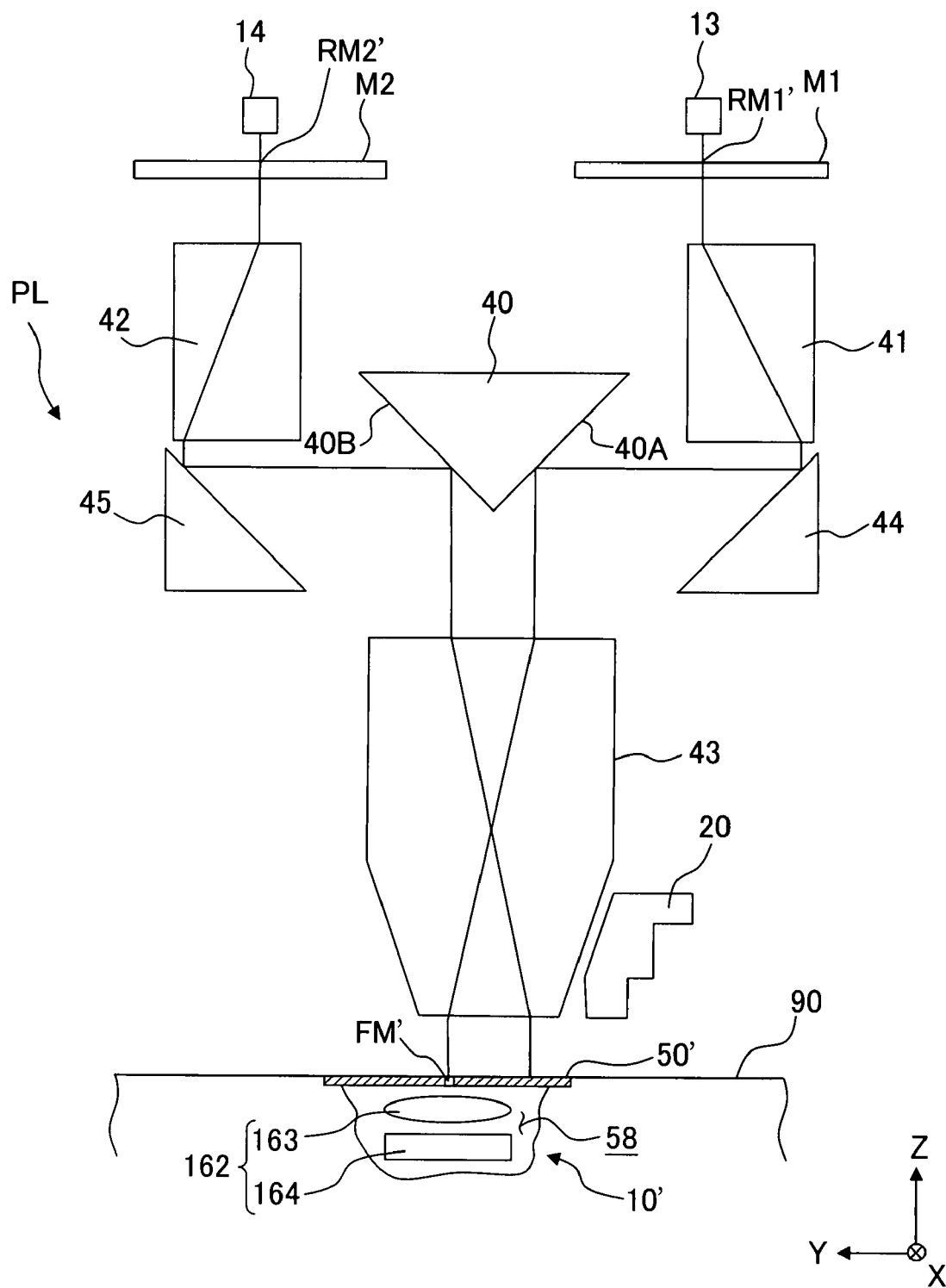
FIG. 21 shows an exposure apparatus according to a fourth embodiment.

Next, a fourth embodiment will be explained. FIG. 21 shows a schematic arrangement illustrating an exposure apparatus EX according to the fourth embodiment. The constitutive components, which are the same as or equivalent to those of the first and second embodiments described above, are designated by the same reference numerals, any explanation of which will be simplified or omitted.

The feature of this embodiment resides in that the first detecting system, which is provided to obtain the position information about the image of the first pattern PA1 and the position information about the image of the second pattern PA2, has a light-receiving system which receives the detection light beam on the image plane side of the projection optical system PL.

In this embodiment, the first detecting system 10' has a spatial image-measuring device 162 which is capable of being arranged on the image plane side of the projection optical system PL and which is provided for the measuring stage 90. The spatial image-measuring device 162 is used to obtain the position information about the images of the first and second patterns PA1, PA2. As shown in FIG. 21, in this embodiment, a fiducial plate 50', which has a transmitting portion (aperture) FM' for transmitting the light beam therethrough, is provided on the measuring stage 90. An internal space 58 of the measuring stage 90 is formed under the fiducial plate 50' (in the −Z direction). A part of the spatial image-measuring device 162, which receives the detection light beam irradiated from the projection optical system PL onto the measuring stage 90, is provided in the internal space 58. The spatial image-measuring device 162 is provided with an optical system 163 which is provided under the fiducial plate 50' and a light-receiving element 164 which receives the light beam via the optical system 163.

Figure 22:
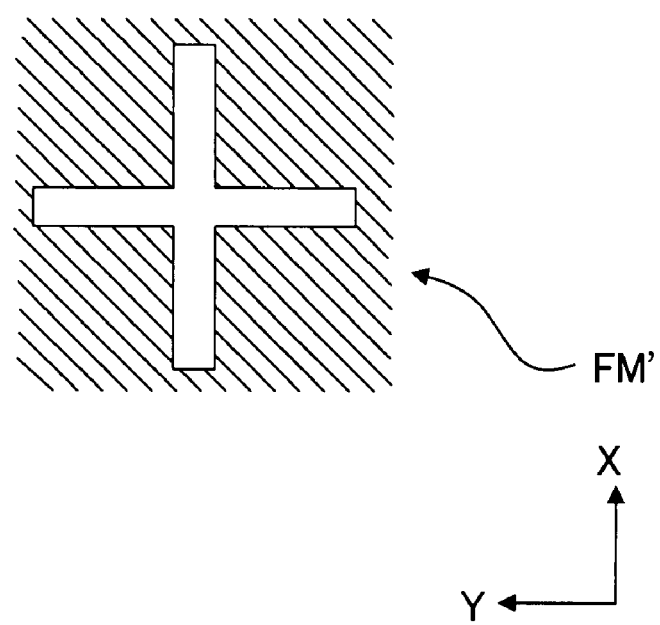
FIG. 22 shows a reference section (light-transmitting portion) according to the fourth embodiment.

FIG. 22 shows an example of the transmitting portion FM' provided for the fiducial plate 50'. As shown in FIG. 22, the transmitting portion FM' includes a cross-shaped aperture (slit) formed in the light-shielding area formed, for example, with a metal such as Cr (chromium). The fiducial plate 50' is formed of, for example, silica glass, through which the light is transmissive. The light beam, which is irradiated onto the transmitting portion (aperture) FM' of the fiducial plate 50', is received by the light-receiving element 164 via the optical system 163. The transmitting portion FM' serves as the reference when the position information about the images of the first and second patterns PA1, PA2 is obtained. That is, the transmitting portion FM' corresponds to the first reference mark in the respective embodiments described above. In the following description, the transmitting portion FM' will be appropriately referred to as "first reference transmitting portion FM'".

Although not shown, the second reference mark FP is formed on the fiducial plate 50' in the same manner as in the respective embodiments described above. The first reference transmitting portion FM' and the second reference mark FP are provided in a predetermined positional relationship.

As shown in FIG. 21, the first detecting system 10' includes a first light-emitting device 13 which is provided over or above the mask stage 60 and which is capable of radiating the detection light beam onto the first alignment mark RM1' of the first mask M1, and a second light-emitting device 14 which is capable of radiating the detection light beam onto the second alignment mark RM2' of the second mask M2.

Subsequently, an explanation will be made about an example of the operation for detecting the position information about the images of the first and second patterns PA1, PA2 by using the spatial image-measuring device 162 as described above. The controller 30 moves the measuring stage 90 in the XY directions to arrange the first reference transmitting portion FM' on the measuring stage 90 in the first exposure area AR1. Further, the controller 30 radiates the detection light beam from the first light-emitting device 13 onto the first alignment mark RM1' of the first mask M1. The controller 30 radiates the detection light beam from the first light-emitting device 13 while measuring the position information about the measuring stage 90 by using the measuring system 70 to detect the spatial image of the first alignment mark RM1' via the projection optical system PL by means of the spatial image-measuring device 162. Accordingly, the spatial image-measuring device 162 can detect the positional relationship between the first reference transmitting portion FM' on the fiducial plate 50' and the first alignment mark RM1' on the first mask M1 corresponding thereto. The first pattern PA1 on the first mask M1 and the first alignment mark RM1' are formed in the predetermined positional relationship. Therefore, the controller 30 can obtain the first positional relationship between the first pattern PA1 and the first reference transmitting portion FM'. Further, the controller 30 can obtain the positional relationship between the first reference transmitting portion FM' and the projection position of the image of the first pattern PA1. That is, the controller 30 can obtain the position information about the image of the first pattern PA1 formed in the first exposure area AR1 based on the measurement result of the spatial image-measuring device 162.

Subsequently, the controller 30 moves the measuring stage 90 in the XY directions while detecting the position of the measuring stage 90 by means of the measuring system 70 to arrange the first reference transmitting portion FM' on the measuring stage in the second exposure area AR2. The controller 30 radiates the detection light beam from the second light-emitting device 14 onto the second alignment mark RM2' of the second mask M2. The controller 30 radiates the detection light beam from the second light-emitting device 14 while measuring the position information about the measuring stage 90 by using the measuring system 70 to detect the spatial image of the second alignment mark RM2' via the projection optical system PL by means of the spatial image-measuring device 162. Accordingly, the spatial image-measuring device 162 can detect the positional relationship between the first reference transmitting portion FM' on the fiducial plate 50' and the second alignment mark RM2' on the second mask M2 corresponding thereto. The second pattern PA2 on the second mask M2 and the second alignment mark RM2' are formed in the predetermined positional relationship. Therefore, the controller 30 can obtain the second positional relationship between the second pattern PA2 and the first reference transmitting portion FM'. Further, the controller 30 can obtain the positional relationship between the first reference transmitting portion FM' and the projection position of the image of the second pattern PA2. That is, the controller 30 can obtain the position information about the image of the second pattern PA2 formed in the second exposure area AR2 based on the light-receiving result of the spatial image-measuring device 162.

Subsequently, the controller 30 moves at least one of the first substage 62 and the second substage 63 so that the image of the first pattern PA1 and the image of the second pattern PA2 are projected onto the desired positions respectively in the shot area S on the substrate P to adjust the positional relationship between the first pattern PA1 of the first mask M1 and the second pattern PA2 of the second mask M2. The controller 30 adjusts the positional relationship between the first pattern PA1 and the second pattern PA2 based on the projection position of the image of the first pattern PA1 and the projection position of the image of the second pattern PA2 so that the image of the first pattern PA1 and the image of the second pattern PA2 are projected onto (formed on) the desired positions in the XY coordinate system defined by the measuring system 70 respectively (i.e., so that the image of the first pattern PA1 and the image of the second pattern PA2 are projected at the desired timings respectively) in the same manner as in the first embodiment described above. More specifically, the at least one of the first substage 62 and the second substage 63 (i.e., at least one of the first pattern PA1 and the second pattern PA2) is moved in at least one of the directions of the X axis direction, the Y axis direction, and the θZ direction while detecting the positions of the first substage 62 and the second substage 63 by means of the measuring system 70. In this procedure, both of the first pattern PA1 and the second pattern PA2 may be moved. However, it is also enough that only any one of them is moved. In the same manner as in the first embodiment described above, the projection positions of the images of the first and second patterns PA1, PA2 on the substrate P may be subjected to ill the adjustment (shift adjustment) by using at least one of the first and second imaging characteristic-adjusting devices LC1, LC2. Further, at least one of the optical mechanisms BL1, BL2 of the illumination system IL may be moved to adjust at least one of the positions of the first exposure area AR1 and the second exposure area AR2.

Subsequently, the controller 30 moves the measuring stage 90 in the XY directions to arrange the second reference mark FP on the measuring stage 90 in the detection area 21 of the second detecting system 20.

After that, the shot areas (S1 to S21) on the substrate P are successively subjected to the multiple exposure respectively while adjusting the positional relationship among the first pattern PA1, the second pattern PA2, and the substrate P in the same manner as in Step SA5 to Step SA8 of the first embodiment.

As described above, the position information about the images of the first and second patterns PA1, PA2 can be also obtained by using the spatial image-measuring device 162 which receives the detection light beam on the light-exit side of the projection optical system PL.

The exposure light beams EL1, EL2 from the illumination system IL may be radiated as the detection light beams onto the first alignment mark RM1' and the second alignment mark RM2' respectively without providing the first and second light-emitting devices 13, 14.

The fiducial plate 50' may be provided with a first reference transmitting portion FM1' and a second reference transmitting portion FM2' which can be simultaneously arranged in the first exposure area AR1 and the second exposure area AR2. Accordingly, the first reference transmitting portion FM1' may be arranged in the first exposure area AR1, simultaneously with which the first reference transmitting portion FM2' may be arranged in the second exposure area AR2 to successively perform the detection of the first positional relationship between the first pattern PA1 and the first reference transmitting portion FM1' and the detection of the second positional relationship between the second pattern PA2 and the first reference transmitting portion FM2' substantially simultaneously or unsimultaneously.

The second reference mark FP may be arranged on the −Y side of the first reference transmitting portion FM' so that the second reference mark FP is arranged in the detection area 21 of the second detecting system 20 when the first reference transmitting portion FM' is arranged in at least one of the first exposure area AR1 and the second exposure area AR2. Also in this case, it is possible to perform at least two of the detecting operations of the first detecting system 10' and the second detecting system 20 substantially simultaneously.

An example of the spatial image-measuring device for receiving the detection light beam on the light-exit side of the projection optical system PL is disclosed, for example, in U.S. Pat. No. 4,629,313 and Japanese Patent Application Laid-open No. 1-228130.

Fifth Embodiment

Figure 23:
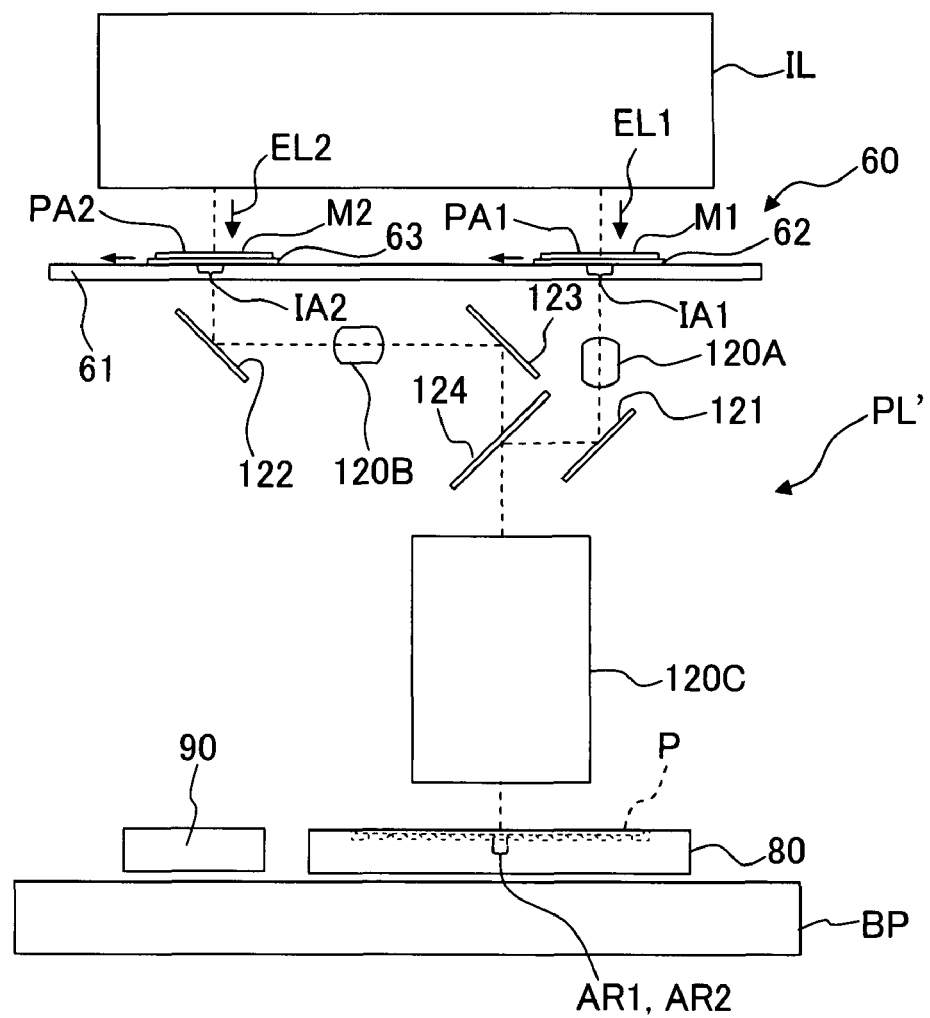
FIG. 23 shows an exposure apparatus according to a fifth embodiment.

A fifth embodiment will be explained. FIG. 23 shows a schematic arrangement illustrating an exposure apparatus EX according to this embodiment. The feature of this embodiment, which is different from those of the respective embodiments described above, resides in that the first exposure area AR1 is overlapped with the second exposure area AR2. In the following description, the constitutive components, which are the same as or equivalent to those of the embodiment described above, are designated by the same reference numerals, any explanation of which will be simplified or omitted.

Also in this embodiment, the controller 30 illuminates the first pattern PA1 and the second pattern PA2 respectively with the first exposure light beam EL1 and the second exposure light beam EL2 from the illumination system IL while moving the first mask M1 and the second mask M2 in the identical scanning direction (for example, in the +Y direction) by using the mask stage 60 which has the main stage 61. The controller 30 performs the scanning exposure for the shot area S on the substrate P by moving the substrate stage 80 which holds the substrate P in the scanning direction opposite to that of the first mask M1 and the second mask M2 (for example, in the −Y axis direction) in synchronization with the movement of the first mask M1 and the second mask M2. The shot area S on the substrate P is subjected to the multiple exposure (double exposure) with the image of the first pattern PA1 formed with the first exposure light beam EL1 irradiated onto the first exposure area AR1 and the image of the second pattern PA2 formed with the second exposure light beam EL2 irradiated onto the second exposure area AR2.

The projection optical system PL' is provided with a beam splitter 124 (for example, a polarization beam splitter or a half mirror) which is provided between the optical system 120C and the mask stage 60 and into which the first exposure light beam EL1 from the first mask M1 and the second exposure light beam EL2 from the second mask M2 are allowed to come. The projection optical system PL' includes a first imaging optical system 120A which is provided on the optical path for the first exposure light beam EL1 between the first mask M1 and the substrate P (first exposure area AR1), and a second imaging optical system 120B which is provided on the optical path for the second exposure light beam EL2 between the second mask M2 and the substrate P (second exposure area AR2). The first imaging optical system 120A is provided between the first mask M1 and the optical system 120C in the optical path for the first exposure light beam EL1 between the first mask M1 and the first exposure area AR1. The second imaging optical system 120B is provided between the second mask M2 and the optical system 120C in the optical path for the second exposure light beam EL2 between the second mask M2 and the second exposure area AR2. The first and second imaging optical systems 120A, 120B of this embodiment are 1× magnification imaging optical systems. Each of the first and second imaging optical systems 120A, 120B has the function to invert the image of the object once.

The first imaging optical system 120A and a first reflecting mirror 121 are provided between the first mask M1 and the beam splitter 124. The first exposure light beam EL1 from the first mask M1 passes through the first imaging optical system 120A, and then the first exposure light beam EL1 comes into the beam splitter 124 via the first reflecting mirror 121. A second reflecting mirror 122, the second imaging optical system 120B, and a third reflecting mirror 123 are provided between the second mask M2 and the beam splitter 124. The second exposure light beam EL2 from the second mask M2 is reflected by the second reflecting mirror 122, and then it passes through the second imaging optical system 120B. The second exposure light beam EL2 is reflected by the third reflecting mirror 123, and then it comes into the beam splitter 124. The first exposure light beam EL1 and the second exposure light beam EL2, which are allowed to come into the beam splitter 124, come into the optical system 120C via the beam splitter 124.

In this embodiment, the image of the first pattern PA1 is inverted once by the first imaging optical system 120A between the first mask M1 and the optical system 120C. In this embodiment, the optical system 120C inverts the image of the object once. Therefore, the image of the first pattern PA1 is inverted twice (even number of times) between the first mask M1 and the first exposure area AR1. The image of the second pattern PA2 is inverted once by the second imaging optical system 120B between the second mask M2 and the optical system 120C. Therefore, the image of the second pattern PA2 is inverted twice (even number of times) between the second mask M2 and the second exposure area AR2.

As described above, in the projection optical system PL' of this embodiment, the image of the first pattern PA1 is inverted an even number of times between the first mask M1 and the first exposure area AR1, and the image of the second pattern PA2 is inverted an even number of times between the second mask M2 and the second exposure area AR2. Therefore, even when the first pattern PA1 and the second pattern PA2 are illuminated with the first exposure light beam EL1 and the second exposure light beam EL2 respectively while moving the first mask M1 and the second mask M2 in the identical scanning direction (for example, in the +Y direction), the desired images of the first and second patterns PA1, PA2 can be projected onto the shot area S on the substrate P.

FIG. 24 schematically shows the positional relationship among the first exposure area AR1, the second exposure area AR2, the detection area 21 of the second detecting system 20, and the reference marks FM, FP according to the fifth embodiment.

The first reference mark FM to be detected by the first detecting system 10 and the reference mark FP to be detected by the second detecting system 20 are formed in the predetermined positional relationship on the upper surface of the fiducial plate 50 of this embodiment in the same manner as in the first embodiment described above. The first and second sub-detecting systems 11, 12 of the first detecting system 10 detect the first reference mark FM, and the second detecting system 20 detects the second reference mark FP.

As shown in FIG. 24, the first exposure area AR1 and the second exposure area AR2 are defined so that they are overlapped (coincident) with each other at the identical position in this embodiment.

Figure 24A:
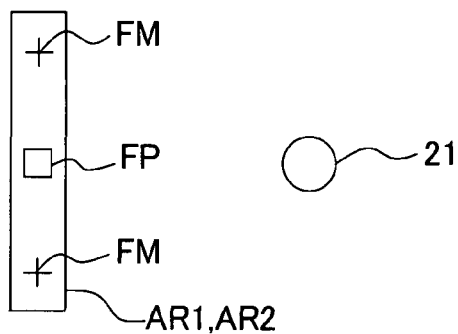
FIGS. 24A and 24B schematically show the positional relationship among the first exposure area, the second exposure area, the detection area, and the reference mark according to the fifth embodiment.

In this embodiment, the first exposure area AR1 is overlapped with the second exposure area AR2. As shown in FIG. 24A, the controller 30 can control the measuring stage 90 so that the first reference mark FM is arranged in the overlapped area of the first exposure area AR1 and the second exposure area AR2 to perform at least one of the detection of the first positional relationship between the first pattern PA1 and the first reference mark FM by the first sub-detecting system 11 of the first detecting system 10 and the detection of the second positional relationship between the second pattern PA2 and the first reference mark FM by the second sub-detecting system 12. In this embodiment, the controller 30 arranges the first reference mark FM in the overlapped area of the first exposure area AR1 and the second exposure area AR2 to substantially simultaneously perform the detection of the first positional relationship by the first sub-detecting system 11 and the detection of the second positional relationship by the second sub-detecting system 12. That is, the controller 30 simultaneously observes the first alignment mark RM1 on the first mask M1 and the first reference mark FM on the fiducial plate 50 via the projection optical system PL' by using the first sub-detecting system 11. Further, the controller 30 simultaneously observes the second alignment mark RM2 on the second mask M2 and the first reference mark FM on the fiducial plate 50 via the projection optical system PL' by using the second sub-detecting system 12. Accordingly, the controller 30 can obtain the position information about the image of the first pattern PA1 formed in the first exposure area AR1 and the position information about the image of the second pattern PA2 formed in the second exposure area AR2 in the same manner as in the respective embodiments described above.

Subsequently, the controller 30 moves at least one of the first substage 62 and the second substage 63 so that the image of the first pattern PA1 and the image of the second pattern PA2 are projected onto the desired positions respectively in the shot area S on the substrate P to adjust the positional relationship between the first pattern PA1 of the first mask M1 and the second pattern PA2 of the second mask M2. The controller 30 adjusts the positional relationship between the first pattern PA1 and the second pattern PA2 based on the detected positional relationship between the projection position of the image of the first pattern PA1 and the projection position of the image of the second pattern PA2 so that the image of the first pattern PA1 and the image of the second pattern PA2 are projected onto (formed on) the desired position in the XY coordinate system defined by the measuring system in an overlaid manner respectively in the same manner as in the first embodiment described above. More specifically, at least one of the first substage 62 and the second substage 63 (i.e., at least one of the first pattern PA1 and the second pattern PA2) is moved in at least one of the directions of the X axis direction, the Y axis direction, and the θZ directions while detecting the positions of the first substage 62 and the second substage 63 by means of the measuring system 70. In this procedure, both of the first pattern PA1 and the second pattern PA2 may be moved. However, it is also enough that only any one of them is moved. At least one of the projection positions of the images of the first and second patterns PA1, PA2 on the substrate P may be subjected to the adjustment (shift adjustment) by adjusting at least one of the first and second imaging optical systems 120A, 120B.

Figure 24B:
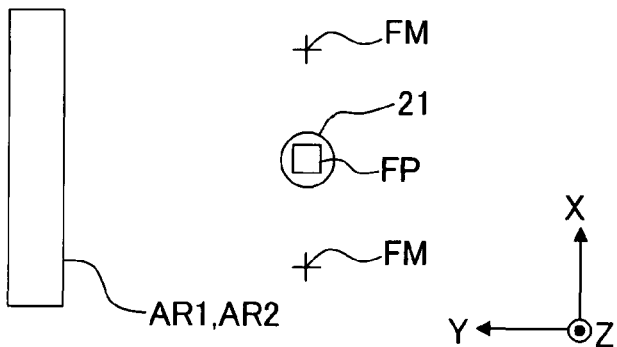

Subsequently, as shown in FIG. 24B, the controller 30 moves the measuring stage 90 in the XY directions to arrange the second reference mark FP on the measuring stage 90 in the detection area 21 of the second detecting system 20.

After that, the shot areas (S1 to S21) on the substrate P are successively subjected to the multiple exposure respectively while adjusting the positional relationship among the first pattern PA1, the second pattern PA2, and the substrate P in the same manner as in Step SA5 to Step SA8 of the first embodiment.

In this embodiment, the first reference mark FM is arranged in the overlapped area of the first exposure area AR1 and the second exposure area AR2 to substantially simultaneously perform the detection of the first positional relationship by the first sub-detecting system 11 and the detection of the second positional relationship by the second sub-detecting system 12. However, the detection may be performed unsimultaneously as well. That is, the reference mark FM may be arranged in the overlapped area of the first exposure area AR1 and the second exposure area AR2 so that one of the detection of the first positional relationship by the first sub-detecting system 11 and the detection of the second positional relationship by the second sub-detecting system 12 may be performed, and then the other may be performed. The second reference mark FP may be arranged on the −Y side of the first reference mark FM so that the second reference mark FP may be arranged in the detection area 21 of the second detecting system 20 when the first reference mark FM is arranged in the overlapped area of the first exposure area AR1 and the second exposure area AR2. Also in this case, it is possible to substantially simultaneously perform at least two of the detecting operations of the first sub-detecting system 11, the second sub-detecting system 12, and the second detecting system 20.

Sixth Embodiment

Next, a sixth embodiment will be explained. The constitutive components, which are the same as or equivalent to those of the respective embodiments described above, are designated by the same reference numerals, any explanation of which will be simplified or omitted.

FIG. 25 schematically shows the positional relationship among the first exposure area AR1, the second exposure area AR2, the detection area 21 of the second detecting system 20, and the reference marks FM1, FM2, FP according to the sixth embodiment. The feature of this embodiment resides in that the first exposure area AR1 and the second exposure area AR2 are partially overlapped with each other in relation to the Y axis direction. Also in this embodiment, the exposure apparatus of the fifth embodiment is used.

The first reference mark FM1 to be detected by the first sub-detecting system 11 of the first detecting system 10, the first reference mark FM2 to be detected by the second sub-detecting system 12, and the reference mark FP to be detected by the second detecting system 20 are formed in the predetermined positional relationship on the upper surface of the fiducial plate 50 of this embodiment in the same manner as in the second embodiment described above.

Figure 25A:
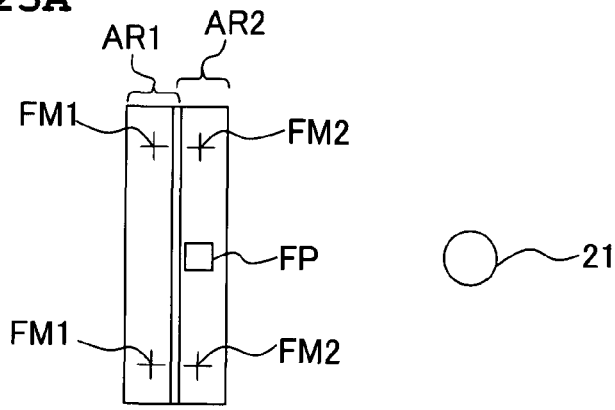
FIGS. 25A and 25B schematically show the positional relationship among the first exposure area, the second exposure area, the detection area, and the reference mark according to a sixth embodiment.

As shown in FIG. 25A, the first exposure area AR1 and the second exposure area AR2 are partially overlapped with each other in relation to the Y axis direction. The first reference mark FM1 and the first reference mark FM2 are simultaneously arranged in the first exposure area AR1 and the second exposure area AR2. In this embodiment, when the first reference mark FM1 is arranged in the area which is included in the first exposure area AR1 and which is not overlapped with the second exposure area AR2, the first reference mark FM2 is arranged in the area which is included in the second exposure area AR2 and which is not overlapped with the first exposure area AR1.

Also in this embodiment, the controller 30 can substantially simultaneously perform the detection of the first positional relationship by the first sub-detecting system 11 and the detection of the second positional relationship by the second sub-detecting system 12 by arranging the first reference mark FM1 in the first exposure area AR1 and arranging the first reference mark FM2 in the second exposure area AR2. Accordingly, the controller 30 can obtain the position information about the first pattern PA1 formed in the first exposure area AR1 and the position information about the second pattern PA2 formed in the second exposure area AR2, in the same manner as in the respective embodiments described above.

Figure 25B:
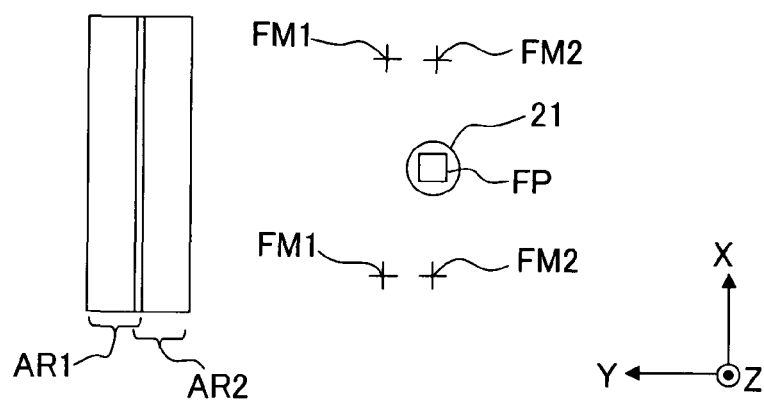

As shown in FIG. 25B, the controller 30 can move the measuring stage 90 in the XY directions so that the second reference mark FP on the measuring stage 90 is arranged in the detection area 21 of the second detecting system 20 to detect the second reference mark FP arranged in the detection area 21 by using the second detecting system 20 in the same manner as in the second embodiment described above.

In this embodiment, the first reference mark FM1 and the first reference mark FM2 are arranged in the first exposure area AR1 and the second exposure area AR2 to substantially simultaneously perform the detection of the first positional relationship by the first sub-detecting system 11 and the detection of the second positional relationship by the second sub-detecting system 12. However, the detection operations may be performed unsimultaneously. That is, the first reference mark FM1 and the first reference mark FM2 may be arranged in the first exposure area AR1 and the second exposure area AR2 so that one of the detection of the first positional relationship by the first sub-detecting system 11 and the detection of the second positional relationship by the second sub-detecting system 12 may be performed, and then the other may be performed.

In FIG. 25, the second reference mark FP is arranged between the pair of first reference marks FM2 which are separated from each other in the X axis direction. However, as explained in the second embodiment described above, the following arrangement is also available. That is, the second reference mark FP is arranged on the −Y side of the first reference marks FM1, FM2 so that the second reference mark FP is arranged in the detection area 21 of the second detecting system 20 when the first reference mark FM1 and the first reference mark FM2 are arranged in the first exposure area AR1 and the second exposure area AR2. In this case, it is possible to substantially simultaneously perform at least two of the detecting operations of the first sub-detecting system 11, the second sub-detecting system 12, and the second detecting system 20.

Figure 26:
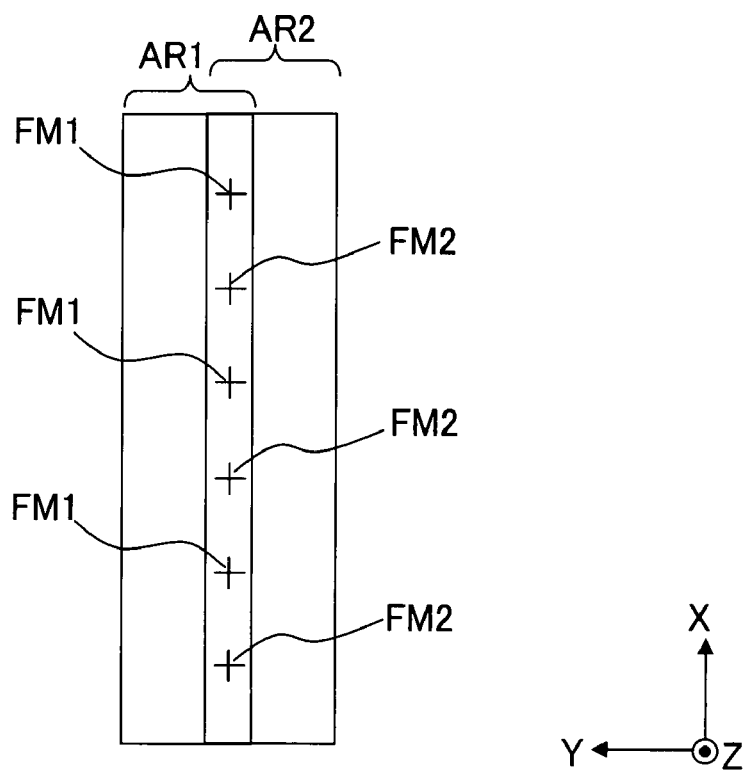
FIG. 26 schematically shows the positional relationship among the first exposure area, the second exposure area, the detection area, and the reference mark according to the sixth embodiment.

In this embodiment, the first reference mark FM1 is arranged in the area which is included in the first exposure area AR1 and which is not overlapped with the second exposure area AR2, and the first reference mark FM2 is arranged in the area which is included in the second exposure area AR2 and which is not overlapped with the first exposure area AR1. However, as shown in FIG. 26, the first reference mark FM1 and the first reference mark FM2 may be arranged in the overlapped area of the first exposure area AR1 and the second exposure area AR2 to simultaneously or unsimultaneously perform the detection of the first positional relationship by the first sub-detecting system 11 and the detection of the second positional relationship by the second sub-detecting system 12. Also when the fiducial plate 50 shown in FIG. 26 is used, the second reference mark FP may be arranged on the −Y side of the first reference marks FM1, FM2 so that the second reference mark FP is arranged in the detection area 21 of the second detecting system 20 when the first reference mark FM1 and the first reference mark FM2 are arranged in the overlapped area of the first exposure area AR1 and the second exposure area AR2. Also in this case, it is possible to substantially simultaneously perform at least two of the detecting operations of the first sub-detecting system 11, the second sub-detecting system 12, and the second detecting system 20.

When the second detecting system 20' of the third embodiment is used, the detection area 21' may be set in the overlapped area of the first exposure area AR1 and the second exposure area AR2 (see FIGS. 25 and 26) so that the second reference mark FP may be arranged in the overlapped area of the first exposure area AR1 and the second exposure area AR2 when the first reference mark FM1 and the first reference mark FM2 are arranged in the first exposure area AR1 and the second exposure area AR2. Also in this case, it is possible to substantially simultaneously perform at least two of the detecting operations of the first sub-detecting system 11, the second sub-detecting system 12, and the second detecting system 20.

In this embodiment, the two first reference marks FM1, FM2 are provided on the fiducial plate 50. However, only one first reference mark may be provided, and one reference mark may be commonly used for the first and second sub-detecting systems 11, 12 in the same manner as in the first embodiment described above.

Seventh Embodiment

Next, a seventh embodiment will be explained. The feature of this embodiment resides in that a liquid immersion area of a liquid is formed on the substrate P, and the first exposure light beam EL1 and the second exposure light beam EL2 are irradiated through the liquid of the liquid immersion area onto the shot area S on the substrate P. In the following description, the constitutive components, which are the same as or equivalent to those of the embodiment described above, are designated by the same reference numerals, any explanation of which will be simplified or omitted.

Figure 27:
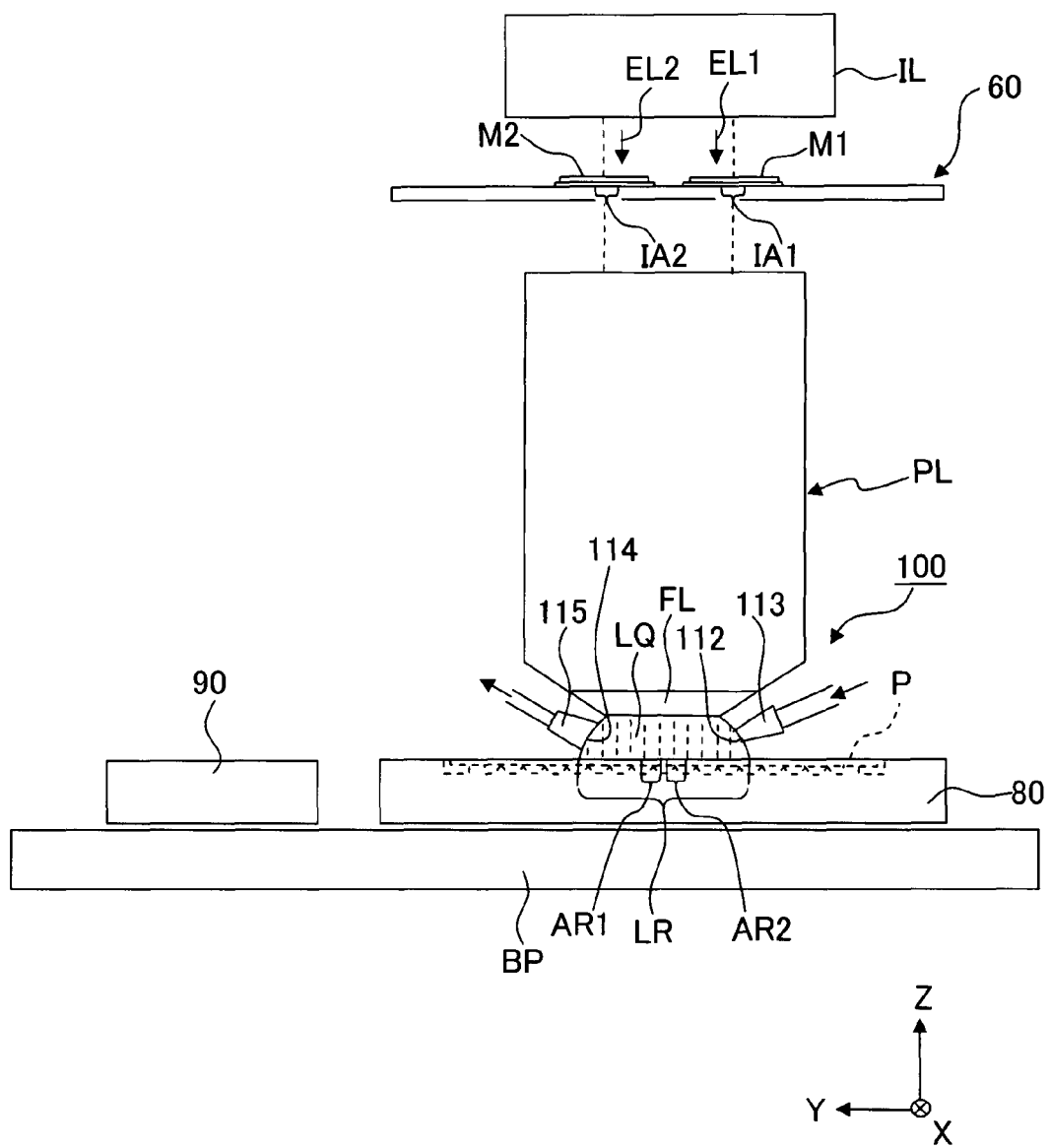
FIG. 27 shows an exposure apparatus according to a seventh embodiment.

FIG. 27 shows a schematic arrangement illustrating the seventh embodiment. The exposure apparatus EX of this embodiment is the exposure apparatus to which the liquid immersion method is applied in order that the exposure wavelength is substantially shortened to improve the resolution and the depth of focus is substantially widened, as disclosed, for example, in International Publication No. 99/49504 and Japanese Patent Application Laid-open No. 2004-289126 (corresponding to United States Patent Publication No. 2004/0165159). The exposure apparatus EX comprises a liquid immersion system 100 for forming the liquid immersion area LR of the liquid LQ on the substrate P. In this embodiment, water (pure water) is used as the liquid LQ. A top coat film or the like, which protects the photosensitive material and the base material from the liquid LQ, can be provided on the substrate P.

The liquid immersion system 100 includes a supply member 113 having a supply port 112 for supplying the liquid LQ to the optical path and a recovery member 115 having a recovery port 114 for recovering the liquid LQ which are provided in the vicinity of the optical path for the first and second exposure light beams EL1, EL2 between the substrate P and the terminal end optical element FL closest to the image plane of the projection optical system PL, the terminal end optical element FL being included in the plurality of optical elements of the projection optical system PL. A liquid supply unit (not shown), which is capable of feeding the liquid LQ, is connected to the supply member 113. The liquid supply unit is capable of supplying the clean and temperature-regulated liquid LQ to the optical path via the supply port 112. A liquid recovery unit (not shown), which includes, for example, a vacuum system, is connected to the recovery member 115. The liquid recovery unit is capable of recovering, via the recovery port 114, the liquid LQ with which the optical path is filled. The operations of the liquid supply unit and the liquid recovery unit are controlled by the controller 30. The controller 30 controls the liquid immersion system 100 to concurrently perform the liquid supply operation by the liquid supply unit and the liquid recovery operation by the liquid recovery unit. Accordingly, the liquid immersion area LR of the liquid LQ is locally formed on a part of the substrate P so that the optical path for the first and second exposure light beams EL1, EL2, which is disposed between the lower surface (light-outgoing surface) of the terminal end optical element FL of the projection optical system PL and the surface of the substrate P on the substrate stage 80, is filled with the liquid LQ. The liquid immersion area LR is formed to be larger than the first exposure area AR1 and the second exposure area AR2 on the substrate P. That is, the liquid immersion area LR is formed so that all of the first exposure area AR1 and the second exposure area AR2 are covered therewith. It is not necessarily indispensable that a part or parts of the liquid immersion system 100 (for example, any member for constructing the liquid supply unit and/or the liquid recovery unit) are provided for the exposure apparatus EX. For example, any equipment of the factory or the like in which the exposure apparatus is installed may be used in place thereof. The structure of the liquid immersion system 100 is not limited to the structure described above. It is possible to use those disclosed, for example, in European Patent Publication No. 1420298, International Publication No. 2004/055803, International Publication No. 2004/057590, International Publication No. 2005/029559 (corresponding to United States Patent Publication No. 2006/0231206), International Publication No. 2004/086468 (corresponding to United States Patent Publication No. 2005/0280791), and Japanese Patent Application Laid-open No. 2004-289126 (corresponding to U.S. Pat. No. 6,952,253). The disclosures of, for example, United States patent documents described above are incorporated herein by reference within a range of permission of the domestic laws and ordinances of the designated or selected state, in relation to the liquid immersion mechanism of the liquid immersion exposure apparatus and the attached equipment thereof.

The exposure apparatus EX forms the liquid immersion area LR of the liquid LQ on the substrate P held by the substrate stage 80. The first and second exposure light beams EL1, EL2 are irradiated onto the first and second exposure areas AR1, AR2 on the substrate P respectively through the liquid LQ of the liquid immersion area LR to expose the substrate P therewith.

The exposure apparatus EX irradiates the first and second exposure light beams EL1, EL2 onto the first and second exposure areas AR1, AR2 respectively while moving the shot area S on the substrate P in the Y axis direction with respect to the first and second exposure areas AR1, AR2 in the state in which the liquid immersion area LR is formed. Accordingly, the shot area S on the substrate P is subjected to the multiple exposure (double exposure) with the image of the first pattern PA1 formed with the first exposure light beam EL1 irradiated onto the first exposure area AR1 through the liquid LQ and the image of the second pattern PA2 formed with the second exposure light beam EL2 irradiated onto the second exposure area AR2 through the liquid LQ.

Figure 28:
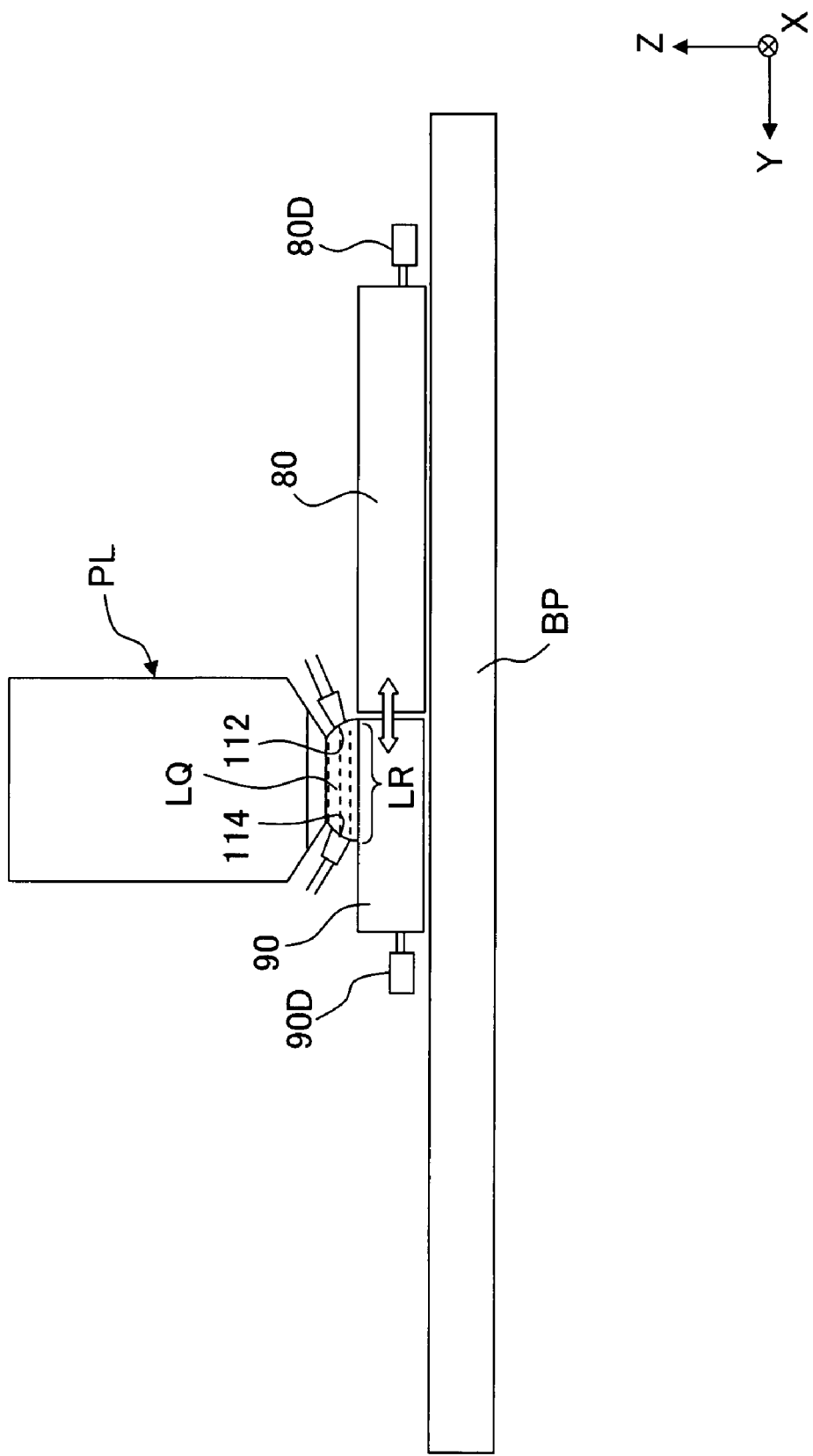
FIG. 28 schematically illustrates an exemplary operation of the exposure apparatus according to the seventh embodiment.

FIG. 28 schematically illustrates an example of the operations of the substrate stage 80 and the measuring stage 90. As shown in FIG. 28, the substrate stage 80 and the measuring stage 90 are movable on the image plane side of the projection optical system PL. The liquid immersion area LR, which is formed by the liquid immersion system 100, can be moved by the controller 30 between the upper surface of the substrate stage 80 and the upper surface of the measuring stage 90 by moving the substrate stage 80 and the measuring stage 90 in the X axis direction and/or the Y axis direction together in a state in which the upper surface of the substrate stage 80 and the upper surface of the measuring stage 90 are allowed to make approach to one another or make contact with each other in a predetermined area including the position disposed just under the projection optical system PL. For example, when the measuring operation based on the use of the liquid LQ is performed by the measuring device (measuring member) of the measuring stage 90, the liquid immersion area LR is moved to the position disposed on the measuring stage 90. When the substrate P is subjected to the liquid immersion exposure, the liquid immersion area LR is moved to the position disposed on the substrate stage 80.

In this embodiment, water (pure water) is used as the liquid LQ. However, it is also allowable to use those other than water as the liquid LQ. For example, when the exposure light beam EL is the $F_2$ laser beam, the $F_2$ laser beam is not transmitted through water. Therefore, the liquid LQ may be, for example, a fluorine-based fluid such as fluorine-based oil and perfluoropolyether (PFPE). Alternatively, other than the above, it is also possible to use, as the liquid LQ, those (for example, cedar oil) which have the transmittance with respect to the exposure light beam EL, which have the refractive index as high as possible, and which are stable against the photoresist coated on the surface of the substrate P and the projection optical system PL.

The liquid LQ, which has the refractive index (for example, not less than 1.5) higher than that of pure water, includes, for example, predetermined liquids having the C—H bond or the O—H bond such as isopropanol having a refractive index of about 1.50 and glycerol (glycerin) having a refractive index of about 1.61, predetermined liquids (organic solvents) such as hexane, heptane, and decane, and decalin (decahydronaphthalene) having a refractive index of about 1.60. As for the liquid LQ, it is also allowable to use those obtained by mixing arbitrary two or more liquids of the foregoing liquids and those obtained by adding (mixing) at least one of the foregoing liquid or liquids to (with) pure water. Further, as for the liquid LQ, it is also allowable to use those obtained by adding (mixing) base or acid such as $H^+$, $Cs^+$, $K^+$, $Cl^-$, $SO_4^{2-}$, and $PO_4^{2-}$ to (with) pure water, and it is also allowable to use those obtained by adding (mixing) fine particles of Al oxide or the like to (with) pure water. As for the liquid LQ, it is preferable to use those which have the small coefficients of light absorption, which have the small temperature dependency, and which are stable against the photosensitive material (or, for example, the top coat film or the antireflection film) applied to the surface of the substrate P and/or the projection optical system PL. As for the liquid LQ, it is also allowable to use liquids having refractive indexes higher than that of water with respect to the exposure light beam EL, for example, those having refractive indexes of about 1.6 to 1.8. As for the liquid LQ, it is also possible to use supercritical fluids.

The terminal end optical element FL of the projection optical system PL may be formed of silica glass (silica), or single crystal materials of fluorine compounds such as calcium fluoride (calcium fluorite), barium fluoride, strontium fluoride, lithium fluoride, and sodium fluoride. Alternatively, the terminal end optical element FL may be formed of any material having a refractive index (for example, not less than 1.6) higher than those of silica glass and calcium fluoride. Those usable as the material having the refractive index of not less than 1.6 include, for example, sapphire and germanium dioxide as disclosed, for example, in International Publication No. 2005/059617, and potassium chloride (refractive index: about 1.75) as disclosed in International Publication No. 2005/059618.

In the projection optical system PL, the refractive index $n_1$ of the terminal end optical element FL with respect to the exposure light beam EL may be smaller than the refractive index $n_2$ of the liquid LQ with respect to the exposure light beam (EL1, EL2). For example, the terminal end optical element FL is formed of silica glass (refractive index: about 1.5). The liquid LQ to be used has the refractive index $n_2$ which is higher (for example, about 1.6 to 1.8) than that of silica glass. Alternatively, in the projection optical system PL, the refractive index $n_1$ of the terminal end optical element FL may be larger than the refractive index $n_2$ of the liquid LQ. For example, the terminal end optical element FL is formed of a material having a refractive index of not less than 1.6. The liquid LQ to be used has the refractive index $n_2$ which is higher than that of pure water and which is smaller than that of the terminal end optical element FL. In this case, it is preferable that the refractive index $n_2$ of the liquid LQ, which is smaller than the refractive index $n_1$ of the terminal end optical element FL, is larger than the numerical aperture NA of the projection optical system.

In relation to the projection optical system of this embodiment, the optical path, which is disposed on the side of the object plane of the terminal end optical element, may be also filled with the liquid, in addition to the optical path which is disposed on the side of the image plane of the terminal end optical element, as disclosed, for example, in International Publication No. 2004/019128 (corresponding to United States Patent Publication No. 2005/0248856). It is also allowable that a thin film, which has the liquid-attractive property and/or the dissolution-preventive function, may be formed on a part (including at least the contact surface with the liquid LQ) or all of the surface of the terminal end optical element. Silica glass has the high affinity for the liquid LQ, for which any dissolution-preventive film is unnecessary as well. However, it is preferable to form at least any dissolution-preventive film for calcium fluoride.

In this embodiment, the first exposure area AR1 and the second exposure area AR2 are covered with one liquid immersion area LR. However, the first exposure area AR1 and the second exposure area AR2 may be covered with distinct liquid immersion areas. In this case, the liquid of the first liquid immersion area to cover the first exposure area AR1 may be the same as or different from the liquid of the second liquid immersion area to cover the second exposure area AR2 in relation to the type (physical property) thereof. For example, the first and second liquid immersion areas may be formed with liquids of different types (at least refractive indexes with respect to the exposure light beam EL) respectively. For example, one of the first and second liquid immersion areas may be formed with water (pure water), and the other may be formed with any liquid having a refractive index with respect to the exposure light beam higher than that of water (refractive index: about 1.44). At least one of the viscosity of the liquid LQ, the transmittance for the exposure light beam, and the temperature may mutually differ between the first liquid immersion area and the second liquid immersion area.

In the first to seventh embodiments described above, the second reference mark FP is detected by using the second detecting system 20 (20') to obtain the positional relationship between the detection reference position of the second detecting system 20 (20') and the projection position of the first pattern PA1. However, the positional relationship between the detection reference position of the second detecting system 20 (20') and the projection position of the second pattern PA2 may be obtained, and the positional relationship among the first pattern PA1, the second pattern PA2, and the substrate P may be adjusted based on the positional relationship to perform the multiple exposure for the respective shot areas on the substrate P.

In the first to seventh embodiments described above, both of the position information about the image of the first pattern PA1 and the position information about the image of the second pattern PA2 are obtained. However, it is also enough to obtain the position information about only any one of them (for example, the first pattern PA1). The positions of the first exposure area AR1 and the second exposure area AR2 are known in the XY coordinate system defined by the measuring system 70. Therefore, when the information about the projection position of the image of one of the patterns is obtained, and the positional relationship between the first pattern PA1 and the second pattern PA2 is adjusted based on the information, then the image of the first pattern and the image of the second pattern can be formed at the desired positions in the shot area S on the substrate P. For example, the projection position of the image of the first pattern PA1 in the XY coordinate system defined by the measuring system 70 is obtained from the positional relationship between the first alignment mark RM1 and the first reference mark FM in the same manner as in the first embodiment described above. Subsequently, the positional relationship (distance) between the first exposure area AR1 and the second exposure area AR2 is known. Therefore, the positional relationship on the mask stage 60 between the first illumination area IA1 and the second illumination area IA2 conjugate with the exposure areas AR1, AR2 is obtained from the projection magnification of the projection optical system PL and the positional relationship between the first exposure area AR1 and the second exposure area AR2 described above. The position of the second pattern PA2 can be determined with respect to the first pattern PA1 on the mask stage 60 based on the obtained positional relationship between the first illumination area IA1 and the second illumination area IA2. In this way, the mask stage 60, on which the second pattern PA2 is positioned with respect to the first pattern PA1, is moved in synchronization with the substrate stage 80. Accordingly, the image of the first pattern PA1 and the image of the second pattern PA2 can be formed at the desired positions in the shot area S on the substrate P.

In the first to seventh embodiments described above, the alignment mark RM1 and the alignment mark RM2, each of which has the pair of marks separated from each other in the X axis direction, are used. However, each of the alignment mark RM1 and the alignment mark RM2 may include a plurality of marks separated from each other in the Y axis direction. In this case, the mask stage 61 is moved in the Y axis direction to perform the measurement of the position information about the image of the first pattern PA1 and the measurement of the position information about the image of the second pattern PA2 a plurality of times respectively.

In the first to seventh embodiments described above, the magnification error of at least one of the image formed in the first exposure area AR1 and the image formed in the second exposure area AR2 by the projection optical system PL (PL') can be also detected based on the positional relationship between the first reference mark FM (FMa, FMb) and the alignment mark RM1 (RM1a, RM1b) and the positional relationship between the first reference mark FM (FMa, FMb) and the alignment mark RM2 (RM2a, RM2b). When the magnification error is detected, the projection magnification of at least one of the image formed in the first exposure area AR1 and the image formed in the second exposure area AR2 can be adjusted by using at least one of the first and second imaging characteristic-adjusting devices LC1, LC2 (imaging optical systems 120A, 120B).

In the first to seventh embodiments described above, in order to obtain at least one of the position information about the image of the first pattern PA1 and the position information about the image of the second pattern PA2, the alignment mark RM1 provided for the first mask M1 and the alignment mark RM2 provided for the second mask M2 are used. However, as disclosed, for example, in Japanese Patent Application Laid-open Nos. 8-78313 and 8-78314 (each corresponding to U.S. Pat. No. 6,018,384), Japanese Patent Application Laid-open No. 8-227847 (corresponding to U.S. Pat. No. 6,169,602), and Japanese Patent Application Laid-open No. 11-195584, the reference mark may be provided for the mask stage 61, and the reference mark provided for the mask stage 61 may be used to obtain at least one of the position information about the image of the first pattern PA1 and the position information about the image of the second pattern PA2. In this case, the positional relationship between the first pattern PA1 and the second pattern PA2 can be adjusted to be in the desired state by adjusting at least one of the positions of the first pattern PA1 and the second pattern 2 with respect to the reference mark provided for the mask stage 61 based on the position information about the image of the first pattern PA1 and the position information about the image of the second pattern PA2.

When the optical characteristic of the projection optical system PL (PL') is changed by the irradiation of the exposure light beams EL1, EL2, and the position, at which at least one of the image of the first pattern PA1 and the image of the second pattern PA2 is to be formed, is changed, then at least one of the positions of the first pattern PA1 and the second pattern PA2 may be adjusted and/or at least one of the first and second imaging characteristic-adjusting devices LC1, LC2 (imaging optical systems 120A, 120B) may be adjusted so that the image of the first pattern PA1 and the image of the second pattern PA2 are formed at the desired positions in the shot area on the substrate P.

In the first to seventh embodiments described above, the first reference mark FM detected by the first detecting system 10 and the second reference mark FP detected by the second detecting system 20 are the distinct marks. However, an identical reference mark may be detected by the first detecting system 10 and the second detecting system 20. That is, the first detecting system 10 and the second detecting system 20 may commonly use the identical mark.

In the respective embodiments described above, the first mask M1 and the second mask M2 are synchronously moved with respect to the substrate P by means of the main stage 61 carried on the mask stage 60. However, there is no limitation thereto. The first mask M1 and the second mask M2 can be synchronously moved with respect to the substrate P independently respectively as well. In this case, it is possible to provide a first mask stage and a second mask stage which are driven independently while carrying the first mask M1 and the second mask M2 respectively thereon. For example, the main stage 61 may be omitted. The first substage 62 and the second substage 63 may be synchronously moved with respect to the substrate P independently or in cooperation. When the first mask stage and the second mask stage, which are driven independently, are provided as described above, it is necessary that the first and second mask stages should be synchronously moved with respect to the substrate stage respectively. That is, it is appropriate to adjust the positional relationship between the first mask M1 placed on the first mask stage and the shot area of the substrate P and the positional relationship between the second mask M2 placed on the second mask stage and the shot area of the substrate P respectively. Accordingly, the shot area of the substrate P can be subjected to the multiple exposure (double exposure) in such a state that the image of the first pattern PA1 of the first mask M1 formed in the first exposure area AR1 and the image of the second pattern PA2 of the second mask M2 formed in the second exposure area AR2 are correctly overlaid with each other in the predetermined position in the shot area.

In the respective embodiments described above, when the shot area S on the substrate P is subjected to the exposure, the first mask M1 and the second mask M2 are moved in the identical scanning direction. However, the first mask M1 and the second mask M2 may be moved in the different scanning directions respectively. For example, when the first mask M1 is moved in the +Y direction, the second mask M2 may be moved in the −Y direction. When the first mask M1 is moved in the −Y direction, the second mask M2 may be moved in the +Y direction. Alternatively, the first mask M1 may be moved in the XY plane, and the second mask M2 may be moved in the YZ plane (or in the XZ plane).

In the respective embodiments described above, the first pattern PA1 is formed on the first mask M1, and the second pattern PA2 is formed on the second mask M2 which is distinct from the first mask M1. However, the first pattern PA1 and the second pattern PA2 may be formed on a single mask. The substrate P can be subjected to the multiple exposure with the image of the first pattern PA1 and the image of the second pattern PA2 provided on the single mask. In this case, the positional relationship between the image of the first pattern PA1 and the image of the second pattern PA2 may be adjusted by using the first and second imaging characteristic-adjusting devices LC1, LC2 (imaging optical systems 120A, 120B).

In the respective embodiments described above, the projection optical system PL (PL') is not limited to those based on the reduction system. It is also allowable to use any one of those based on, for example, the 1× magnification system and the magnifying system. In the respective embodiments described above, the explanation has been made as exemplified by the case in which the projection optical system PL (PL') is based on the catadioptric system including catoptric optical elements and dioptric optical elements by way of example. However, the projection optical system PL (PL') may be based on, for example, the dioptric system including no catoptric optical element or the catoptric system including no dioptric optical element. Further, the projection optical system PL (PL') is not limited to the two-headed type catadioptric system. It is also allowable to use the so-called inline type catadioptric system in which a plurality of reflecting surfaces are provided, an optical system (catoptric or dioptric system) for forming an intermediate image at least once is provided at a part thereof, and a single optical axis is provided, as disclosed, for example, in International Publication No. 2004/107011 (corresponding to United States Patent Publication No. 2006/0121364). The projected image, which is generated by the projection optical system PL (PL'), may be either the inverted image or the erecting image.

In the respective embodiments described above, the image of the first pattern PA1 of the first mask M1 and the image of the second pattern PA2 of the second mask M2 are projected onto the substrate P by using the single projection optical system PL (PL'). However, a plurality of (two) projection optical systems may be provided to project the image of the first pattern PA1 of the first mask M1 and the image of the second pattern PA2 of the second mask M2 onto the substrate P without using the common optical element. The present invention is also applicable to so-called multi-lens manner scanning type exposure apparatus in which a plurality of projection optical systems are arranged so that the adjoining projection areas are displaced by a predetermined amount in the scanning direction, and the ends of the adjoining projection areas are overlapped with each other in the direction perpendicular to the scanning direction.

In the first to fifth and seventh embodiments described above, the first exposure area AR1 and the second exposure area AR2 can be simultaneously arranged in one shot area S. However, it is not necessarily indispensable that the first exposure area AR1 and the second exposure area AR2 can be arranged simultaneously in one shot area S. It is possible to arbitrarily set the first exposure area AR1 and the second exposure area AR2.

In the respective embodiments described above, the first exposure area AR1 and the second exposure area AR2 may be different from each other in at least one of the size and the shape. For example, the width in the X axis direction and/or the width in the Y axis direction may differ between the first exposure area AR1 and the second exposure area AR2. When the width in the X axis direction differs, only a part in the shot area S is subjected to the multiple (double) exposure by means of one time of the scanning operation. The shape of each of the first and second exposure areas AR1, AR2 (and/or the first and second illumination areas IA1, IA2) is not limited to the rectangular shape. The shape may be any other shape including, for example, circular arc-shaped, trapezoidal, or parallelogram forms.

In the respective embodiments described above, the exposure light beams EL1, EL2 are continuously irradiated onto the first exposure area AR1 and the second exposure area AR2 respectively during the period in which the shot area S passes across the first exposure area AR1 and the second exposure area AR2. However, the exposure light beam may be irradiated in only a partial period during which the shot area S passes across at least one of the exposure areas. That is, only a part of the shot area S may be subjected to the multiple (double) exposure.

In the respective embodiments described above, each of the first and second detecting systems 10, 20 is based on the image processing system. However, there is no limitation thereto. It is also allowable to adopt any other system, for example, a system in which the diffracted light beam generated from the mark is detected by irradiating a coherent beam.

In the respective embodiments described above, the respective shot areas S of the substrate P are subjected to the double exposure with the image of the first pattern PA1 of the first mask M1 and the image of the second pattern PA2 of the second mask M2 respectively. However, it is also possible to perform the triple or more multiple exposure in accordance with the principle of the present invention. When the triple exposure is performed, a third mask (M3) having a third pattern (PA3) is used in addition to the first mask M1 and the second mask M2. The third mask (M3) is moved in synchronization with the movement of the substrate P in the same manner as the first mask M1 and the second mask M2. The respective shot areas S of the substrate P can be subjected to the triple exposure with the images of the first to third patterns. In this case, a third exposure area AR3, on which the image is formed by irradiating the illumination light beam onto the third pattern, can be set so that the third exposure area AR3 is distinct from the first exposure area AR1 and the second exposure area AR2 or a part of the third exposure area AR3 is overlapped with at least one of the first exposure area AR1 and the second exposure area AR2. In this case, three projection optical systems may be provided independently corresponding to the respective exposure areas. Alternatively, the projection optical system PL as shown in FIG. 3 may be further provided with an optical system corresponding to the third mask similarly to the first and second optical systems 41, 42 corresponding to the first mask M1 and the second mask M2, and the projection optical system PL may be provided with a catoptric and/or dioptric system for guiding the light beam from the optical system to the third optical system. An optical system, which comprises a reflecting plate and a beam splitter for guiding the exposure light beam allowed to pass through the third mask to the optical system 120C, may be further provided by improving the optical system shown in FIG. 23. The third mask (M3) may be carried on the mask stage 60 on which the first mask M1 and the second mask M2 are carried, or the third mask (M3) may be carried on any distinct mask stage.

In the respective embodiments described above, the interferometer system is used to measure the position information about the mask stage and the substrate stage. However, there is no limitation thereto. For example, it is also allowable to use an encoder system for detecting the scale (diffraction grating) provided on the upper surface of the substrate stage. In this case, it is preferable that a hybrid system comprising both of the interferometer system and the encoder system is provided, and the measurement result of the encoder system is calibrated (subjected to the calibration) by using the measurement result of the interferometer system. The position control of the substrate stage may be performed by switching and using the interferometer system and the encoder system or using both of them.

In the respective embodiments described above, an ArF excimer laser may be used as a light source device for generating an ArF excimer laser beam as the exposure light beam. However, it is also allowable to use a high harmonic wave-generating device which includes, for example, a solid laser light source such as a DFB semiconductor laser or a fiber laser, a light-amplifying section having a fiber amplifier or the like, and a wavelength-converting section and which outputs a pulse light beam having a wavelength of 193 nm as disclosed, for example, in International Publication No. 1999/46835 (corresponding to U.S. Pat. No. 7,023,610).

The substrate P, which is usable in the respective embodiments described above, is not limited to only the semiconductor wafer for producing the semiconductor device. Those applicable include, for example, the glass substrate for the display device, the ceramic wafer for the thin film magnetic head, the master plate (synthetic silica glass, silicon wafer) for the mask or the reticle to be used for the exposure apparatus, or the film member. The shape of the substrate P is not limited to only the circular shape. It is also allowable to use other shapes such as rectangular shapes.

The present invention is also applicable to the exposure apparatus of the multistage type (twine-stage type) provided with a plurality of substrate stages as disclosed, for example, in Japanese Patent Application Laid-open Nos. 10-163099 and 10-214783 (corresponding to U.S. Pat. Nos. 6,341,007, 6,400,441, 6,549,269, and 6,590,634) and Japanese Patent Application Laid-open No. 2000-505958 (PCT) (corresponding to U.S. Pat. No. 5,969,441). The disclosures of United States patents described above are incorporated herein by reference within a range of permission of the domestic laws and ordinances of the designated or selected state, in relation to the exposure apparatus of the multistage type. Further, the present invention is also applicable to the exposure apparatus which is not provided with the measuring stage and which is provided with only one or a plurality of substrate stages.

In the multistage type exposure apparatus to which the present invention is applied, the detection of the alignment mark on the substrate held by the second substrate stage and the detection of the reference mark FP provided on the second substrate stage are performed by using the detecting system which amounts to the second detecting system 20 (20') described above in the measuring station during the period in which the multiple exposure is executed with the first pattern PA1 and the second pattern PA2 for the substrate held by the first substrate stage in the exposure station. The second substrate stage is moved from the measuring station to the exposure station before starting the exposure for the substrate held by the second substrate stage after the completion of the exposure for the substrate held by the first substrate stage. The multiple exposure is performed for the respective shot areas on the substrate held by the second substrate stage while adjusting the positional relationship among the first pattern PA1, the second pattern PA2, and the substrate held by the second substrate stage based on the alignment information measured in the measuring station while adjusting the positional relationship between the first pattern PA1 and the second pattern PA2 by detecting the position information about the image of the first pattern PA1 and the position information about the image of the second pattern PA2 by using the detecting system which amounts to the first detecting system 10 (10') described above.

The seventh embodiment adopts the exposure apparatus in which the space between the projection optical system and the substrate P is locally filled with the liquid. However, the present invention is also applicable to the liquid immersion exposure apparatus which performs the exposure in a state in which the entire surface of the substrate as the exposure objective is immersed in the liquid as disclosed, for example, in Japanese Patent Application Laid-open Nos. 6-124873 and 10-303114 and U.S. Pat. No. 5,825,043.

In the respective embodiments described above, the first and second masks M1, M2 are used in order to form the first and second patterns. However, in place thereof, it is possible to use an electronic mask (also referred to as "variably shaped mask", "active mask", or "pattern generator") which generates a variable pattern. As for the electronic mask as described above, it is possible to use, for example, DMD (Deformable Micro-mirror Device or Digital Micro-mirror Device) which is one type of the no light-emitting image display device (also referred to as "spatial light modulator" (SLM)). DMD has a plurality of reflecting elements (micromirrors) which are driven based on predetermined electronic data. The plurality of reflecting elements are arranged in a two-dimensional matrix form on the surface of DMD, and they are driven in the element unit to reflect and deflect the exposure light beam. The respective reflecting elements have the reflecting surfaces for which the angles are adjusted. The operation of DMD may be controlled by the controller 30. The controller 30 drives the respective reflecting elements of DMD based on the electronic data (pattern information) corresponding to the first pattern and the second pattern to be formed on the substrate P. The exposure light beam, which is irradiated from the illumination system IL, is patterned by the reflecting elements. When DMD is used, it is possible to perform the multiple exposure more efficiently, because it is unnecessary to perform the operation for exchanging the mask and the positional adjustment operation for the mask on the mask stage when the pattern is changed, as compared with the case in which the exposure is performed with the mask (reticle) on which the pattern is formed. It is also allowable for the exposure apparatus based on the use of the electronic mask that the substrate is merely moved in the X axis direction and the Y axis direction by means of the substrate stage without providing the mask stage. In order to adjust the relative positions of the images of the first and second patterns on the substrate, for example, an actuator is used to adjust the relative positions of the two electronic masks for generating the first and second patterns respectively. However, in at least one of the two electronic masks, the timing for generating the pattern may be adjusted, or the pattern formation position on the electronic mask may be deviated. The exposure apparatus based on the use of DMD is disclosed, for example, in Japanese Patent Application Laid-open Nos. 8-313842 and 2004-304135 and U.S. Pat. No. 6,778,257. The disclosure of U.S. Pa. No. 6,778, 257 is incorporated herein by reference within a range of permission of the domestic laws and ordinances of the designated or selected state.

The type of the exposure apparatus EX is not limited to the exposure apparatus for producing the semiconductor element for exposing the substrate P with the semiconductor element pattern. The present invention is also widely applicable, for example, to the exposure apparatus for producing the liquid crystal display device or producing the display as well as to the exposure apparatus for producing, for example, the thin film magnetic head, the micromachine, MEMS, the DNA chip, the image pickup element (CCD), the reticle, or the mask.

The disclosures of various United States Patents and various United States Patent Publications referred to in this specification, which are not included in those having been specifically incorporated herein explicitly, are also incorporated herein by reference within a range of permission of the domestic laws and ordinances of the designated or selected state.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 29:
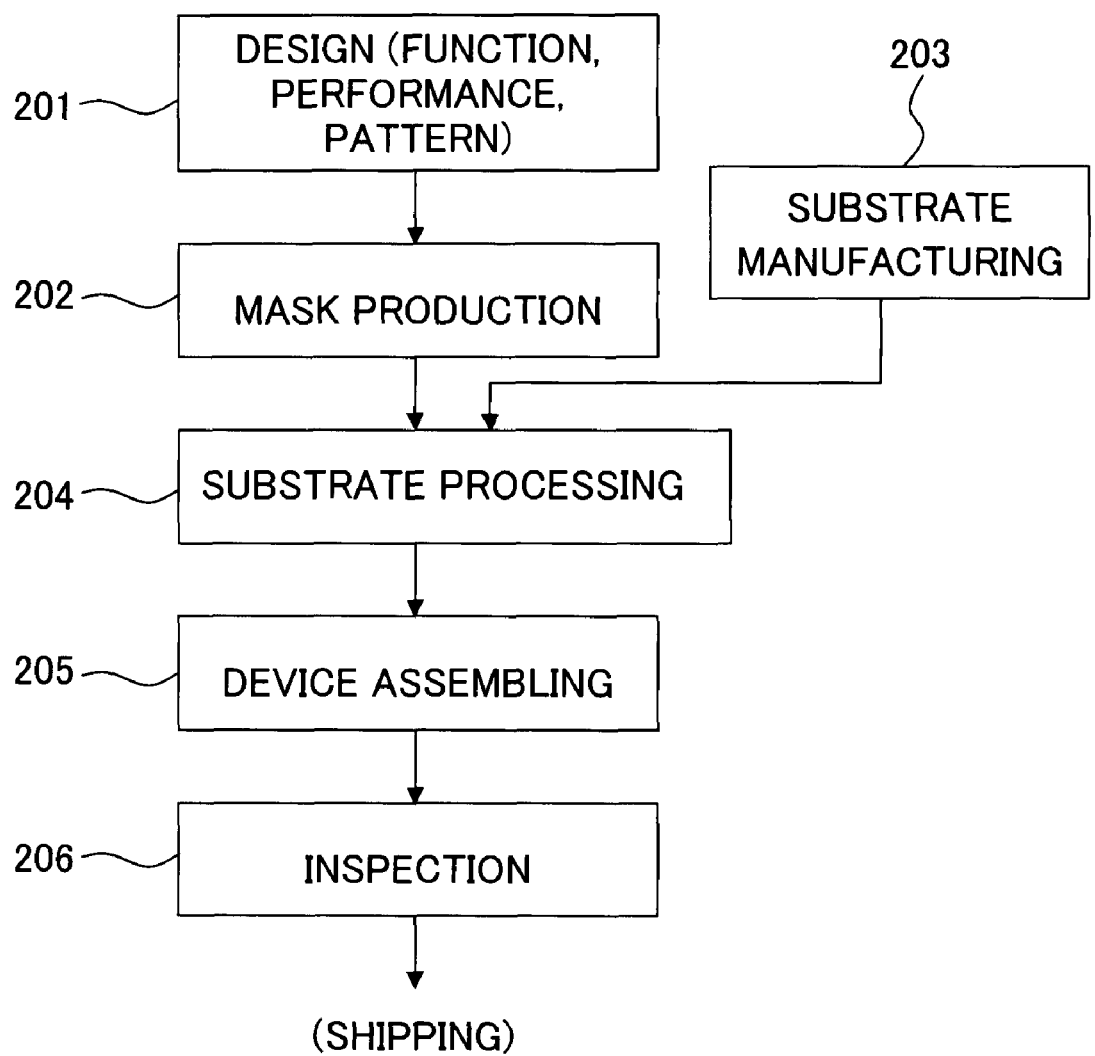
FIG. 29 shows a flow chart illustrating exemplary steps for producing a microdevice.

As shown in FIG. 29, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, a substrate-processing step 204 including an exposure step of performing the multiple exposure for the substrate with a pattern of the mask by using the exposure apparatus EX of the embodiment described above and a development step of developing the exposed substrate, a step 205 of assembling the device (including processing processes such as a dicing step, a bonding step, and a packaging step), and an inspection step 206.

According to the present invention, the multiple exposure for the substrate can be performed correctly and highly efficiently. Therefore, it is possible to produce, at the high throughput, the device having the high density complicated circuit pattern. Therefore, the present invention will contribute to the development of the high technology industry and the IT industry including the semiconductor industry in our country.

What is claimed is:

1. An exposure apparatus which exposes a substrate, comprising:

an optical system which includes a plurality of optical elements, which forms an image of a first pattern in a first exposure area and which forms an image of a second pattern in a second exposure area, the second pattern being different from the first pattern;

a first detecting system which obtains at least one of position information about the image of the first pattern to be formed in the first exposure area and position information about the image of the second pattern to be formed in the second exposure area; and a reference which is arranged on a light-exit side of an optical element of the plurality of optical elements, the optical element being arranged closest to the first exposure area or the second exposure area;

wherein a predetermined area on the substrate is subjected to multiple exposure with the image of the first pattern formed in the first exposure area and the image of the second pattern formed in the second exposure area;

the first detecting system detects at least one of a first positional relationship between the first pattern and the reference and a second positional relationship between the second pattern and the reference, via at least a part of the optical system; and at least one of the position information about the image of the first pattern to be formed in the first exposure area and the position information about the image of the second pattern to be formed in the second exposure area is obtained based on a detection result of the first detecting system and thereby a positional relationship between the first pattern and the second pattern is adjusted.

2. The exposure apparatus according to claim 1, further comprising an adjusting device which adjusts at least one of a positional relationship between the image of the first pattern and the predetermined area on the substrate and a positional relationship between the image of the second pattern and the predetermined area on the substrate based on a detection result of the first detecting system.

3. The exposure apparatus according to claim 1, wherein the first detecting system detects at least one of the first positional relationship and the second positional relationship by detecting at least one of a positional relationship between the reference and a first mark which is formed in a predetermined positional relationship with respect to the first pattern and a positional relationship between the reference and a second mark which is formed in a predetermined positional relationship with respect to the second pattern, via at least a part of the optical system.

4. The exposure apparatus according to claim 1, wherein:
the first exposure area and the second exposure area are defined at different positions; and
the reference is arranged in the first exposure area to detect the first positional relationship by using the first detecting system, and then the reference is arranged in the second exposure area to detect the second positional relationship by using the first detecting system.

5. The exposure apparatus according to claim 4, wherein the first exposure area and the second exposure area are away from each other.

6. The exposure apparatus according to claim 1, wherein:
at least a part of the first exposure area and a part of the second exposure area are overlapped with each other at an overlap area; and
the reference is arranged in the overlap area to perform at least one of the detection of the first positional relationship and the detection of the second positional relationship by means of the first detecting system.

7. The exposure apparatus according to claim 1, wherein the detection of the first positional relationship and the detection of the second positional relationship are performed substantially simultaneously or unsimultaneously.

8. The exposure apparatus according to claim 1, wherein the first detecting system includes a first sub-detecting system which detects the first positional relationship, and a second sub-detecting system which detects the second positional relationship.

9. The exposure apparatus according to claim 1, further comprising:
a second detecting system which detects the reference or a reference mark provided in a predetermined positional relationship with respect to the reference, and an alignment mark provided on the substrate, wherein a positional relationship among the image of the first pattern, the image of the second pattern, and the predetermined area on the substrate is adjusted based on the detection result of the first detecting system and a detection result of the second detecting system.

10. The exposure apparatus according to claim 1, further comprising:
a first reference and a second reference which are arranged on the light-exit side of the optical system and which are formed in a predetermined positional relationship, wherein the first detecting system obtains the position information about the image of the first pattern to be formed in the first exposure area and the position information about the image of the second pattern to be formed in the second exposure area by detecting the first positional relationship between the first pattern and the first reference and the second positional relationship between the second pattern and the second reference via at least a part of the optical system.

11. The exposure apparatus according to claim 10, wherein at least a part of the first exposure area and a part of the second exposure area are overlapped with each other at an overlap area, and the first reference and the second reference are arranged in the overlap area to perform the detection of the first positional relationship and the detection of the second positional relationship by the first detecting system.

12. The exposure apparatus according to claim 10, wherein the first detecting system includes a first sub-detecting system which detects the first positional relationship, and a second sub-detecting system which detects the second positional relationship.

13. The exposure apparatus according to claim 10, further comprising:
a second detecting system which detects an alignment mark provided on the substrate and at least one of the first and second references or a reference mark provided in a predetermined positional relationship with respect to at least one of the first and second references,
wherein a positional relationship among the image of the first pattern, the image of the second pattern, and the predetermined area on the substrate is adjusted based on a detection result of the first detecting system and a detection result of the second detecting system.

14. The exposure apparatus according to claim 10, wherein the first detecting system detects the first positional relationship and the second positional relationship by detecting a positional relationship between the first reference and a first mark which is formed in a predetermined positional relationship with respect to the first pattern and a positional relationship between the second reference and a second mark which is formed in a predetermined positional relationship with respect to the second pattern, via at least a part of the optical system.

15. The exposure apparatus according to claim 14, wherein the first exposure area and the second exposure area are away from each other.

16. The exposure apparatus according to claim 10, wherein the first exposure area and the second exposure area are defined at different positions, and
the first reference is arranged in the first exposure area, the second reference is arranged in the second exposure area, so as to perform the detection of the first positional relationship and the detection of the second positional relationship by the first detecting system.

17. The exposure apparatus according to claim 16, wherein the detection of the first positional relationship and the detection of the second positional relationship are performed substantially simultaneously or unsimultaneously.

18. The exposure apparatus according to claim 1, wherein the first detecting system has a light-receiving system which receives a detection light beam on the light-exit side of the optical system.

19. The exposure apparatus according to claim 1, wherein the optical system includes one optical element which is arranged opposite to a surface of the substrate, and a first exposure light beam and a second exposure light beam are irradiated onto the first exposure area and the second exposure area respectively via the one optical element.

20. The exposure apparatus according to claim 19, wherein the optical system includes:
- a first reflecting surface which is arranged in the vicinity of position optically conjugate with the first exposure area and the second exposure area and which guides the first exposure light beam to the optical element;
- a second reflecting surface which is arranged in the vicinity of position optically conjugate with the first exposure area and the second exposure area and which guides the second exposure light beam to the optical element;
- a first optical system which guides the first exposure light beam from the first pattern to the first reflecting surface;
- a second optical system which guides the second exposure light beam from the second pattern to the second reflecting surface; and
- a third optical system which includes the optical element and which guides the first exposure light beam from the first reflecting surface and the second exposure light beam from the second reflecting surface to the first exposure area and the second exposure area respectively.

21. The exposure apparatus according to claim 1, wherein the predetermined area on the substrate is subjected to the multiple exposure with the image of the first pattern and the image of the second pattern by irradiating a first exposure light beam and a second exposure light beam onto the first exposure area and the second exposure area respectively by the optical system while relatively moving the first exposure area, the second exposure area, and the predetermined area on the substrate.

22. The exposure apparatus according to claim 21, further comprising:
- a mask stage which is capable of moving a first mask having the first pattern in a predetermined scanning direction with respect to the first exposure light beam and which is capable of moving a second mask having the second pattern in a predetermined scanning direction with respect to the second exposure light beam; and
- a substrate stage which is capable of moving a predetermined area on the substrate in a predetermined scanning direction with respect to the first exposure area and the second exposure area,
- wherein the predetermined area on the substrate is subjected to multiple exposure with an image of the first pattern and an image of the second pattern while moving the predetermined area on the substrate in the scanning direction by using the substrate stage in synchronization with movement of each of the first mask and the second mask in the scanning direction by the mask stage.

23. The exposure apparatus according to claim 22, wherein the mask stage integrally moves the first and second masks.

24. The exposure apparatus according to claim 23, wherein the mask stage includes a main stage which is movable while holding the first mask and the second mask in substantially identical scanning directions.

25. The exposure apparatus according to claim 24, wherein the mask stage includes a first substage which is capable of moving the first mask with respect to the main stage, and a second substage which is capable of moving the second mask with respect to the main stage.

26. The exposure apparatus according to claim 25, wherein a positional relationship between the first pattern of the first mask and the second pattern of the second mask is adjusted by moving at least one of the first substage and the second substage with respect to the main stage.

27. The exposure apparatus according to claim 25, further comprising a measuring system which measures position informations about the first substage and the second substage respectively.

28. The exposure apparatus according to claim 21, wherein the first exposure area, the second exposure area, and the predetermined area on the substrate are relatively moved in predetermined scanning directions respectively; and
- one of the irradiation of the first exposure light beam onto the first exposure area and the irradiation of the second exposure light beam onto the second exposure area is started and then the other of the irradiations is started during the multiple exposure for the predetermined area on the substrate.

29. The exposure apparatus according to claim 1, further comprising an imaging characteristic-adjusting device which adjusts at least one of an imaging characteristic of the image of the first pattern and an imaging characteristic of the image of the second pattern.

30. The exposure apparatus according to claim 1, wherein adjustment of a positional relationship among the image of the first pattern, the image of the second pattern, and the predetermined area on the substrate includes adjustment of at least one of positions of the image of the first pattern and the image of the second pattern.

31. The exposure apparatus according to claim 1, wherein adjustment of at least one of positions of the image of the first pattern and the image of the second pattern includes adjustment of at least one of positions of the first pattern and the second pattern.

32. The exposure apparatus according to claim 1, wherein a liquid immersion area is formed with a liquid on the substrate, and a first exposure light beam and a second exposure light beam are irradiated onto the predetermined area on the substrate through the liquid of the liquid immersion area.

33. A method for producing a device, comprising:
- performing multiple exposure for a substrate by using the exposure apparatus as defined in claim 1;
- developing the substrate for which the multiple exposure has been performed; and
- processing the developed substrate.

34. The exposure apparatus according to claim 1, further comprising:
- a first stage, and
- a second stage,
- wherein the first exposure area and the second exposure area are disposed on the first stage during the exposure of the substrate, and
- the reference is formed on the second stage.

35. The exposure apparatus according to claim 1, wherein the first detecting system is arranged on a light-incident side of the optical system.

36. An exposure method for performing multiple exposure for a substrate with an image of a first pattern and an image of a second pattern different from the first pattern, the exposure method comprising:
- forming the image of the first pattern in a first exposure area;
- forming the image of the second pattern in a second exposure area;
- obtaining at least one of position information about the image of the first pattern to be formed in the first exposure area and position information about the image of the second pattern to be formed in the second exposure area and thereby a positional relationship between the first pattern and the second pattern is adjusted; and performing the multiple exposure for a predetermined area on the substrate with the image of the first pattern and the image of the second pattern based on at least one of the obtained position informations;

wherein the images of the first and second patterns are formed via an optical system which includes a plurality of optical elements, a first positional relationship of the first pattern with respect to a reference arranged on a light-exit side of an optical element of the plurality of optical elements, the optical element being arranged closest to the first exposure area or the second exposure area and a second positional relationship of the second pattern with respect to the reference are detected via at least a part of the optical system, and at least one of the position information about the image of the first pattern and the position information about the image of the second pattern is obtained based on a result of the detection.

37. The exposure method according to claim 36, wherein the predetermined area is subjected to the multiple exposure while moving the substrate to make the predetermined area on the substrate pass across the first exposure area and the second exposure area.

38. The exposure method according to claim 36, further comprising adjusting at least one of a positional relationship between the image of the first pattern and the predetermined area on the substrate and a positional relationship between the image of the second pattern and the predetermined area on the substrate based on at least one of the obtained position informations.

39. The exposure method according to claim 38, wherein at least one of the first positional relationship and the second positional relationship is detected by detecting at least one of a positional relationship between a reference and a first mark which is formed in a predetermined positional relationship with respect to the first pattern and a positional relationship between the reference and a second mark which is formed in a predetermined positional relationship with respect to the second pattern, via at least a part of the optical system.

40. The exposure method according to claim 36, wherein the first exposure area and the second exposure area are defined at different positions, the reference is arranged in the first exposure area to detect the first positional relationship, and then the reference is arranged in the second exposure area to detect the second positional relationship.

41. The exposure method according to claim 36, wherein both of the position information about the image of the first pattern to be formed in the first exposure area and the position information about the image of the second pattern to be formed in the second exposure area are obtained, and a positional relationship between the image of the first pattern and the predetermined area on the substrate and a positional relationship between the image of the second pattern and the predetermined area on the substrate are adjusted based on the obtained position informations.

42. The exposure method according to claim 36, wherein one of the position information about the pattern image formed in the first exposure area and the position information about the pattern image formed in the second exposure area is obtained, and a positional relationship between the image of the first pattern and the predetermined area on the substrate and a positional relationship between the image of the second pattern and the predetermined area on the substrate are adjusted based on the obtained one of the position information and a predetermined positional relationship between the first exposure area and the second exposure area.

43. The exposure method according to claim 36, wherein a liquid immersion area is formed with a liquid on the substrate, and the predetermined area on the substrate is subjected to the multiple exposure with the image of the first pattern and the image of the second pattern through the liquid of the liquid immersion area.

44. A method for producing a device, comprising:
performing multiple exposure for a substrate by using the exposure method as defined in claim 36;
developing the substrate for which the multiple exposure has been performed; and
processing the developed substrate.

45. The exposure method according to claim 36, wherein the predetermined area on the substrate is subjected to the multiple exposure with the image of the first pattern and the image of the second pattern by irradiating a first exposure light beam and a second exposure light beam onto the first exposure area and the second exposure area respectively by the optical system while relatively moving the first exposure area, the second exposure area, and the predetermined area on the substrate in predetermined scanning directions respectively; and
one of the irradiation of the first exposure light beam onto the first exposure area and the irradiation of the second exposure light beam onto the second exposure area is started and then the other of the irradiations is started during the multiple exposure for the predetermined area on the substrate.

46. The exposure method according to claim 36, wherein the first exposure area and the second exposure area are disposed on a first stage during the multiple exposure, and the reference is formed on a second stage.

47. The exposure method according to claim 36, wherein the first positional relationship and the second positional relationship are detected on a light-incident side of the optical system.

* * * * *